(12) United States Patent
Lee et al.

(10) Patent No.: US 11,854,987 B2
(45) Date of Patent: Dec. 26, 2023

(54) SEMICONDUCTOR PACKAGES WITH INTERCONNECTION FEATURES IN A SEAL REGION AND METHODS FOR FORMING THE SAME

(71) Applicant: TAIWAN SEMICONDUCTOR MANUFACTURING COMPANY, LTD., Hsinchu (TW)

(72) Inventors: Ming-Han Lee, Taipei (TW); Shin-Yi Yang, New Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/383,338

(22) Filed: Jul. 22, 2021

(65) Prior Publication Data

US 2022/0293527 A1    Sep. 15, 2022

Related U.S. Application Data

(60) Provisional application No. 63/159,282, filed on Mar. 10, 2021.

(51) Int. Cl.
| | |
|---|---|
| H01L 23/538 | (2006.01) |
| H01L 23/498 | (2006.01) |
| H01L 25/10 | (2006.01) |
| H01L 23/00 | (2006.01) |
| H01L 23/48 | (2006.01) |
| H01L 25/00 | (2006.01) |

(52) U.S. Cl.
CPC ........ *H01L 23/5386* (2013.01); *H01L 23/481* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 24/16* (2013.01); *H01L 25/105* (2013.01); *H01L 25/50* (2013.01); *H01L 2224/16146* (2013.01); *H01L 2224/16225* (2013.01); *H01L 2225/1023* (2013.01); *H01L 2225/1041* (2013.01); *H01L 2225/1058* (2013.01); *H01L 2924/1431* (2013.01); *H01L 2924/1434* (2013.01)

(58) Field of Classification Search
None
See application file for complete search history.

(56) References Cited

U.S. PATENT DOCUMENTS

| | | |
|---|---|---|
| 8,802,504 B1 | 8/2014 | Hou et al. |
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |

(Continued)

*Primary Examiner* — Hung K Vu
(74) *Attorney, Agent, or Firm* — NZ Carr Law Office

(57) ABSTRACT

Embodiments of the present disclosure provide an integrated circuit die with vertical interconnect features to enable direct connection between vertically stacked integrated circuit dies. The vertical interconnect features may be formed in a sealing ring, which allows higher routing density than interposers or redistribution layer. The direct connection between vertically stacked integrated circuit dies reduces interposer layers, redistribution process, and bumping processes in multi-die integration, thus, reducing cost of manufacturing.

20 Claims, 46 Drawing Sheets

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2018/0151530 A1* | 5/2018 | Chen ...................... H01L 24/14 |

* cited by examiner

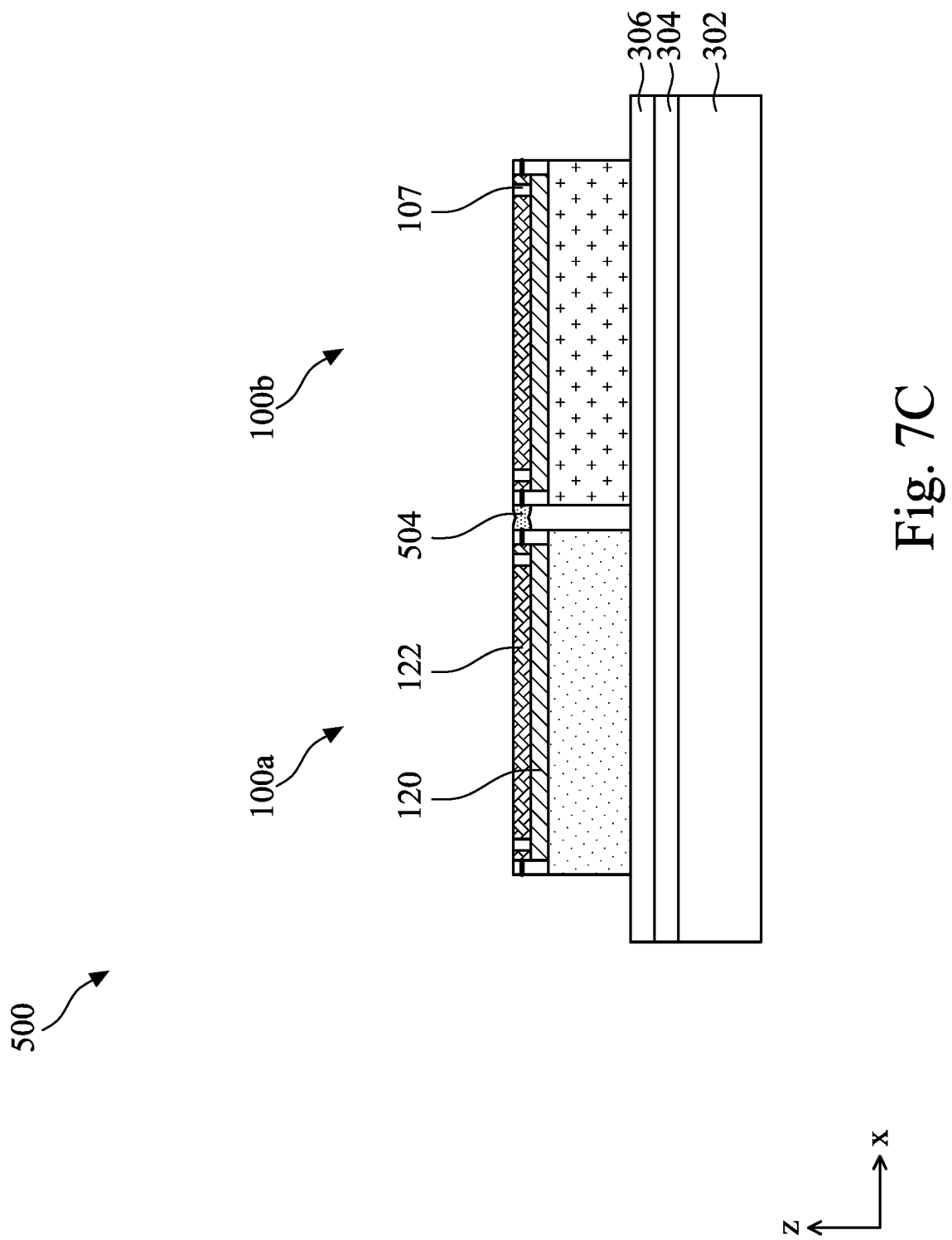

SEMICONDUCTOR PACKAGES WITH INTERCONNECTION FEATURES IN A SEAL REGION AND METHODS FOR FORMING THE SAME

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7E schematically demonstrate various stages of forming a semiconductor package according to embodiments of the present disclosure.

DETAILED DESCRIPTION

Figure 1A:
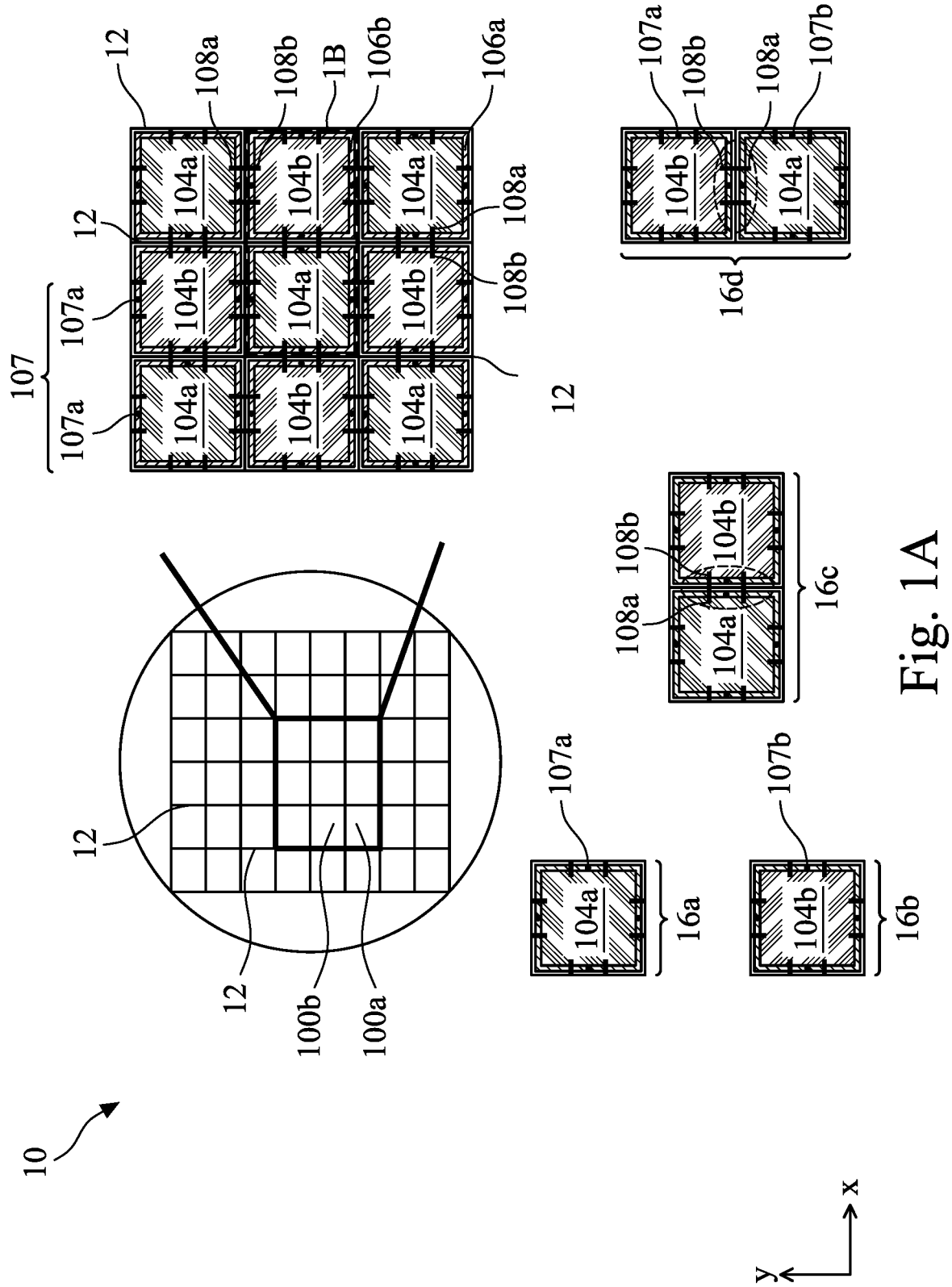
FIG. 1A a schematic plan view of a substrate including an array of integrated circuit dies according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Embodiments of the present disclosure provide an integrated circuit die having vertical interconnect features. The vertical interconnect features may be formed in a seal region. In some embodiments, the vertical interconnect features are segments of a sealing ring. The vertical interconnect features allow the integrated circuit die to connect with another integrated circuit die stacked thereon without going through an interposer. In some embodiments, the integrated circuit die may also include edge interconnect features, such as conductive lines extending through one or more sealing rings and into scribe line regions. In some embodiments, heterogeneous integrated circuit dies with edge interconnect features are connected to each other through the edge interconnect features, either by fabricating on the same substrate or by post fabrication connection, and then stacked with one or more other integrated circuit dies through the vertical interconnect features.

Figure 1B:
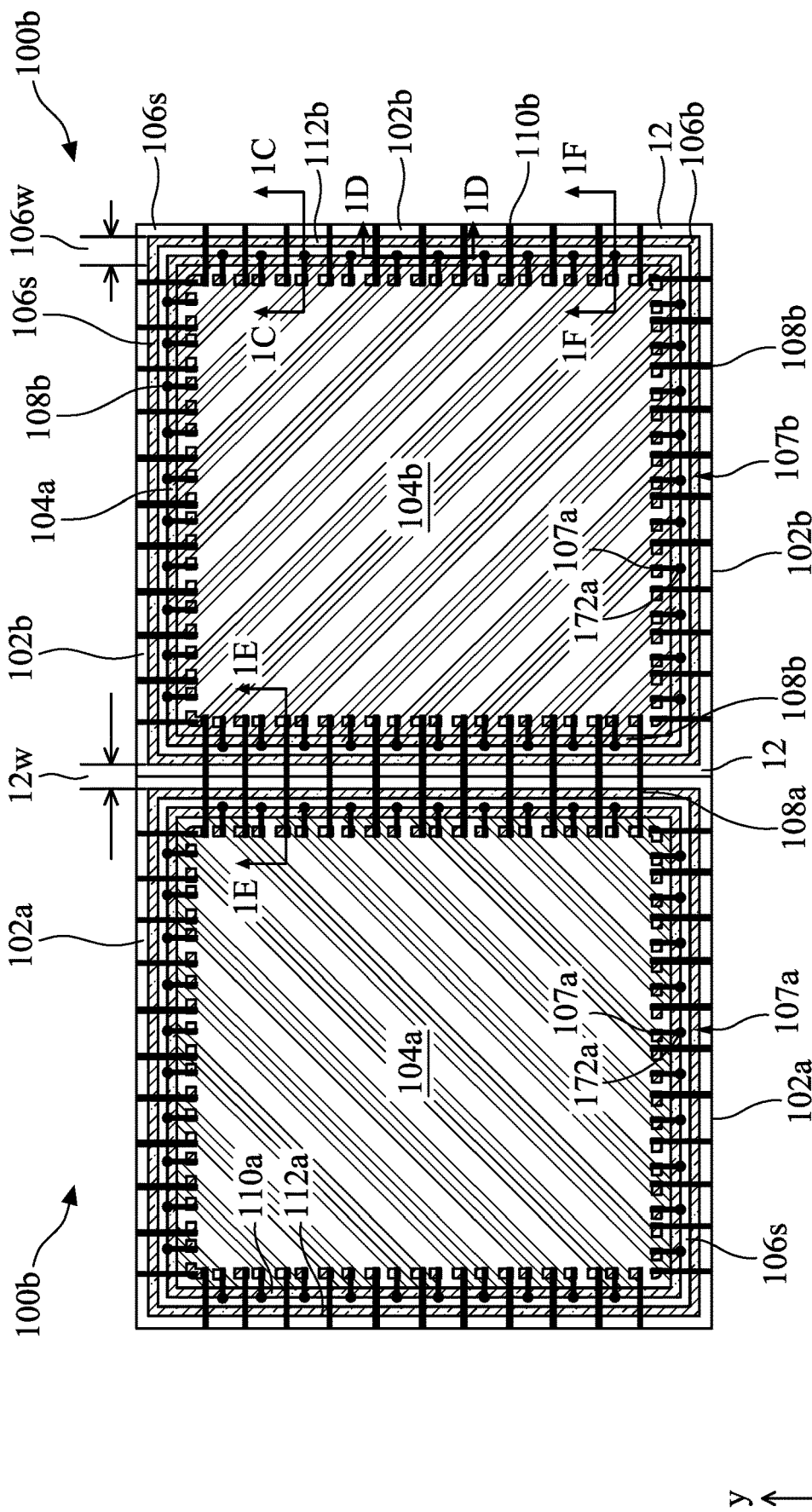
FIG. 1B-1L schematically demonstrate an integrated circuit die having vertical interconnect features according to embodiments of the present disclosure.
Figure 1C:
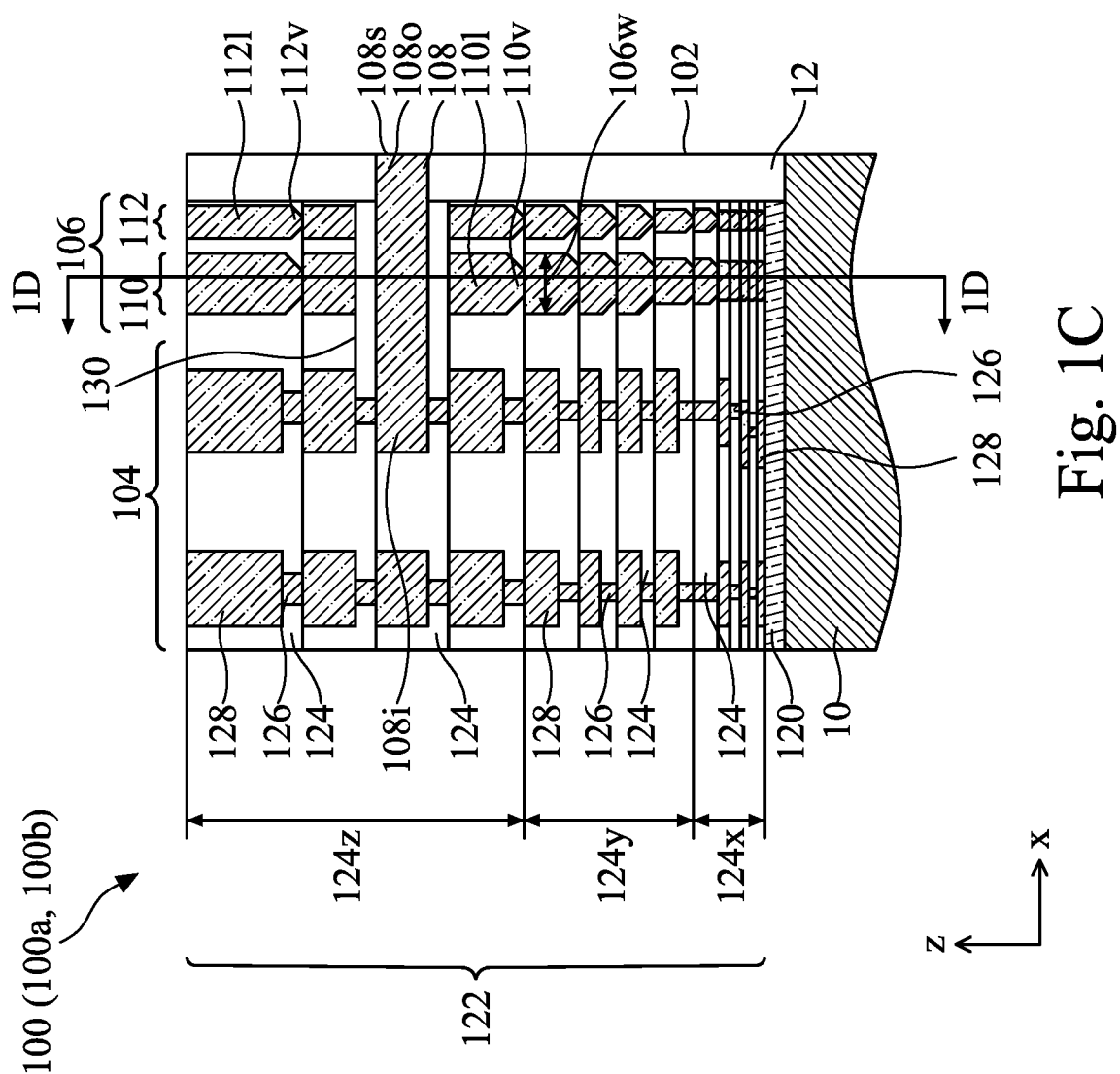
Figure 1D:
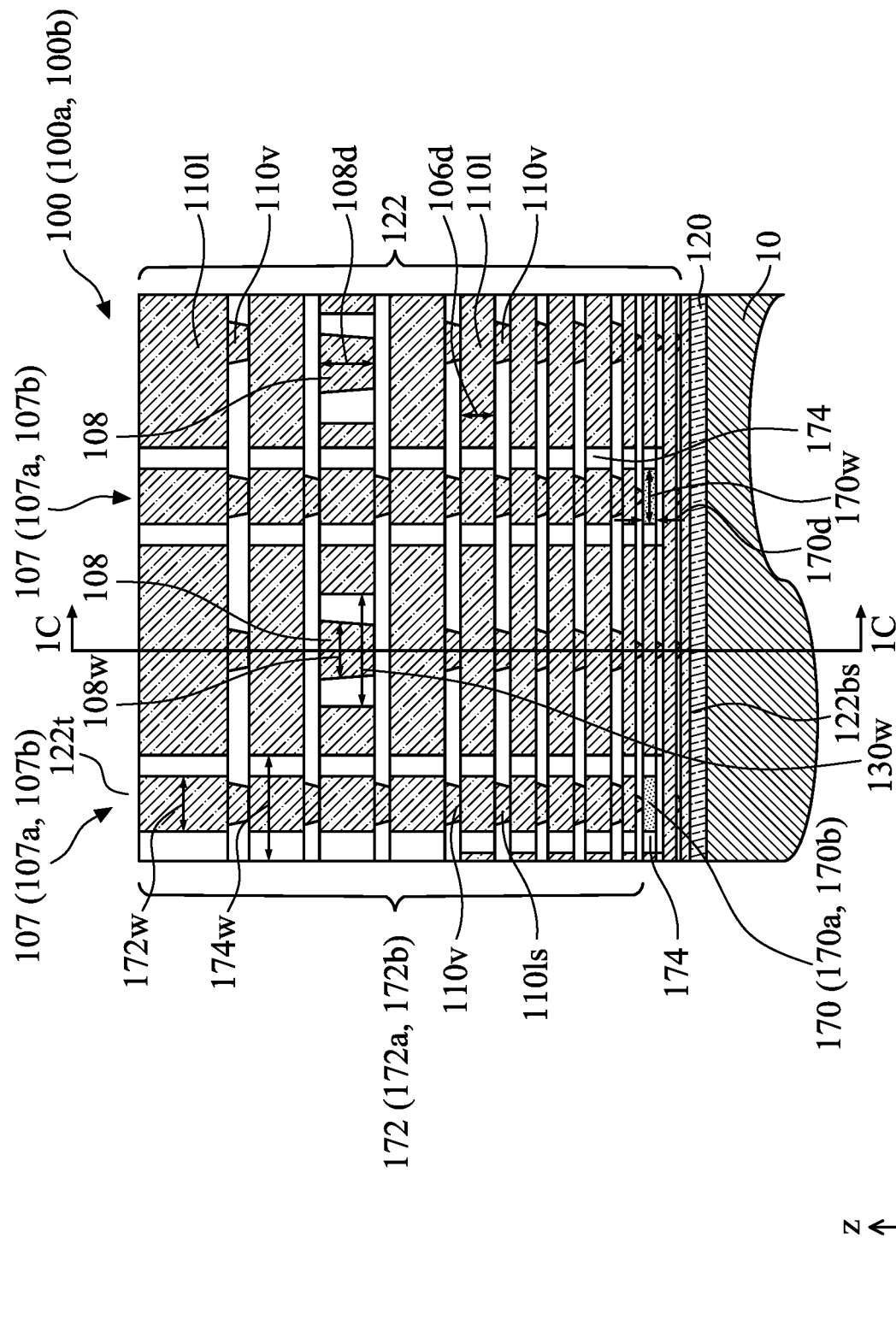
Figure 1E:
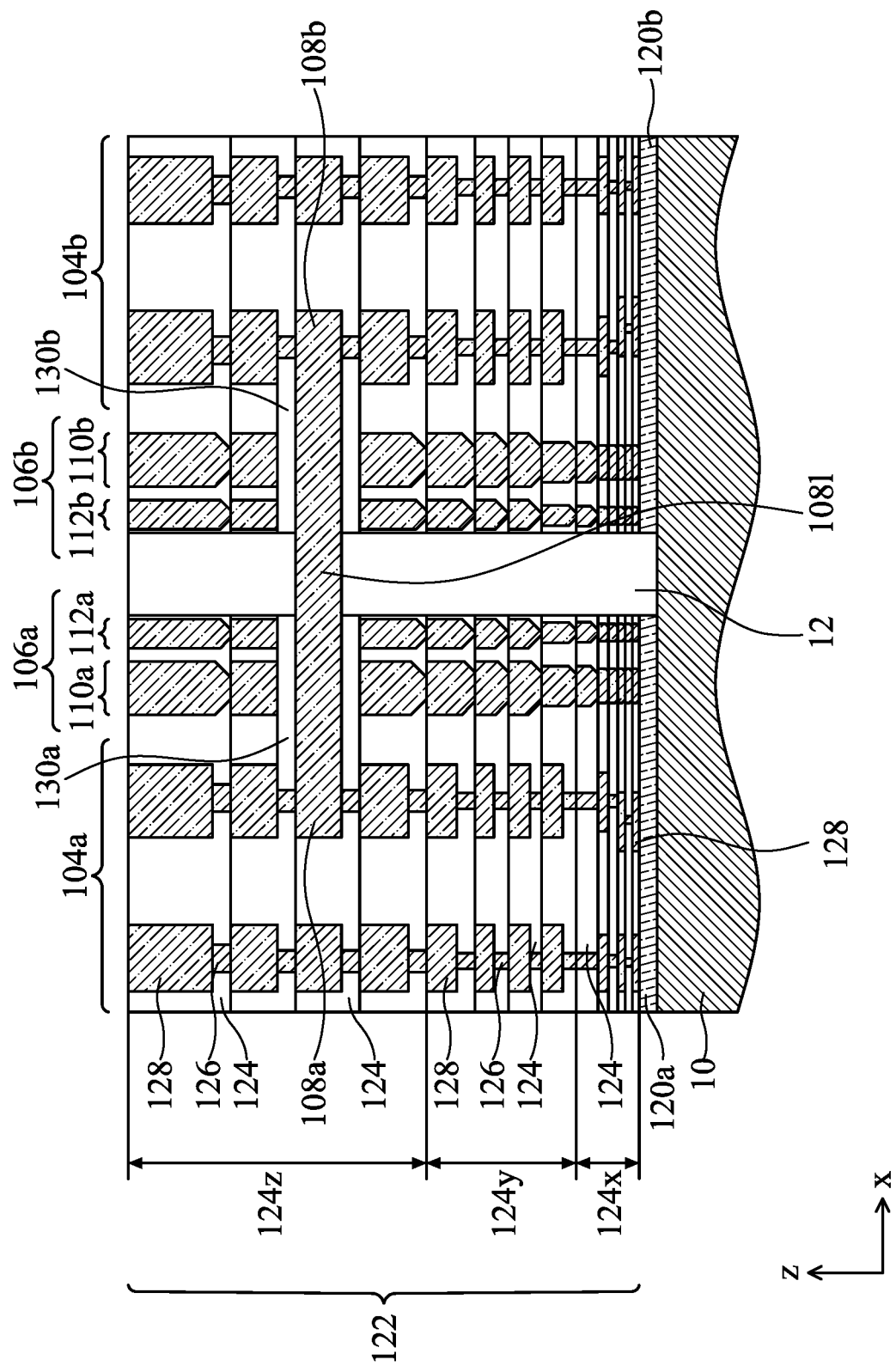
Figure 1F:
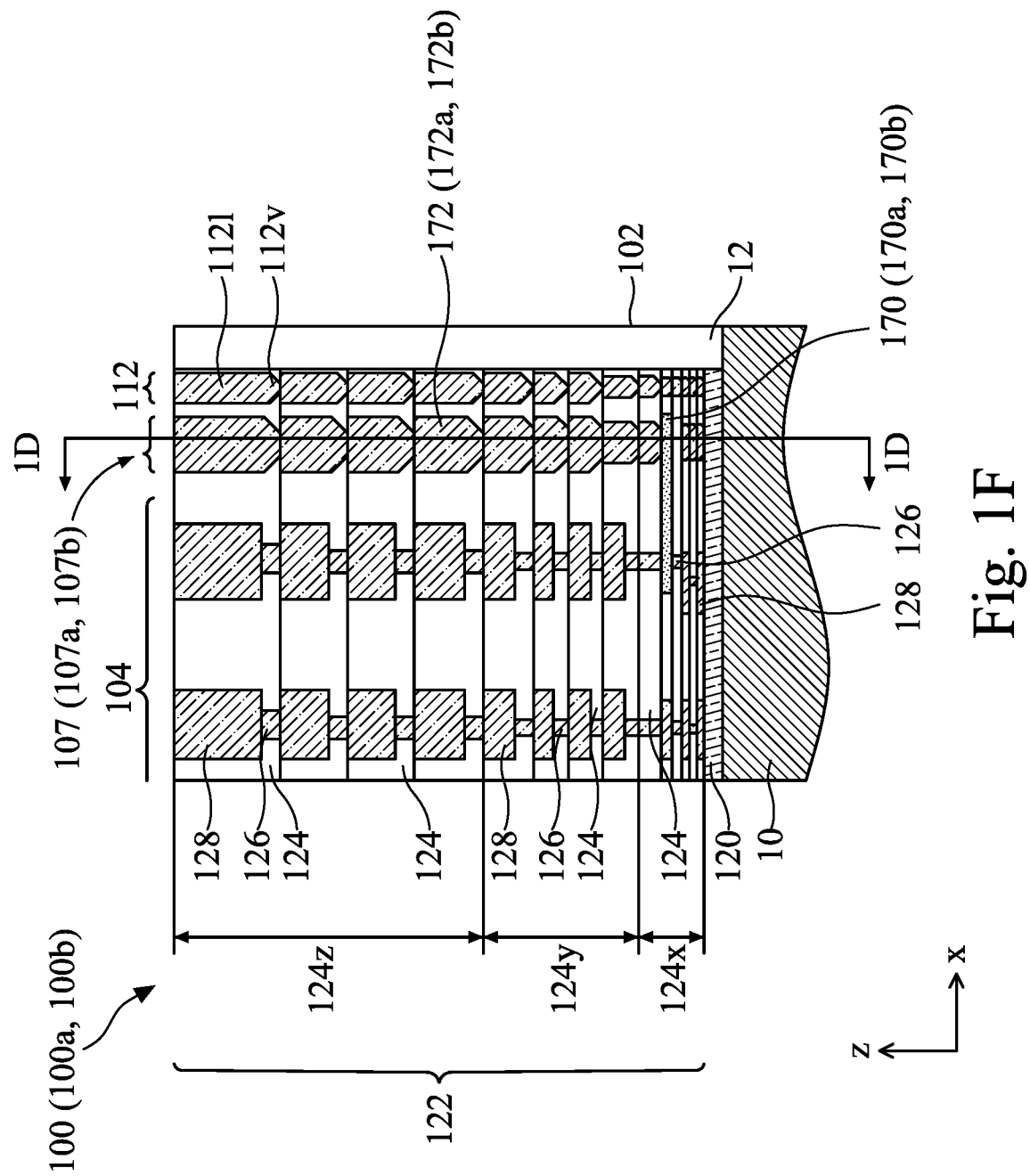

FIG. 1A a schematic plan view of a substrate 10 including an array of integrated circuit dies 100 according to the present disclosure. FIG. 1B-1L schematically demonstrate the integrated circuit dies 100 according to embodiments of the present disclosure. FIG. 1B is a schematic plan view of two neighboring integrated circuit dies 100 (100a, 100b) according to the present disclosure. FIG. 1C is an enlarged partial sectional view of the integrated circuit die 100 along the line 1C-1C in FIG. 1B. FIG. 1D is an enlarged partial sectional view of the integrated circuit die 100 along the line 1D-1D in FIG. 1C. FIG. 1E is an enlarged partial sectional view of the neighboring integrated circuit die 100a, 100b along the line 1E-1E in FIG. 1B. FIG. 1F is an enlarged partial sectional view of the integrated circuit die 100 along the line 1F-1F in FIG. 1B.

As shown in FIG. 1A, an array of integrated circuit dies (or chiplets) 100 are formed on a substrate 10. The array of integrated circuit dies 100 are separated from each other by two sets of intersecting scribe lines 12. One set of scribe lines 12 extend along the x-direction and a second set of scribe lines 12 extend along the y-direction. The array of integrated circuit dies 100 are formed in and/or on the substrate 10 within an array of areas defined by the scribe lines 12. In some embodiments, the integrated circuit dies 100 including two or more different circuit designs. After fabrication, the integrated circuit dies 100, may be tested and cut out along the scribe lines 12 to individual integrated circuit dies 100 or various combination of neighboring integrated circuit dies 100 for subsequent processing, such as packaging.

As shown in FIG. 1A, the plurality of integrated circuit dies 100 fabricated in and/or on the substrate 10 include two types of integrated circuit dies 100a, 100b. The integrated circuit dies 100a, 100b may have substantially the same dimension but with different circuit designs to achieve different functions. In some embodiments, the integrated circuit dies 100a, 100b are arranged alternatively so that each of the integrated circuit die 100a is bordered by at least one integrated circuit die 100b. Neighboring integrated circuit dies 100a, 100b are connected through edge interconnect features as discussed below.

As shown in FIG. 1A, each of the integrated circuit die 100 (100a, 100b) may include a circuit region 104 (104a, 104b) surrounded by a seal region 106 (106a, 106b). According to embodiments of the present disclosure, the integrated circuit die 100 (100a, 100b) includes one or more edge interconnect features 108 (108a, 108b) extending from the circuit region 104 (104a, 104b) through the seal region 106 (106a, 106b) into the scribe line 12. In some embodiments, the edge interconnect features 108 may be conductive lines intersecting with the scribe lines 12 surrounding the integrated circuit die 100 (100a, 100b). After the integrated circuit die 100 (100a, 100b) is cut out along the scribe lines 12, the edge interconnect features 108 (108a, 108b) are exposed on cutting surfaces 102 of the integrated circuit die 100 (100a, 100b). The edge interconnect features 108 (108a, 108b) may be conductive lines configured to connect with external contacts formed on the cutting surfaces 102 (102a, 102b) to provide signal and/or power supplies.

In some embodiments, the integrated circuit die 100 (100a, 100b) includes one or more vertical interconnect features 107 (107a, 107b). The one or more vertical interconnect features 107 may be formed outside the circuit region 104, for example in the seal region 106 (106a, 106b) of the integrated circuit die 100 (100a, 100b). In some embodiments, the vertical interconnect features 107 (107a, 107b) may be conductive plates or vias formed in the seal region 106. In some embodiments, the one or more vertical interconnect features may include one or more segments of a sealing ring within the sealing region 106. The vertical interconnect features 107 may be have an internal end in electrical communication with conductive feature and/or devices in the circuit region 104, and an external end exposed to a top or bottom surface of the integrated circuit die 100. As discussed below, the vertical interconnect features 107 allow the integrated circuit die 100 to connect with an integrated circuit die stacked thereon.

In some embodiments, the edge interconnect features 108 (108a, 108b) may be symmetrically arranged across all scribe lines 12 around the integrated circuit die 100 (100a, 100b). The symmetrical arrangement provides high feasibility for circuit designers. One connection protocol for the edge interconnect features may be used in different integrated circuit dies, thus, facilitating fabrication of two or more directly connected integrated circuit dies on one substrate. For example, in FIG. 1A, a plurality of pairs of directly connected integrated circuit dies 100a, 100b are fabricated in and on the substrate 10. In some embodiments, individual integrated circuit dies 100a, 100b may be tested before cutting. The integrated circuit dies 100a, 100b may be cut into various die combinations, such as die combinations 16a, 16b, 16c, 16d, for packaging, thus lowering cost of production. For the die combinations 16a, 16b, which include single integrated circuit dies 100a, 100b, conductive features may be formed from the exposed edge interconnect features 108 to connect with other integrated circuit dies without going through an interposer. The die combinations 16c, 16d, which includes the integrated circuit dies 100a, 100b of different arrangements, may be directly packaged as connected components without cutting out as individual dies.

The vertical interconnect features 107 (107a, 107b) may be arranged along one or more side of the integrated circuit die 100 (100a, 100b) along the corresponding scribe line 12. In some embodiments, the vertical interconnect features 107 (107a, 107b) may be symmetrically arranged across all scribe lines 12 around the integrated circuit die 100 (100a, 100b). In some embodiments, the vertical interconnect features 107 may be evenly distributed along each of the scribe lines 12 around the integrated circuit die 100 (100a, 100b). In some embodiments, as shown in FIG. 1B, the vertical interconnect features 107 and edge interconnect features 108 may be arranged in a staggered manner in the plan view.

The substrate 10 may be a semiconductor substrate, for example, bulk silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as a multi-layered or gradient substrate may also be used.

The array of integrated circuit dies 100 may be formed in and/or on the substrate 10 by performing various semiconductor fabrication processes, including, but not limited to, front-end-of-line (FEOL) processing, and back-end-of-line (BEOL) processing. As shown in FIGS. 1C, 1D, and 1E, the various semiconductor fabrication processes are performed to form a device layer 120 (120a, 120b) and an interconnect structure 122 (122a, 122b) in the integrated circuit dies 100 (100a, 100b).

In some embodiments, the array of integrated circuit dies 100 may include two or more different circuit designs formed on the same substrate 10 to achieve direct heterogenous connections between the integrated circuit dies 100 without cutting out as individual dies. In other embodiments, the array of integrated circuit dies 100 have substantially identical circuit designs, which may be cut off individually to be connected to other circuit components through the edge interconnect features 108.

The integrated circuit dies 100 may be designed to perform any suitable function. For example, the integrated circuit die 100 may be a logic die (e.g., central processing unit, a SoC, ASIC, FPGA, microcontroller, etc.), a memory die, a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or a combination thereof.

FIG. 1B is a schematic plan view of two neighboring integrated circuit dies 100a, 100b according to the present disclosure formed on the substrate 10. In FIG. 1B, components formed in various layers along the z-axis are superimposed on one another to show their relative positions in a plan view. Positions of the components along the z-axis are shown corresponding cross-sectional views, such as the views in FIGS. 1C and 1D. FIG. 1B illustrates relative positions of the circuit region 104, the seal region 106, the vertical interconnect features 107, and the edge interconnect features 108 within the integrated circuit dies 100 according to some embodiments. As shown in FIG. 1B, each integrated circuit die 100 is defined in a square area by the scribe lines 12. In some embodiments, the integrated circuit dies 100 may have a plan view area in a range between about 10 mm$^2$ and about 1000 mm$^2$ depending on the circuit design and/or function of the integrated circuit die 100. FIG. 1B illustrates integrated circuit dies with a square shape in the plan view. However, the integrated circuit dies may have other shapes in the plan view. For example, rectangular, hexagonal, octagonal shapes may be used to achieve design purposes. Depending on the design, the scribe lines 12 may have a width 12w in a range between about 1 μm to about 200 μm. A scribe line width 12w lower than 1 μm may not be wide enough to tolerant system errors during separation of the integrated circuit dies 100. A scribe line width 12w greater than 200 μm would increase cost of production without additional benefit.

Within the die area of each integrated circuit die 100, the circuit region 104 is surrounded by the seal region 106 around an outer perimeter of the circuit region 104. One or more sealing rings 110, 112 are concentrically formed in the seal region 106. The seal rings 110, 112 provide protection to circuit structures in the circuit region 104 against undesired elements from the exterior environment, such as water vapor, during and after separation of the integrated circuit dies 100.

Even though two sealing rings 110, 112 are shown in the integrated circuit die 100, less or more sealing rings may be included in the seal region 106. After being cut along the scribe lines 12, the portion of the scribe line 12 may remain on sides of the integrated circuit die 100, and the seal region 106 is surrounded by materials of the scribe lines 12 and not exposed on the cutting surfaces 102.

The edge interconnect features 108 are two or more conductive lines extending from the circuit region 104 through the seal region to intersect with the scribe lines 12. In some embodiments, the edge interconnect features 108 may intersect with the corresponding scribe line 12 at a substantially perpendicular manner. In other embodiments, the edge interconnect features 108 may intersect with the corresponding scribe line 12 at a slanted angle. For example, the edge interconnect features 108 may intersect the y-z plan at a slanted angle, such as an angle in a range between about 45 degree to about 90 degree. In some embodiments, the edge interconnect features 108 may be distributed along one or more of sides 106s of the seal region 106. In some embodiments, the edge interconnect features 108 are a plurality of conductive lines distributed along one or more of the sides 106s. In some embodiments, the plurality of conductive lines may be evenly distributed along one or more sides 106s of the seal region 106.

In some embodiments, as shown in FIG. 1B, the edge interconnect features 108 may be symmetrically arranged along all sides 106s of the seal region 106. For example, an equal number of the edge interconnect features 108 are distributed alone every sides 106s of the seal region 106 at a substantially equal pitch. The symmetrical distribution allow corresponding edge interconnect features 108 in neighboring integrated circuit dies 100 to form continuous conductive lines. As shown in FIG. 1B, edge interconnect features 108a of the integrated circuit die 100a are in contact with corresponding edge interconnect features 108b of the integrated circuit die 100a to form a plurality of continuous conductive lines across the shared scribe line 12. Similarly, the edge interconnect features 108a along other sides 106s of the seal region 106 may form continuous line features with corresponding edge interconnect features 108 in the neighboring integrated circuit die 100 along the other sides 106s.

In some embodiments, the edge interconnect features 108a of the integrated circuit die 100a and the corresponding edge interconnect features 108b of the integrated circuit die 100b are fabricated as monolithic conductive lines. The monolithic conductive line arrangement may enable direct communication between devices in the neighboring integrated circuit dies, and thus, allowing the neighboring integrated circuit dies to be packaged together without cutting from the scribe lines. The monolithic conductive line arrangement also provides higher tolerance to the cutting operation and ensures that the edge interconnect features 108 are exposed on the cutting surface 102.

The continuous line features ensure that the edge interconnect features 108 are exposed on the cutting surfaces 102 for subsequent wiring and packaging process after the integrated circuit die 100 is cut free from the substrate 10. The symmetrical arrangement of the edge interconnect features 108 also provide design flexibilities. For example, a common scheme of edge interconnect feature arrangement may be used for different integrated circuit dies, such as for different SoCs, and different memory dies. It should be noted that the edge interconnect features 108 may be arranged in any suitable manner to achieve desired design proposes.

FIGS. 1C and 1D provide additional details of the edge interconnect features 108 within the integrated circuit die 100 according to embodiments of the present disclosure. FIG. 1C schematically illustrates details across the seal region 106 of the integrated circuit die 100. FIG. 1D schematically illustrates details of the integrated circuit die 100 along the sealing ring 110. FIG. 1E schematically illustrates details adjacent the scribe line 12 between the integrated circuit dies 100a, 100b.

As shown in FIGS. 1C and 1D, the device layer 120 is formed in and/or on the substrate 10, and the interconnect structure 122 are formed over the device layer 120. The device layer 120 may include various semiconductor devices, such as transistors, diodes, capacitors, resistors, etc., and may be formed in and/or on the substrate 10. In some embodiments, the device layer 120 includes one or more dielectric layers overlying the semiconductor devices therein.

The interconnection structure 122 includes various conductive features, such as a first plurality of conductive features 126 and second plurality of conductive features 128, and one or more intermetal dielectric (IMD) layers 124 to separate and isolate various neighboring conductive features 126, 128. In some embodiments, the first plurality of conductive features 126 are conductive vias and the second plurality of conductive features 128 are conductive lines. The interconnection structure 122 includes multiple levels of the conductive features 128, and the conductive features 128 are arranged in each level to provide electrical paths to the devices in the device layer 120. The conductive features 126 provide vertical electrical routing from the device layer 120 to the conductive features 128, and between the conductive features 128 in different layers.

The conductive features 126 and conductive features 128 may be made from one or more electrically conductive materials, such as one or more layers of graphene, metal, metal alloy, metal nitride, or silicide. For example, the conductive features 126 and the conductive features 128 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layers 124 may be formed, for example, of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like. The IMD layers 124 may be formed by any suitable method, such as spinning, chemical vapor deposition (CVD), and/or plasma-enhanced CVD (PECVD). In some embodiments, the interconnect structure 122 may be formed sequentially layer-by-layer from the device layer 120 during BOEL processing. In some embodiments, the interconnect structure 122, the conductive features 126 and conductive features 128 may be fabricated using damascene and/or dual-damascene process.

As shown in FIG. 1C, a plurality of IMD layers 124 are sequentially formed over the device layer 120 with the conductive features 126, 128 having increased dimension. The number of IMD layers 124 may be any number suitable for the circuit design. For example, the number of IMD layers 124 may be between 1 and 30. In FIG. 1C, the IMD layers 124 are divided into three groups: bottom IMD layers 124x, middle IMD layers 124y, top IMD layers 124z based on relative position to the device layer 120. The bottom IMD layers 124x, formed immediately on the device layer 120 are thinner and with the conductive features 126, 128 of a higher density. The middle IMD layers 124y formed over the bottom IMD layers 124x are thicker and with the conductive features 126, 128 of a lower density. The top IMD layers 124z formed over the middle IMD layers 124y are thickest and with the conductive features 126, 128 of a lowest density.

The sealing rings 110, 112 are formed in the seal region 106 between the circuit region 104 and the scribe line 12. Each of the sealing rings 110, 112 includes physically connected components to function as a barrier between the conductive features 126, 128 in the interconnect structure 122 and exterior environment, such as moisture. The sealing rings 110, 112 may be formed by any suitable designs and with any suitable materials, such as materials suitable as moisture barrier. In some embodiments, the sealing rings 110, 112 are formed with electrically conductive materials. In some embodiments, the sealing rings 110, 112 may be electrically grounded. In some embodiments, the sealing rings 110, 112 may be formed from the same material as the conductive features 126, 128. For example, the sealing rings 110, 112 may be formed from Cu, Al, Co, Ru, Mo, W, and related alloys.

FIGS. 1C and 1D schematically demonstrate one example of the sealing rings 110, 112. Other sealing ring structures may be used by persons skilled in the art with the integrated circuit die 100 according to present disclosure. As shown in FIGS. 1C and 1D, each of the sealing rings 110, 112 includes layers of substantially continuous sealing lines 110l, 112l connected by a plurality of sealing vias 110v, 112v formed in the IMD layers 124. The continuous sealing lines 110l, 112l in neighboring IMD layers 124 are connected by the plurality of sealing vias 110v, 112v respectively. The sealing lines 110l, 112l and sealing vias 110v, 112v may be fabricated layer-by-layer in the same process with the conductive features 126, 128 in the corresponding IMD layers 124. Dimension of the sealing lines 110l, 112l may vary in different IMD layers 124. In some embodiments, the sealing lines 110l, 112l may have a line width 106w in a range between about 0.01 μm and about 6 μm, and a line depth 106d in a range between about 0.01 μm and about 6 μm.

The edge interconnect features 108 may be formed in one or more IMD layers 124. Each of the edge interconnect features 108 may be conductive line having an inner end 108i and an outer end 108o. The inner end 108i may be electrically connected to one or more conductive features 128, 126 in the circuit region 104. The outer end 108o is embedded in the scribe line 12 outside the seal region 106. In some embodiments, a portion of the edge interconnect features 108 may be dummy connectors to achieve structural uniformity in the integrated circuit die 100. For example, the inner end 108i of a portion of the edge interconnect features 108 may be "floating" in the IMD layer 124 without connecting to any other conductive features, such as conductive features 126, 128. If the integrated circuit die 100 is cut out along the scribe line 12, the outer ends 108o of the edge interconnect features 108 is exposed on the cutting surface 102.

In some embodiments, the integrated circuit die 100 may be designed to connect with two or more other integrated circuit dies through the edge interconnect features 108. In some embodiments, some of the edge interconnect features 108 may be assigned to provide connections to one of the other integrated circuit dies. For example, a first portion of the edge interconnect features 108a along one side of 102 of the integrated circuit die 100a may be designated to provide connection with the integrated circuit die 100b, and a second portion of the edge interconnect features 108a may be designated to provide connection with an integrated circuit die 100c, with different circuit designs from the integrated circuit dies 100a, 100b.

The edge interconnect features 108 extend through the sealing rings 110, 112 through openings 130 which are formed in the sealing ring 110, 112 and the corresponding IMD layer 124. Dielectric material of the IMD layer 124 is disposed between the edge interconnect features 108 and the sealing rings 110, 112 to electrically isolate the edge interconnect features 108 from the sealing rings 110, 112.

The edge interconnect features 108 may be formed in the same process with the conductive features 126, 128 in the corresponding IMD layers 124. In some embodiments, the sealing rings 110, 112 may be formed from the same material as the conductive features 126, 128. For example, the edge interconnect features 108 may be formed from Cu, Al, Co, Ru, Mo, W, and related alloys.

In some embodiments, dimensions of the edge interconnect features 108 may be similar to the conductive features 128 in the same IMD layer 124. In some embodiments, the edge interconnect features 108 may have a line width 108w in a range between about 0.01 μm and about 6 μm, and a line depth 108d in a range between about 0.01 μm and about 6 μm. A width 130w of the openings 130 may be in a range between about 0.03 μm and about 18 μm.

Dimension of the edge interconnect features 108 may vary in different IMD layers 124. Depending on the function and density of the edge interconnect features 108, the edge interconnect features 108 may be formed in the bottom IMD layers 124x, the middle IMD layers 124y, the top IMD layers 124z, and a top metal layer (not shown) above the top IMD layer 124z. For example, if the edge interconnect features 108 are used to transfer signals to individual devices in the device layer 120, the density of the edge interconnect features 108 is likely to be relatively high and the width of the edge interconnect features 108 may be relatively small, and the edge interconnect features 108 may be formed in one or more bottom IMD layers 124x. If the edge interconnect features 108 are used to provide power supply to the device layer 120, the density of the edge interconnect features 108 is likely to be relatively low and the width of the edge interconnect features 108 may be relatively large, and the edge interconnect features 108 may be formed in one or more top IMD layers 124z.

In some embodiments, the scribe lines 12 between the integrated circuit dies 100 may also be filled with suitable materials. A dielectric material may be filled in the scribe lines 12 between the integrated circuit dies 100. The outer end 108o of the edge interconnect features 108 are surrounded by the dielectric material in the scribe lines 12, thus, are electrically isolated from one another. In some embodiments, the scribe lines 12 may be filled with the same material as in the IMD layers 124. The scribe lines 12 may be filled and then patterned layer-by-layer in the same process with the conductive features 126, 128 in the corresponding IMD layers 124. In some embodiments, the scribe lines 12 or the dielectric material filled in the scribe lines 12 may include one or more layers of a low dielectric constant (low-K) dielectric material, such as SiOx, SiOxCyHz, SiOxCy, SiCx, SiNx, or related low-k dielectric material, compounds thereof, composites thereof, combinations thereof, or the like.

FIG. 1E schematically illustrates that each of the edge interconnect features 108a of the integrated circuit die 100a and the corresponding edge interconnect features 108b of the integrated circuit die 100b form a continuous conductive line 108l across the scribe line 12 between the inter circuit dies 100a, 100b. The scribe line 12 may include multiple layers of suitable materials formed on the substrate 10 between the seal regions 106a, 106b of the neighboring integrated circuit dies 102a, 102b. In some embodiments, the scribe line 12 may be formed layer-by-layer during the fabrication process of the device layer 120a, 120b and the interconnect structures 122a, 122b. Layers in the scribe line 12 may include the same materials of the IMD layers 124 in the interconnect structures 122a, 122b. In some embodiments, the scribe line 12 may also include one or more dielectric layers between the device layers 120a, 120b. In other embodiments, the scribe line 12 may be formed separately from the interconnect structures 122a, 122b and/or the device layers 120a, 120b by suitable processes, such as patterning, deposition, and etching. Materials in the scribe line 12 may be different from the IMD layers 124 in the interconnect structures 122a, 122b.

A plurality of conductive lines 108l are formed across the scribe line 12 between the neighboring integrated circuit dies 100a, 100b. A portion of the plurality of the conductive lines 108l are functional connections with both ends connected to the conductive features 126/128 in the integrated circuit dies 100a, 100a. In some embodiments, a portion of the conductive lines 108l may be dummy connection with at least one end "floating" in the corresponding integrated circuit die 100a or 100b.

In the embodiment shown in FIGS. 1C, 1D, and 1E, the edge interconnect features 108 are formed in the top IMD layer 124z. As discussed above, the edge interconnect features 108 according to the present disclosure may be formed in any suitable IMD layers.

Refer to FIGS. 1B, 1D, and 1F, each of the vertical interconnect features 107 may include a horizontal portion 170 (170a, 170b) and a vertical portion 172 (172a, 172b) connected to the horizontal portion 170 (170a, 170b). The horizontal portion 170 (170a, 170b) may be a conductive line in one or more IMD layers 124 and extends to one of the sealing rings 110, 112, for example, the inner most sealing ring 110. The horizontal portion 170 (170a, 170b) may be electrically connected to one or more conductive features 128, 126 in the interconnect structure 122.

In some embodiments, the vertical portion 172 (172a, 172b) may be a conductive column connecting the corresponding horizontal portion 170 (170a, 170b) to an exterior surface of the integrated circuit die 100, such as a top surface 122t of the interconnect structure 122. In other embodiments, the vertical portion 172 (172a, 172b) may provide electrical connections to a back side of the substrate 10, such as through a conductive column connecting the horizontal portion 170 (170a, 170b) to a back surface 122bs of the interconnect structure 122, and a through substrate via (TSV) (not shown) formed in the device layer 120 and the substrate 10.

The vertical portion 172 (172a, 172b) includes a segment of the sealing ring 110 that is electrically isolated from the remainder of the sealing ring 110, but electrically connected with the corresponding horizontal portion 170 (170a, 170b). As shown in FIG. 1D, the vertical portion 172 (172a, 172b) may be a conductive feature including one or more conductive plates 110ls and one or more conductive vias 110v stacked together. The vertical portion 172 may be formed in an opening 174 formed in the sealing ring 110. The opening 174 may be formed in a portion of the IMD layers 124. In some embodiments, the opening 174 is formed from the topmost IMD layer to the IMD layer 124 in which the horizontal portion 170 is formed. The vertical interconnect features 107 are embedded in the one or more layers of dielectric material in the opening 174, thus, electrically isolated from the sealing ring 110.

The vertical interconnect features 107 may be formed in the same process with the conductive features 126, 128 in the corresponding IMD layers 124. In some embodiments, the vertical interconnect features 107 may be formed from the same material as the conductive features 126, 128. For example, the vertical interconnect features 107 may be formed from Cu, Al, Co, Ru, Mo, W, and related alloys.

In some embodiments, dimensions of the vertical interconnect features 107 may be similar to the conductive features 128, 126 and/or the sealing rings 110 in the same IMD layer 124. In some embodiments, the horizontal portion 170 (170a, 170b) may have a line width 170w in a range between about 0.01 µm and about 6 µm, and a line depth 170d in a range between about 0.01 µm and about 6 µm. In some embodiments, the vertical portion 172 (172a, 172b) may have a line width 172w in a range between about 0.01 µm and about 6 µm. A width 174w of the openings 174 may be in a range between about 0.03 µm and about 18 µm.

In some embodiments, the vertical interconnect features 107 allow the integrated circuit die 100 to be connected to external power and/or signals, for example through TSV (through substrate via) connectors in a vertically stacked larger substate, without using a RDL (redistribution layer). The vertical interconnect features 107 allow the integrated circuit die 100 to connect with external power and/or signal lines from one or more IMD layers. Because the IMD layers are typically denser than the RLD layer, the vertical interconnect features 107 can be arranged at a higher density than the features in a RDL layer. By omitting the RDL layer, the vertical interconnect features 107 also reduce resistance and power consumption.

In FIGS. 1C-1F, the horizontal portions 170 (170a, 170b) the vertical interconnect features 107 are formed in the same IMD layer 124. In some embodiments, the horizontal portions 170 (170a, 170b) of the interconnect features 107 may be formed in different IMD layers 124 depending on the function and/or density of the vertical interconnect features 107.

The vertical interconnect features 107 may be formed in the bottom IMD layers 124x, the middle IMD layers 124y, the top IMD layers 124z, and a top metal layer (not shown) above the top IMD layer 124z. For example, if the vertical interconnect features 107 are used to transfer signals to individual devices in the device layer 120, the density of the edge interconnect features 108 is likely to be relatively high and the width of the vertical interconnect features 107 may be relatively small, and the edge interconnect features 108 may be formed in one or more bottom IMD layers 124x. If the vertical interconnect features 107 are used to provide power supply to the device layer 120, the density of the vertical interconnect features 107 is likely to be relatively low and the width of the vertical interconnect features 107 may be relatively large, and the vertical interconnect features 107 may be formed in one or more top IMD layers 124z.

Figure 1G:
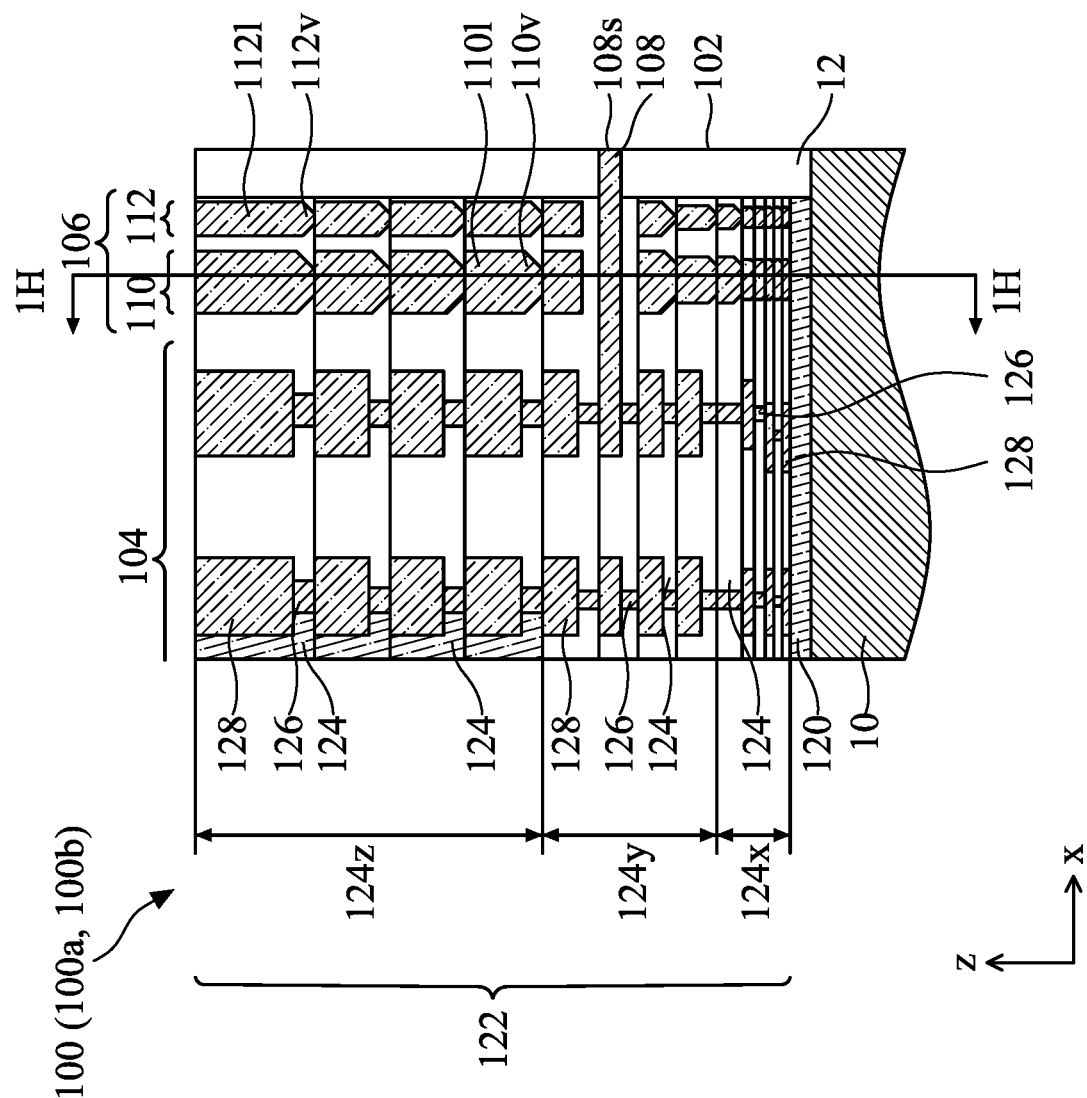
Figure 1H:
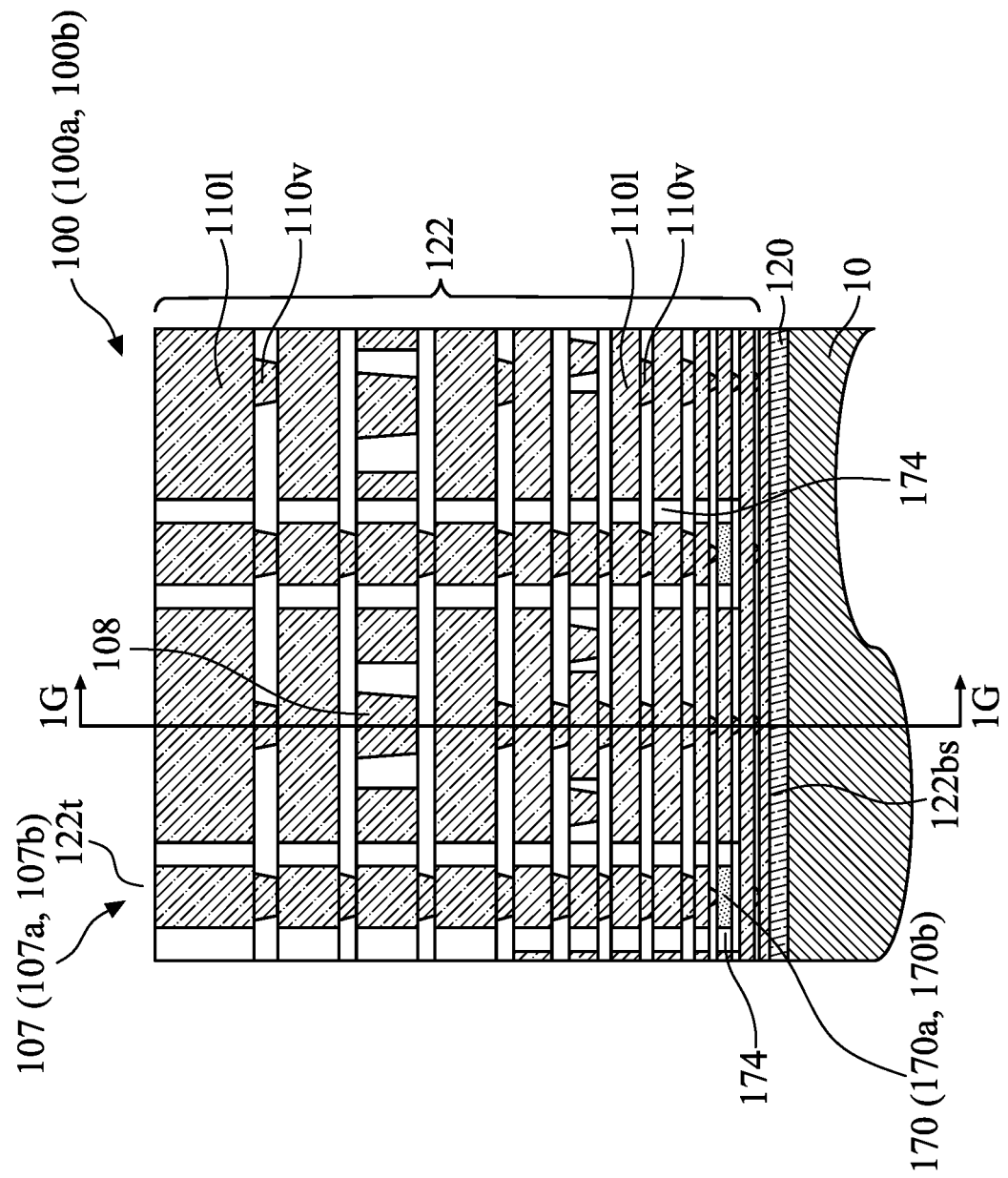
Figure 1I:
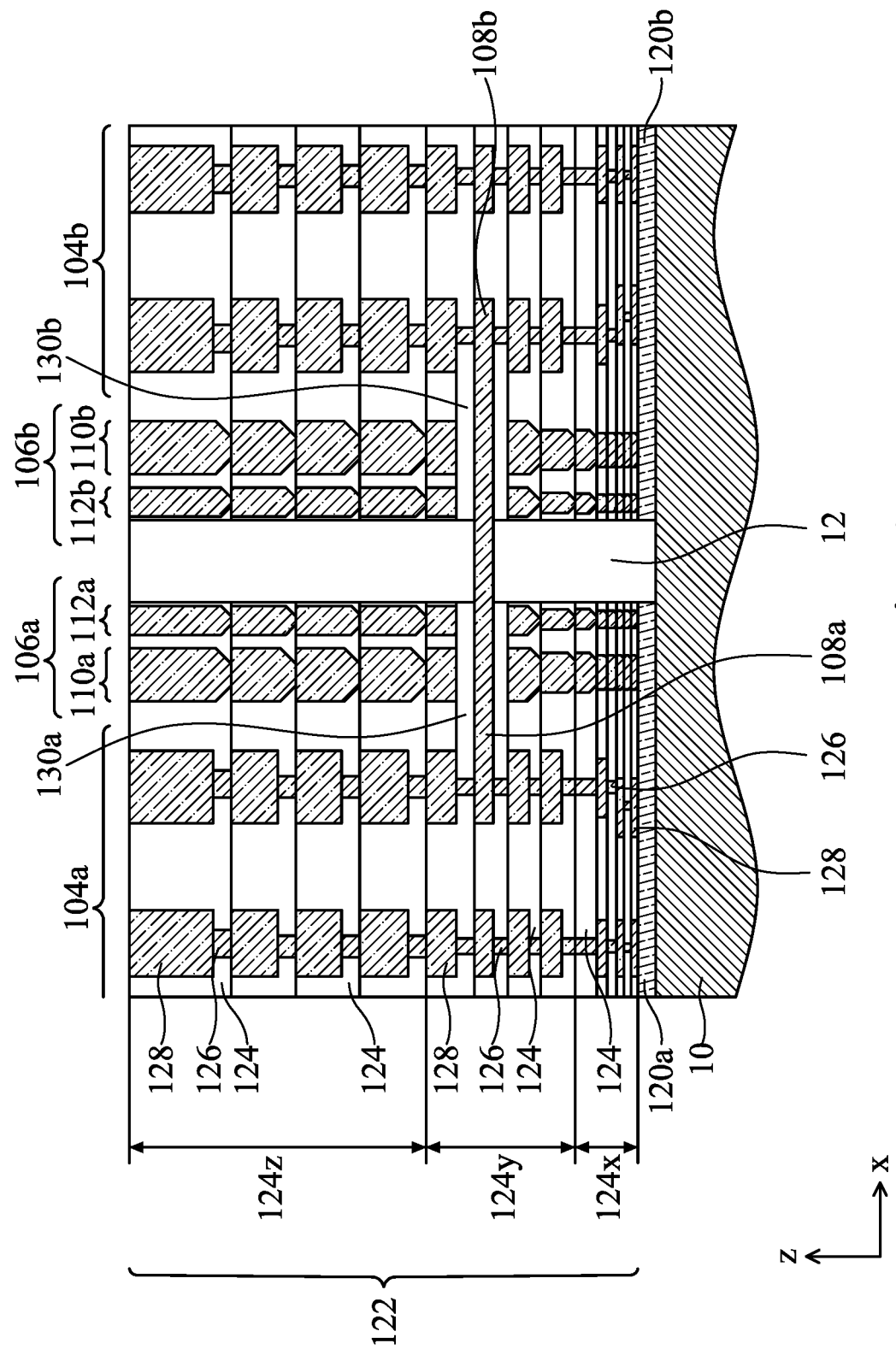

FIG. 1G is an enlarged partial sectional view of the integrated circuit die 100, according to another embodiment, along the line 1C-1C in FIG. 1B. FIG. 1H is an enlarged partial sectional view of the integrated circuit die 100 along the line 1H-1H in FIG. 1G. FIG. 1I is an enlarged partial sectional view of the neighboring integrated circuit die 100a, 100b along the line 1E-1E in FIG. 1B corresponding to the embodiment shown in FIGS. 1G and 1H. In the embodiment shown in FIGS. 1G, 1H, and 1I, the edge interconnect features 108 are formed in the middle IMD layer 124y. FIG. 1H schematically illustrates the relative position of the edge interconnect features 108 and the vertical interconnect features 107.

Figure 1J:
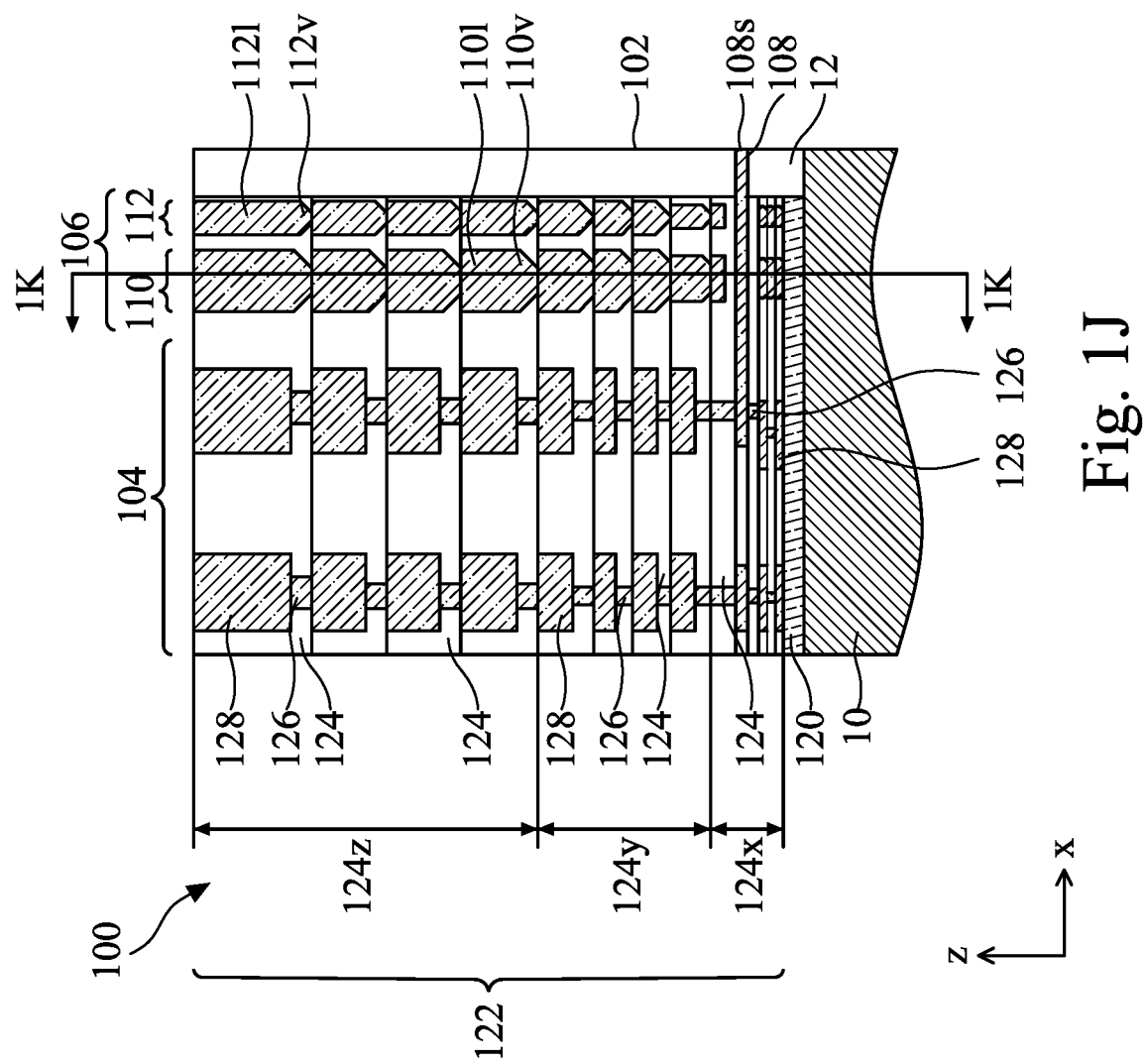
Figure 1K:
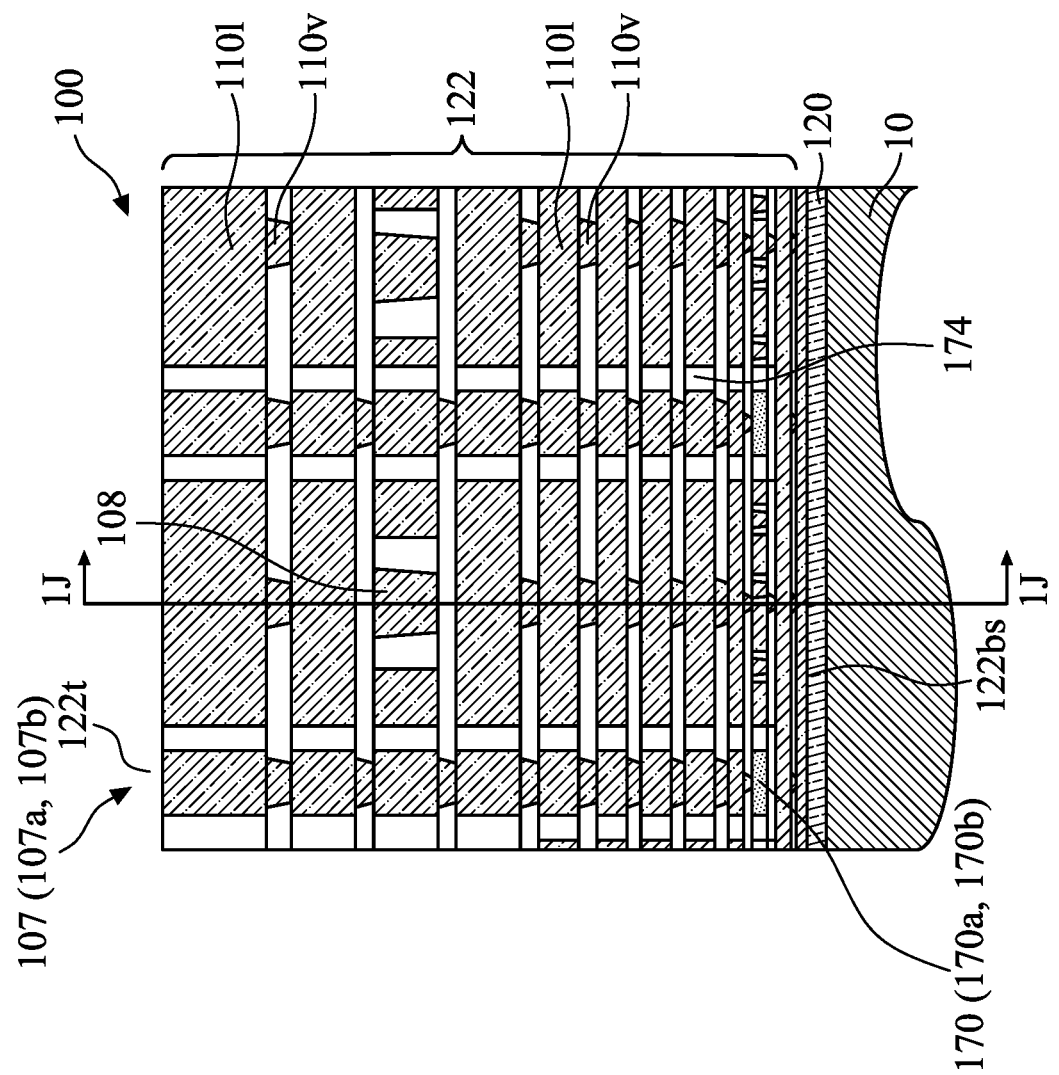
Figure 1L:
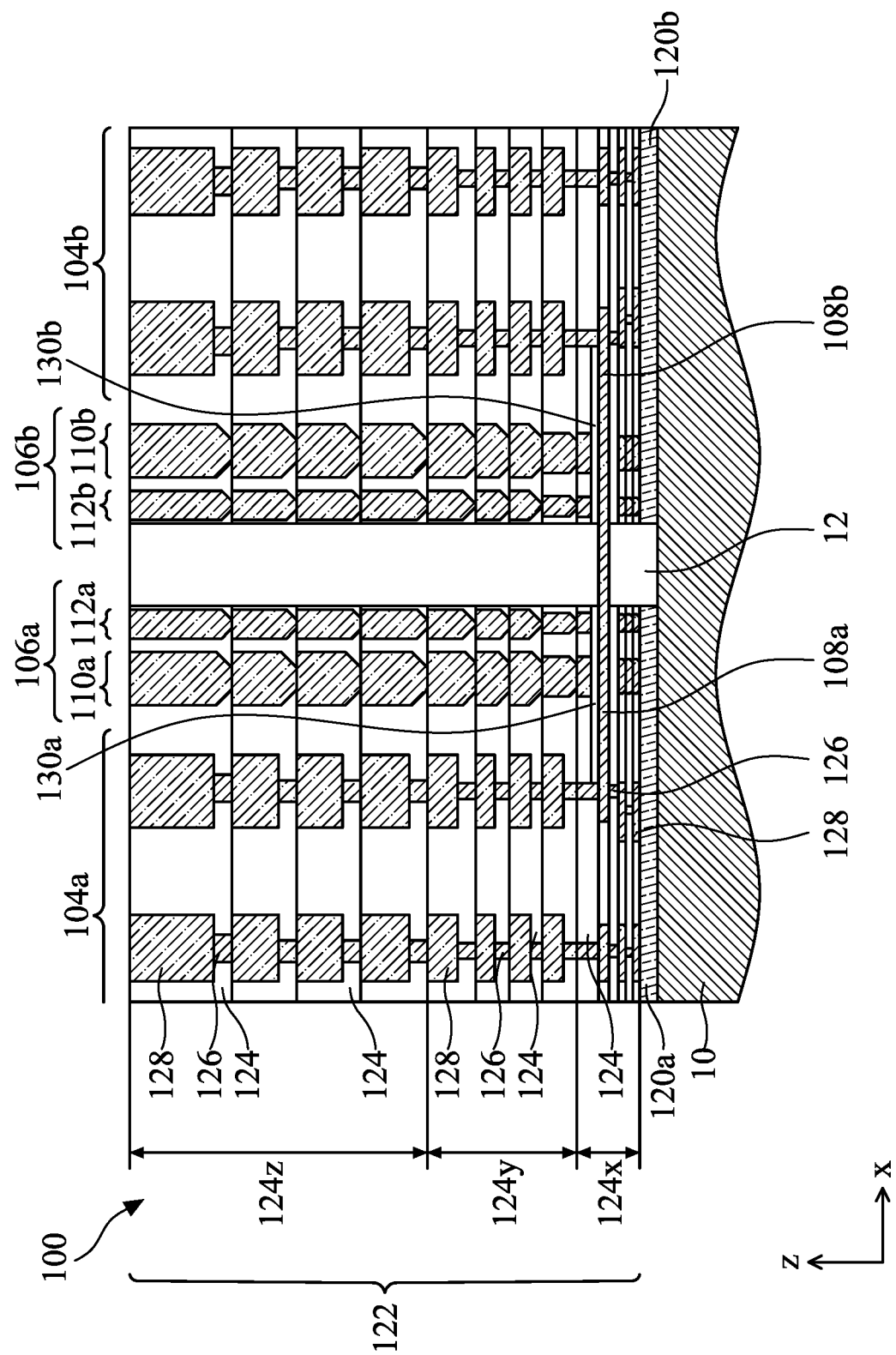

FIG. 1J is an enlarged partial sectional view of the integrated circuit die 100, according to another embodiment, along the line 1C-1C in FIG. 1B. FIG. 1K is an enlarged partial sectional view of the integrated circuit die 100 along the line 1K-1K in FIG. 1J. FIG. 1L is an enlarged partial sectional view of the neighboring integrated circuit die 100a, 100b along the line 1E-1E in FIG. 1B corresponding to the embodiment shown in FIGS. 1J and 1K. In the embodiment shown in FIGS. 1J, 1K, and 1L the edge interconnect features 108 are formed in the bottom IMD layer 124x. FIG. 1L schematically illustrates the relative position of the edge interconnect features 108 and the vertical interconnect features 107. In FIG. 1L, the edge interconnect features 108 and the vertical interconnect features 107 are formed in the same IMD layer 124.

Figure 2:
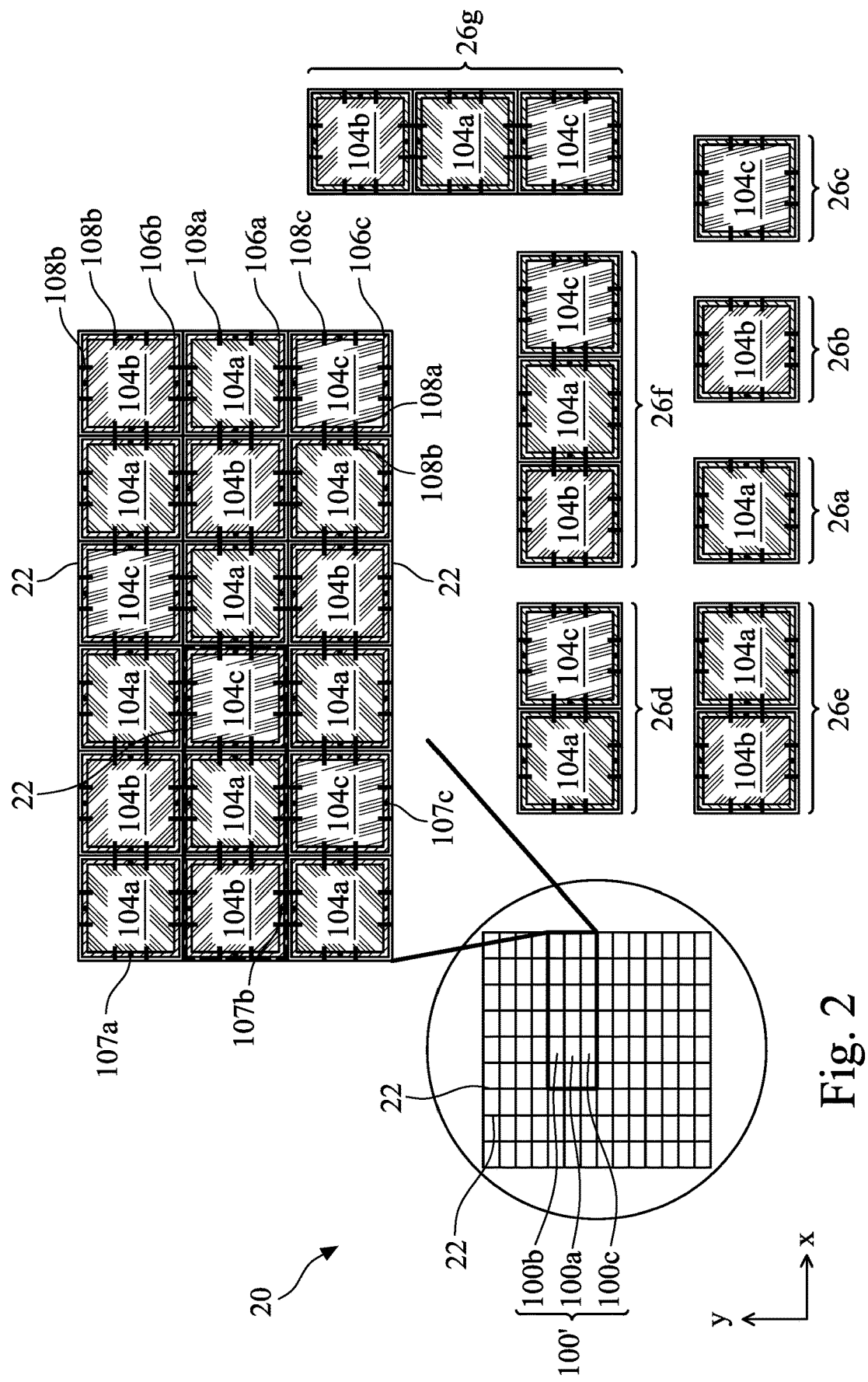
FIG. 2 is a schematic plan view of a substrate including an array of integrated circuit dies according to the present disclosure.

FIG. 2 is schematic plan views of a substrate 20 having an array of integrated circuit dies 100' formed thereon. The array of integrated circuit dies 100' are separated from each other by two sets of intersecting scribe lines 22. The plurality of integrated circuit dies 100 fabricated in and/or on the substrate 20 include three types of integrated circuit dies 100a, 100b, 100c. Similar to the integrated circuit die 100a, 100b, the integrated circuit die 100c includes edge interconnect features 108c extending through seal region 106c to the scribe lines 22 and vertical interconnect features 107c extending to a top or bottom surface of the integrated circuit die 100c.

The integrated circuit dies 100a, 100b, 100c may have substantially the same dimension but with different circuit designs to achieve different functions. In some embodiments, the integrated circuit dies 100a, 100b, 100c may be different types of dies to be connected in various combinations.

In the example of FIG. 2, the integrated circuit die 100a may be designed to connect with both the integrated circuit die 100b and integrated circuit die 100c. The integrated circuit dies 100a, 100b, 100c are arranged in a pattern so that each of the integrated circuit die 100b is bordered by at least one integrated circuit die 100a, and each of the integrated circuit die 100c is bordered by at least one integrated circuit die 100a. Neighboring integrated circuit dies 100a, 100b are connected through the edge interconnect features 108a, 108b. Neighboring integrated circuit dies 100a, 100c are connected through the edge interconnect features 108a, 108c.

In some embodiments, the edge interconnect features 108 (108a, 108b, 108c) may be symmetrically arranged across all scribe lines 22 around the integrated circuit die 100 (100a, 100b, 100c) and share the same protocol so that the integrated circuit dies 100a, 100b, 100c can directly connect with one other through the edge interconnect features 108a, 108b, 108c.

In some embodiments, a first portion of the edge interconnected feature 108a in the integrated circuit die 100a are designated to connect to the edge interconnect features 108b in the integrated circuit die 100b, and a second portion of the edge interconnected feature 108a in the integrated circuit die 100a are designated to connect to the edge interconnect features 108c in the integrated circuit die 100c. The first portion and second portion the edge interconnected features 108a may be mutual exclusive or include shared members depending on the circuit design.

Individual integrated circuit dies 100a, 100b, 100c may be tested before cutting. The integrated circuit dies 100a, 100b, 100c may be cut into various die combinations, such as die combinations 26a, 26b, 26c, 26d, 26e, 26f, 26g for packaging, thus lowering cost of production. For the die combinations 26a, 26b, 26c which include single integrated circuit dies 100a, 100b, 100c conductive features may be formed from the exposed edge interconnect features 108 to connect with other integrated circuit dies without going through an interposer. The die combinations 16d, 16e, which includes the two integrated circuit dies 100a/100c or 100a/100b, may be directly packaged as connected components. The die combinations 26f, 26g, which includes the three integrated circuit dies 100a, 100b, 100c of in different arrangement may be directly packaged as connected components.

Figure 3:
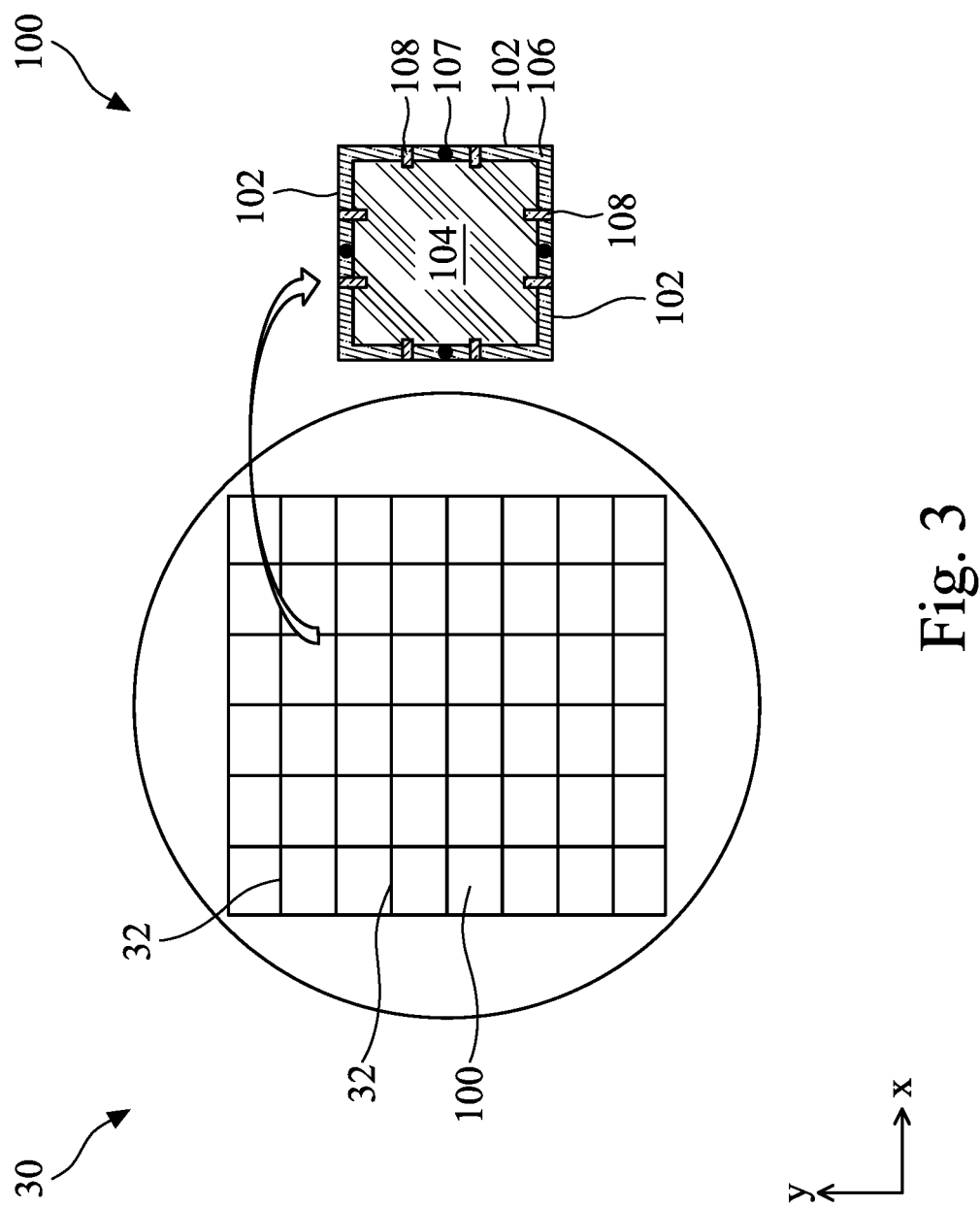
FIG. 3 is a schematic plan view of a substrate including an array of integrated circuit dies according to the present disclosure.

FIG. 3 is schematic plan views of a substrate 30 having an array of integrated circuit dies 100 formed thereon. The array of integrated circuit dies 100 are separated from each other by two sets of intersecting scribe lines 32. The plurality of integrated circuit dies 100 fabricated in and/or on the substrate 30 are identical with one another. The integrated circuit die 100 includes edge interconnect features 108 extending through seal region 106 to the scribe lines 32 and vertical interconnect features 107 extending to a top or bottom surface of the integrated circuit die 100. Individual integrated circuit dies 100 may be tested, cut and then stacked with one or more other integrated circuit dies to form a semiconductor package, such as a 3D integrated circuit (3DIC).

In some embodiments, the edge interconnect features 108 may be omitted in the integrated circuit die 100. The vertical interconnect features 107 may be designed to provide inter-chip connections.

Figure 4A:
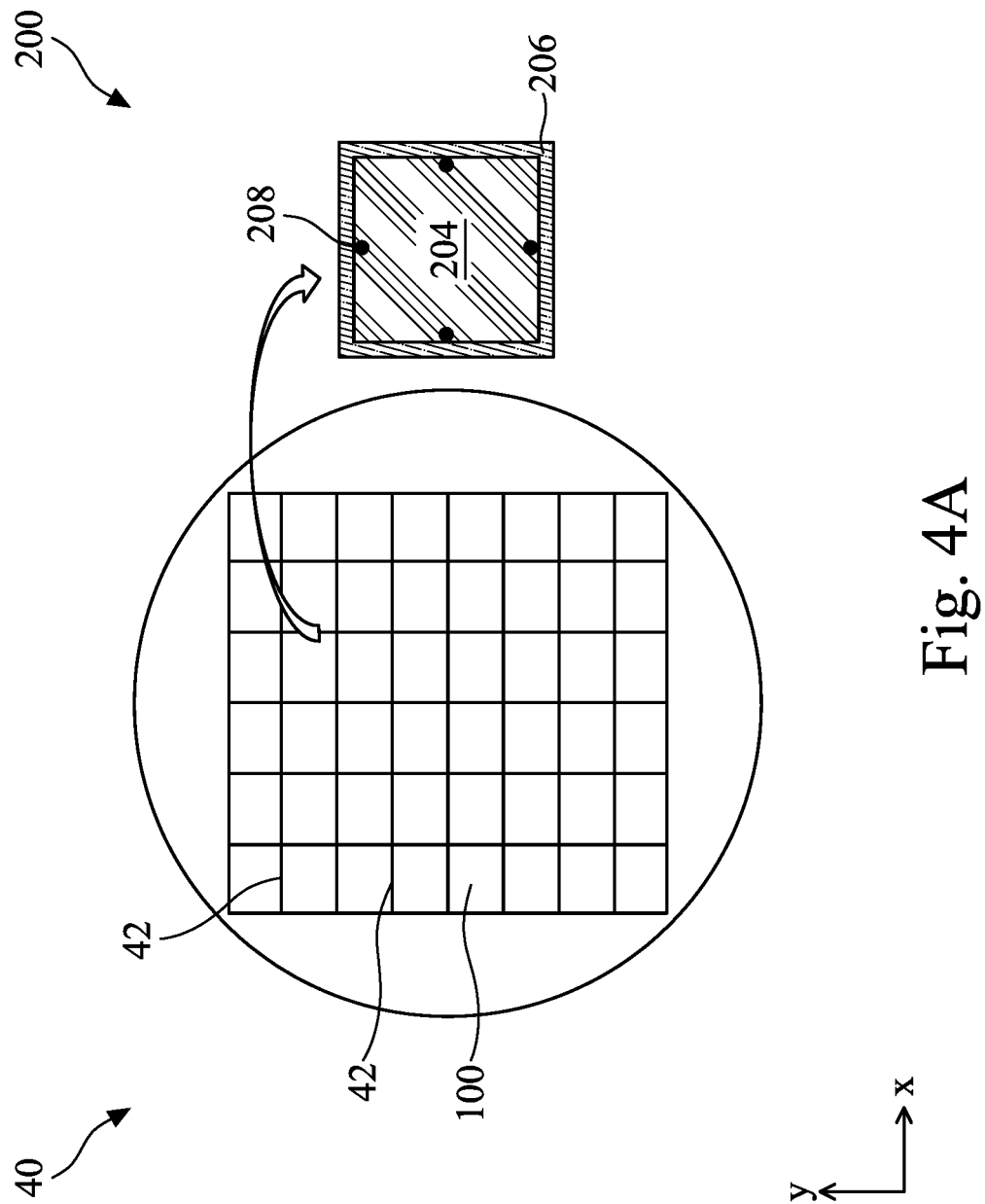
FIG. 4A is a schematic plan view of a substrate including an array of integrated circuit dies according to the present disclosure.

FIG. 4A a schematic plan view of a substrate 40 including an array of integrated circuit dies 200 having vertical conductive features 208 according to the present disclosure. As shown in FIG. 4A, an array of integrated circuit dies (or chiplets) 200 are formed on the substrate 40. The array of integrated circuit dies 200 are separated from each other by two sets of intersecting scribe lines 42. One set of scribe lines 42 extend along the x-direction and a second set of scribe lines 42 extend along the y-direction. The array of integrated circuit dies 200 are formed in and/or on the substrate 40 within an array of areas defined by the scribe lines 42. After fabrication, the integrated circuit dies 200, may be tested and cut out along the scribe lines 42 to individual integrated circuit dies 200 or various combination of neighboring integrated circuit dies 200 for subsequent processing, such as packaging.

As shown in FIG. 4A, each of the integrated circuit die 200 may include a circuit region 204 surrounded by a seal region 206. In some embodiments, the vertical conductive features 208 may be formed within the circuit region 204 of the integrated circuit die 200. The vertical conductive features 208 are configured to connect with other integrated circuit dies vertically stacked with the integrated circuit die 200.

The integrated circuit dies 200 may be designed to perform any suitable function. In some embodiments, the integrated circuit die 200 a memory die, such as a static random-access memory (SRAM) die, a dynamic random-access memory (DRAM) die, a high bandwidth memory (HBM) die, or the like.

Figure 4B:
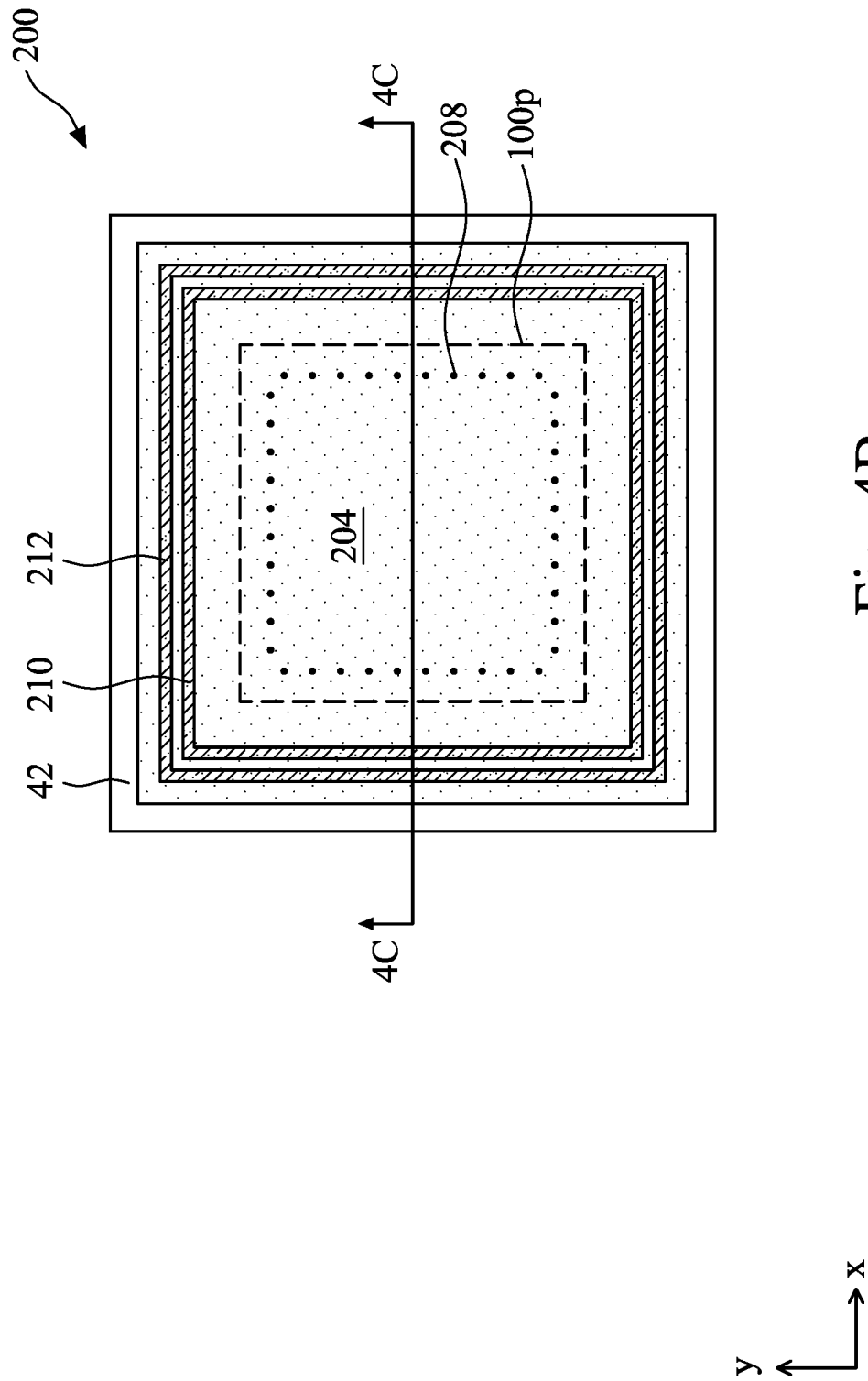
FIG. 4B-4G schematically demonstrate an integrated circuit die having through substrate via interconnect features according to the present disclosure.
Figure 4C:
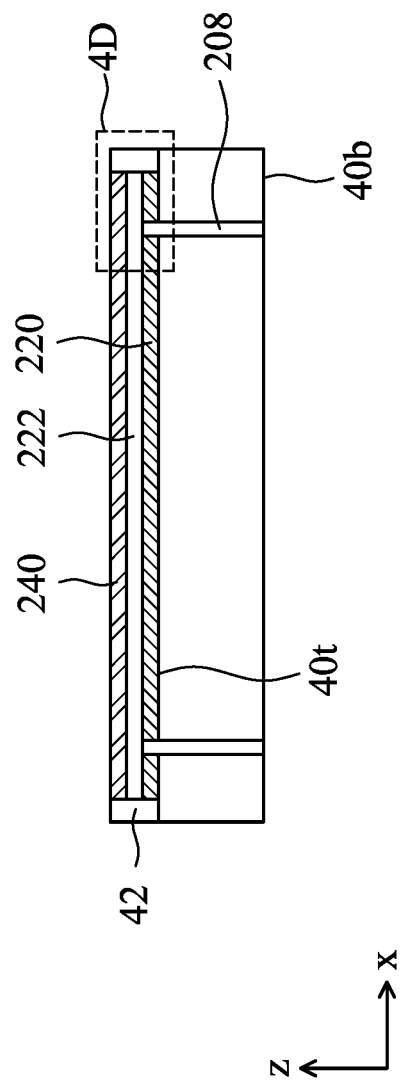
Figure 4D:
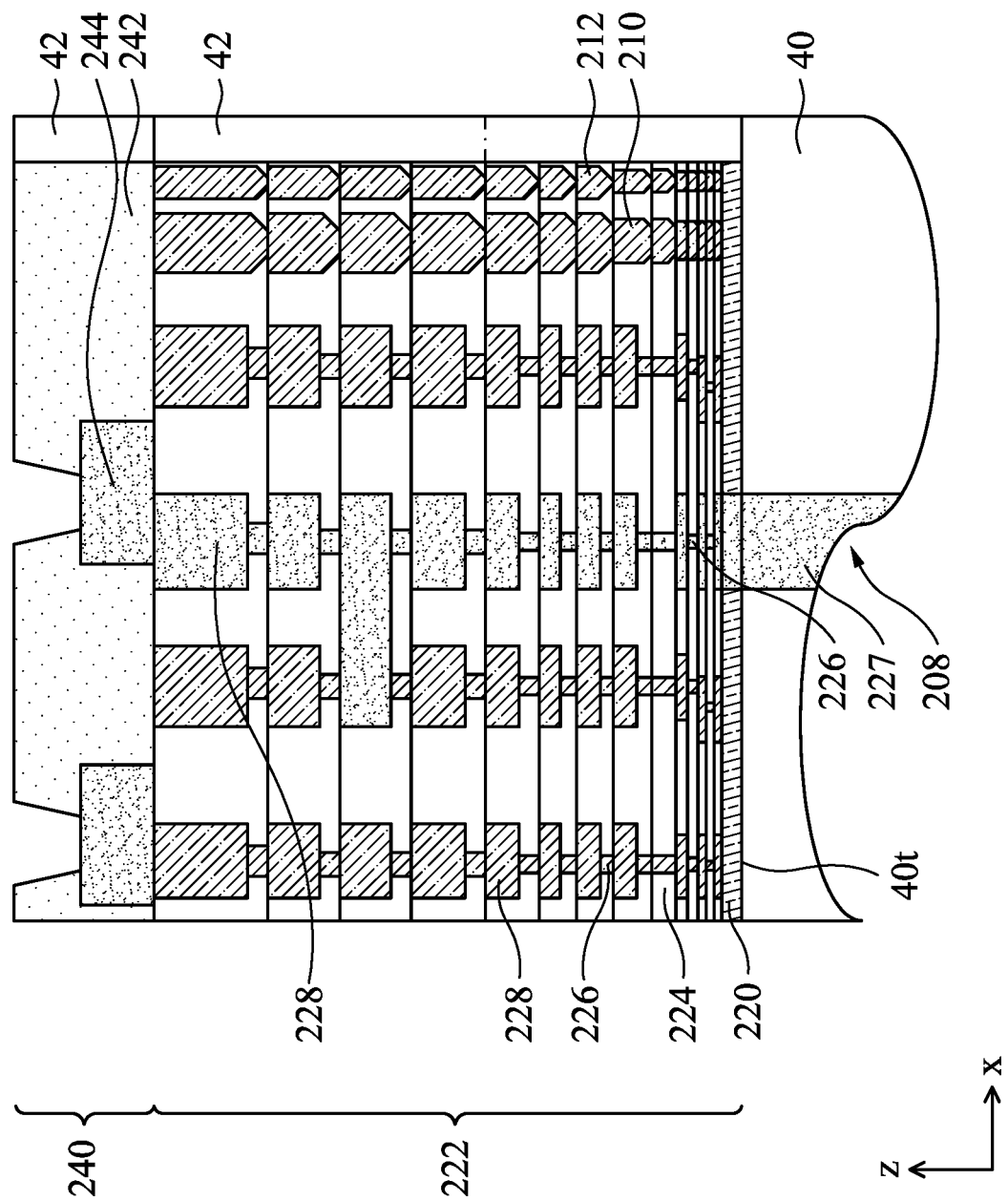
Figure 4E:
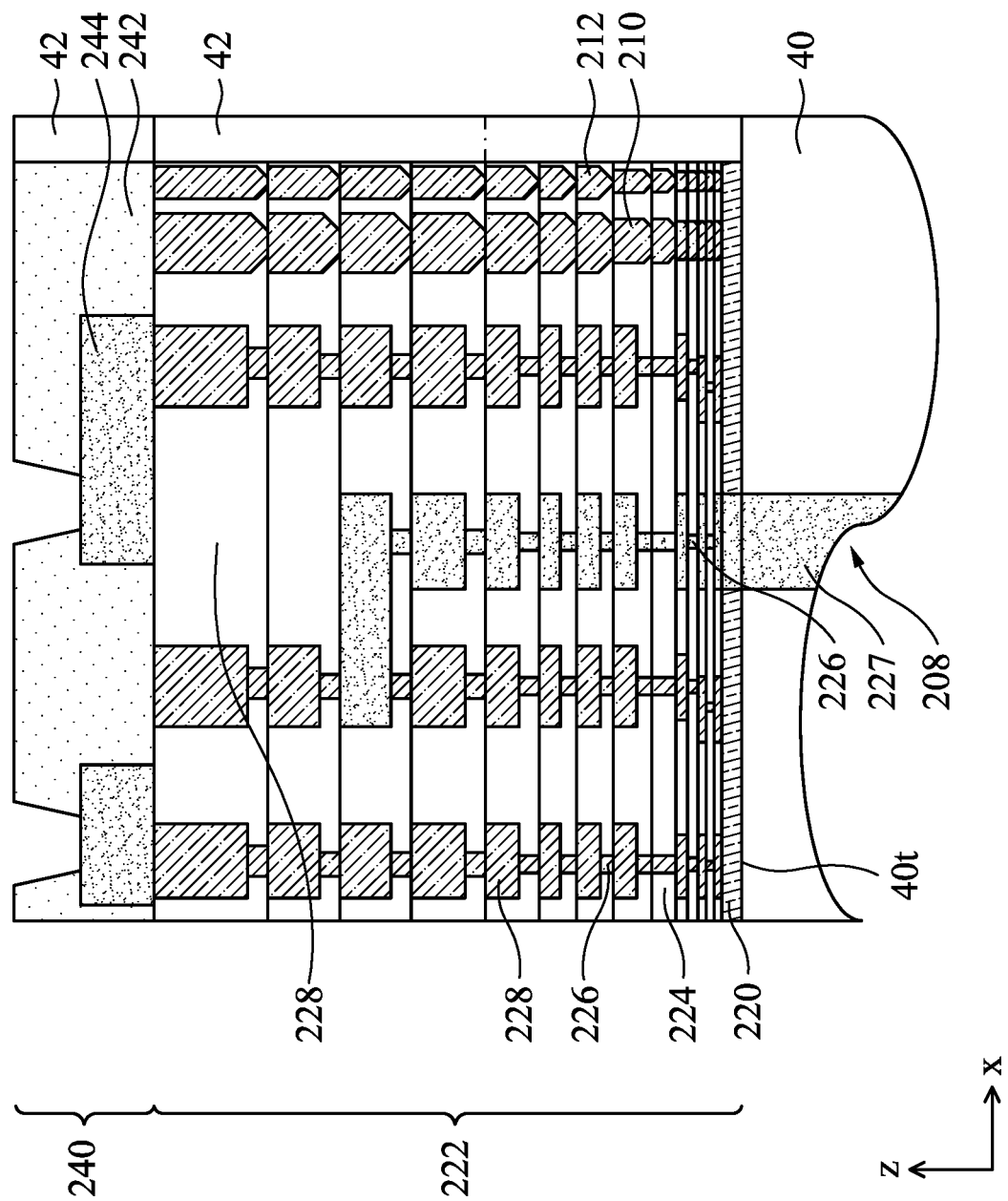

FIG. 4B-4D schematically demonstrate the integrated circuit die 200 having vertical conductive features 208 according to embodiments of the present disclosure. FIG. 4B is a schematic plan view of the integrated circuit die 200. FIG. 4C is a schematic sectional view of the integrated circuit die 200 along the line 4C-4C in FIG. 4B. FIG. 4D is an enlarged partial sectional view of the integrated circuit die 200 in a rectangular area 4D marked in FIG. 4C. FIG. 4E is an enlarged partial sectional view of the integrated circuit die 200 along the rectangular area 4D marked in FIG. 4C according to another embodiment.

In FIG. 4B, components formed in various layers along the z-axis are superimposed on one another to show their relative positions in a plan view. Positions of the components along the z-axis are shown corresponding cross-sectional views, such as the views in FIGS. 4C and 4D.

FIG. 4B illustrates relative positions of the circuit region 204, the seal region 206, and the vertical conductive features 208, and within the integrated circuit dies 200 according to some embodiments. As shown in FIG. 4B, each integrated circuit die 200 is defined in a square area by the scribe lines 42. In some embodiments, the integrated circuit die 200 may have a plan view area in a range between about 10 mm$^2$ and about 1000 mm$^2$ depending on the circuit design and/or function of the integrated circuit die 200.

Within the die area of each integrated circuit die 200, the circuit region 204 is surrounded by the seal region 206 around an outer perimeter of the circuit region 204. One or more sealing rings 210, 212 are concentrically formed in the seal region 206. The seal rings 210, 212 provide protection to circuit structures in the circuit region 204 against undesired elements from the exterior environment, such as water vapor, during and after separation of the integrated circuit dies 200.

In some embodiments, the vertical conductive features 208 may be formed within the circuit region 204. In some embodiments, the vertical conductive features 208 may be arranged within a region 100p corresponding to a die area of an integrated circuit die, such as the integrated circuit dies 100, to be stacked on the integrated circuit die 200. In some embodiments, the vertical conductive features 208 may be arranged within the region 100p in the same pattern as the vertical interconnect features 107 in the integrated circuit die 100 to facilitate direct connection between the vertical conductive features 208 and the vertical interconnect features 107.

As shown in FIG. 4C, the integrated circuit dies 200 may be formed in and/or on the substrate 40 by performing various semiconductor fabrication processes, including, but not limited to, front-end-of-line (FEOL) processing, and back-end-of-line (BEOL) processing. The various semiconductor fabrication processes are performed to form a device layer 220 on a top side 40t of the substrate 40, and an interconnect structure 222 formed over the device layer 220. In some embodiments, a redistribution layer 240 may be formed over the interconnect structure 222. In some embodiments, the vertical conductive features 208 may be formed through the substrate 40 and exposed on a backside 40b of the substrate 40. The vertical conductive features 208 may be connect with the device layer 220 and/or the interconnect structure 222.

The vertical conductive features 208 may be fabricated by forming vias in the substrate 40 and filling one or more conductive materials, such as Cu, Al, Co, Ru, Mo, W, or an alloy thereof. In some embodiments, a liner layer may be formed in the vias before filing the conductive material. The liner layer may be an electrically insulating material such as silicon oxide (SiO), silicon nitride (SiN), silicon carbide (SiC), silicon oxynitride (SiON), or the like.

FIG. 4D schematically illustrates the vertical conductive feature according to one embodiment of the present disclosure. As shown in FIG. 4D, the device layer 220 is formed in and/or on the substrate 40 on the top side 40t, and the interconnect structure 222 are formed over the device layer 220. The device layer 220 may include various semiconductor devices, such as transistors, diodes, capacitors, resistors, etc., and may be formed in and/or on the substrate 40. The interconnection structure 222 includes various conductive features, such as a first plurality of conductive features 226 and second plurality of conductive features 228, and one or more IMD layers 224 to separate and isolate various neighboring conductive features 226, 228. The redistribution layer 240 may include one or more contact pads 244 formed in one or more passivation layers 242.

In some embodiments, the vertical conductive features 208 may be connected to the contact pads 244 to facilitating external connection. In some embodiments, as shown in FIG. 4D, the vertical conductive features 208 may function as a conductor formed in a through substrate via (TSV). Each vertical conductive feature 208 may include one or more conductive components electrically connected. In the embodiment of FIG. 4D, each of the vertical conductive feature 208 may include a conductive via 227 formed through the substrate 40 and the device layer 220, the conductive features 226, 228 in the interconnect structure 222, and the contact pads 244 in the redistribution layer 240. In other embodiments, the vertical conductive feature 208 may be a unitary conductive feature (not shown) formed in a via all layers of the integrated circuit die 200.

In other embodiments, the vertical conductive features 208 may include the conductive via 227 formed through the substrate 40 and the device layer 220, which is connected to the devices in the device layer 220, for example, through the conductive features 226, 228 in the interconnect structure 222, as shown FIG. 4E.

In some embodiments, a portion of the vertical conductive features 208 may be used to provide through substrate connection, as shown in the vertical conductive feature 208 in FIG. 4D, and another portion of the vertical conductive features 208 may be used to establish connection with the devices in the integrated circuit die 200, as shown in the vertical conductive features 208 in FIG. 4E.

Figure 4F:
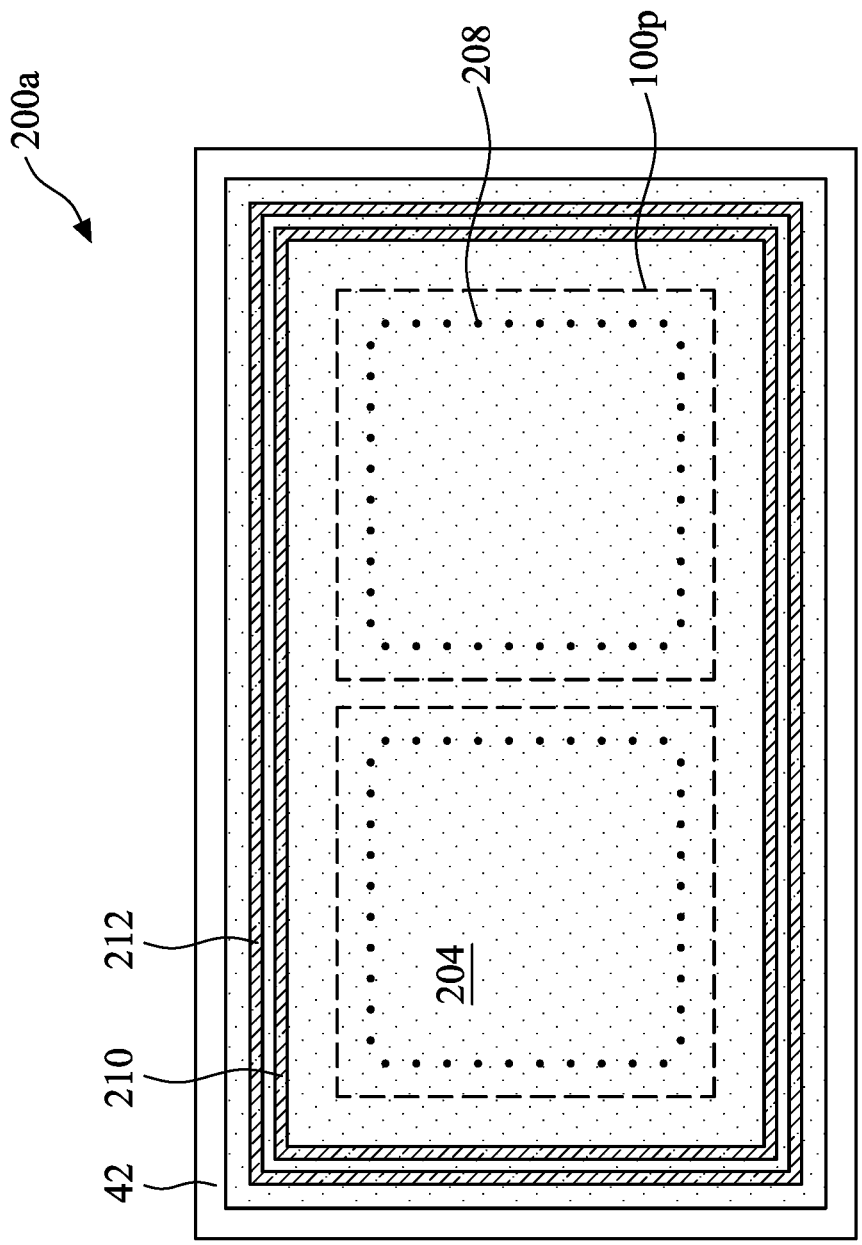
Figure 4G:
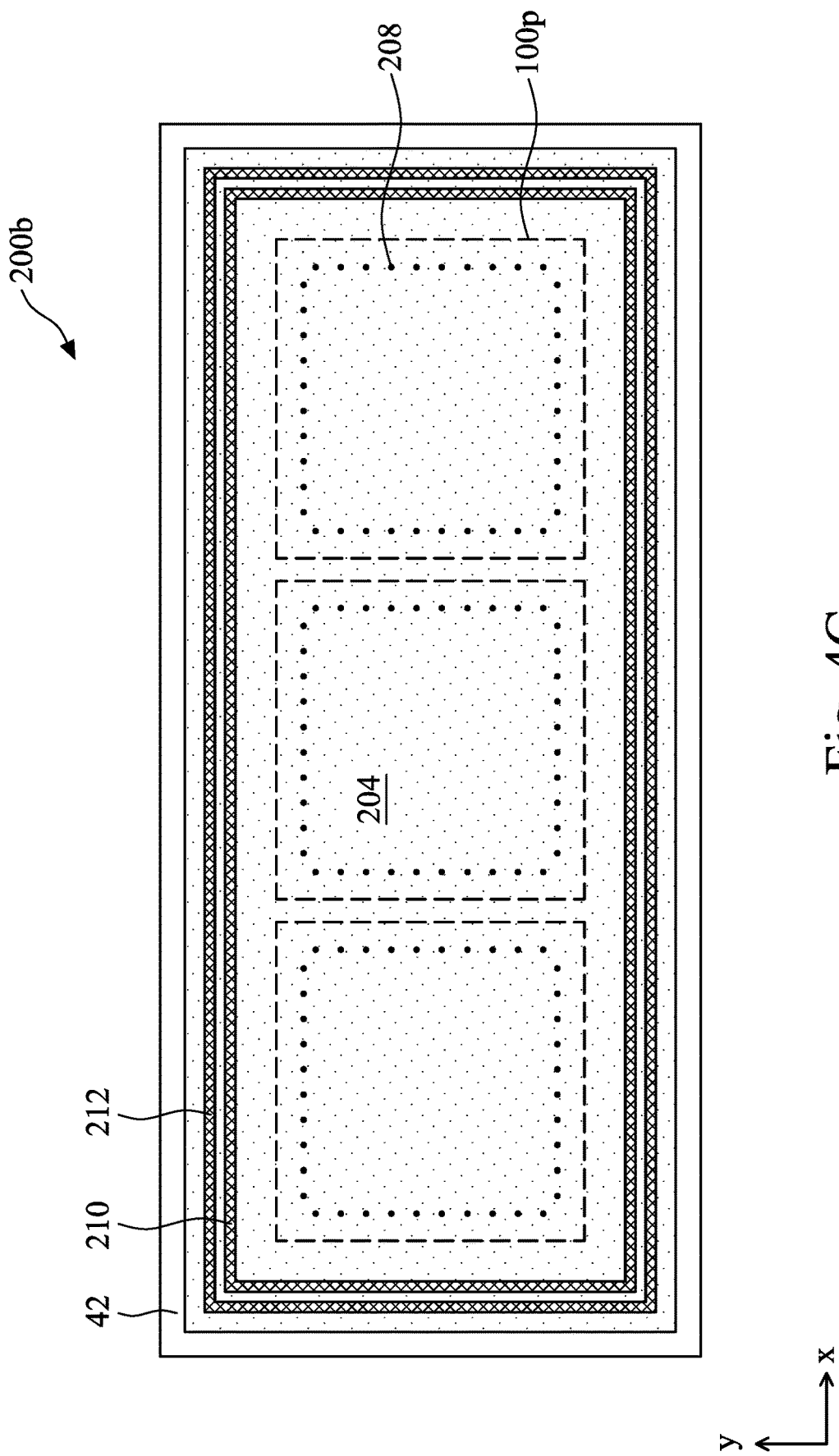

Integrated circuit dies according to present disclosure may be designed to stack over two or more integrated circuit dies. FIG. 4F is a schematic plan view of an integrated circuit die 200a. The vertical conductive features 208 in the integrated circuit die 200a are arranged to stack over two integrated circuit dies. FIG. 4G is a schematic plan view of an integrated circuit die 200b. The vertical conductive features 208 in the integrated circuit die 200b are arranged to stack over two integrated circuit dies.

Figure 5A:
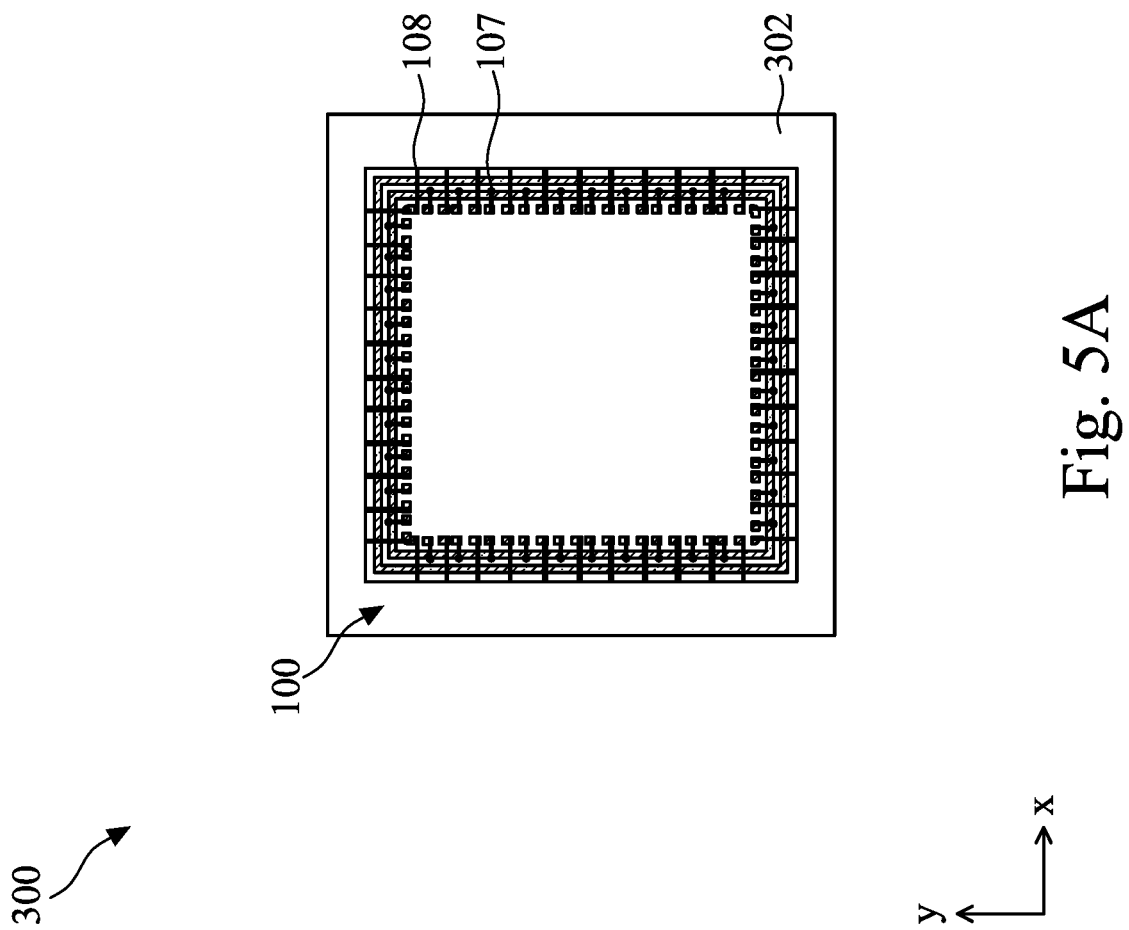
FIGS. 5A-5F schematically demonstrate various stages of forming a semiconductor package according to embodiments of the present disclosure.
Figure 5B:
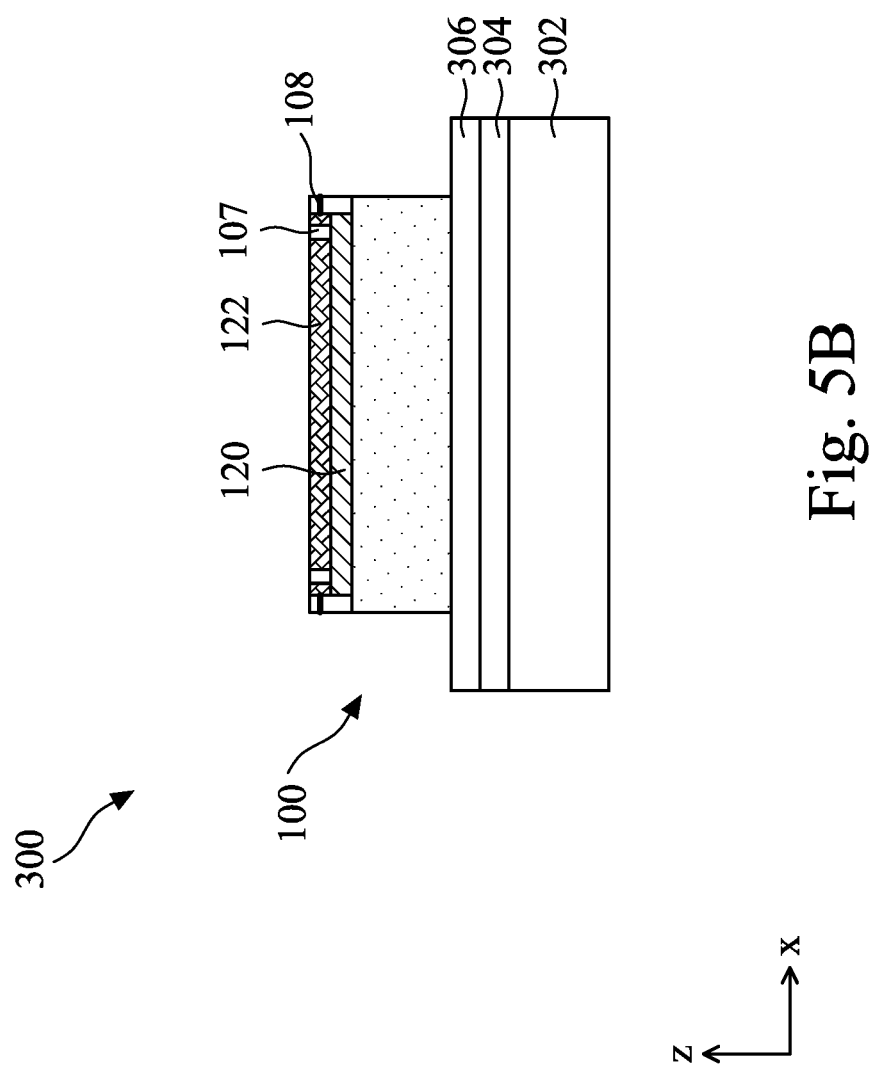

FIGS. 5A-5F schematically demonstrate various stages of forming a semiconductor package 300 including two vertically stacked integrated circuit dies according to the present disclosure. FIG. 5A is a schematic plan view of the semiconductor package 300. FIG. 5B is a schematic cross-sectional view of the semiconductor package 300. In FIG. 5A, an integrated circuit die with vertical interconnect features, such as the integrated circuit die 100 described above, is attached to a carrier substrate 302. The integrated circuit die 100 may be a system on a chip (SOC) or a system on integrated circuit (SOIC) die. The integrated circuit die 100 may be fabricated in an array of integrated circuit dies as shown in FIG. 1, 2, or 3, and then cut out as an individual die.

In some embodiments, an adhesive layer 304 is formed on the carrier substrate 302, and a die attach film 306 is formed on the adhesive layer 304. The die combination 26f is attached on the die attach film 306. The carrier substrate 302 may be a glass carrier substrate, a ceramic carrier substrate, or the like. In some embodiments, multiple semiconductor packages can be formed on the carrier substrate 302 simultaneously.

The adhesive layer 304 is placed on the carrier substrate 302 to assist in the adherence of overlying structures, for example the integrated circuit die 100. In some embodiments, the adhesive layer 304 may comprise a light to heat conversion (LTHC) material or an ultra-violet glue, although other types of adhesives, such as pressure sensitive adhesives, radiation curable adhesives, epoxies, combinations of these, or the like, may also be used. The adhesive layer 304 may be placed onto the carrier substrate 302 in a semi-liquid or gel form, which is readily deformable under pressure. In other embodiments, the adhesive layer 304 may be an ultra-violet (UV) glue, which loses its adhesive property when exposed to UV lights.

The die attach film 306 may be placed on the adhesive layer 304 to assist in the attachment of the integrated circuit die 100 to the adhesive layer 304. In some embodiments, the first die attach film 306 may be an epoxy resin, a phenol resin, acrylic rubber, silica filler, or a combination thereof, and is applied using a lamination technique. The die attach film 306 may be dispensed as a liquid and cured, may be a laminate film laminated onto the carrier substrate 302, or may be the like. In some embodiments, the top surface of the die attach film 306 may be leveled and may have a high degree of coplanarity. However, any other suitable alternative material and method of formation may alternatively be utilized.

Figure 5C:
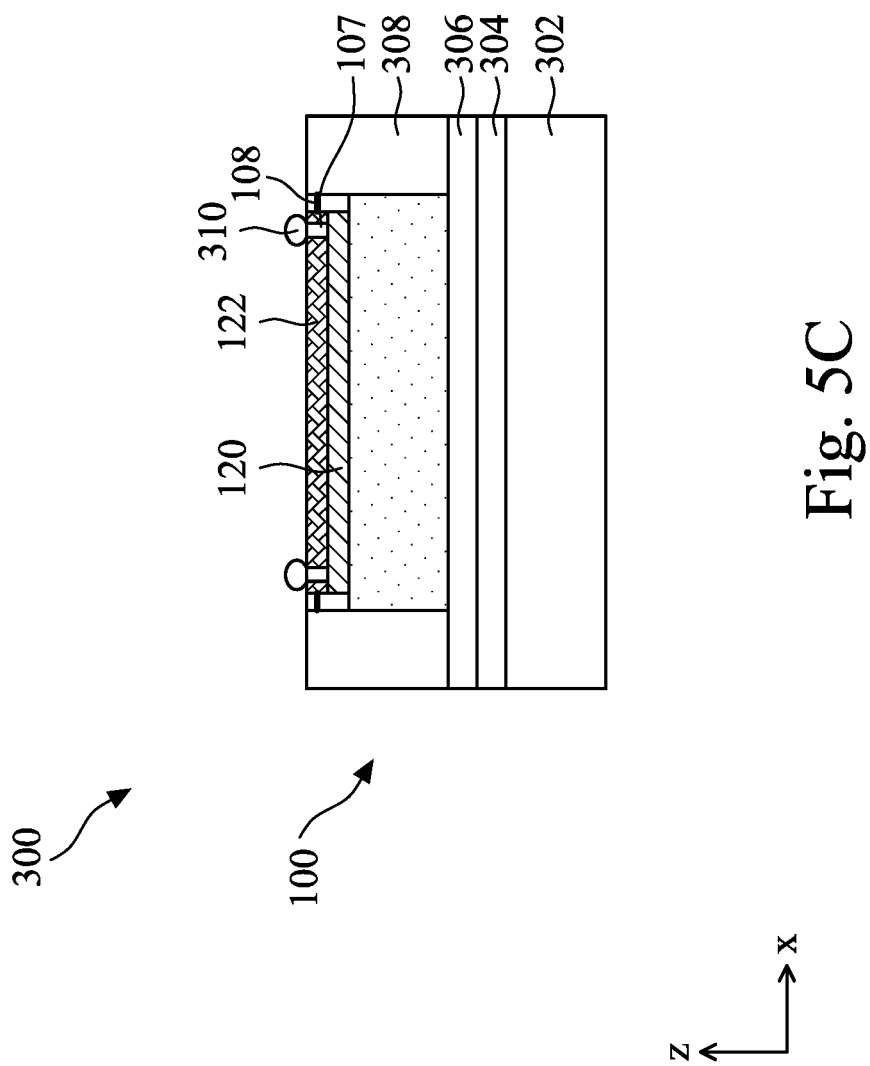

After the integrated circuit die 100 is attached to the carrier substrate 302, an encapsulant layer 308 is formed over various components, including the integrated circuit die 100, on the carrier substrate 302, as shown in FIG. 5C.

The encapsulant layer 308 may be a molding compound, epoxy, or the like, and may be applied by compression molding, lamination, transfer molding, or the like. The encapsulant layer 308 may be formed over the carrier substrate 302 such that cutting surfaces of the integrated circuit die 100 are buried or covered. The encapsulant layer 308 may then be cured.

In some embodiments, the encapsulant layer 308 may undergo a grinding process to expose conductive features on the integrated circuit die 100 so that external contacts 310 may be formed from the vertical interconnect features 107. The external contacts 310 may be formed on the integrated circuit die 100, for example, by a bumping process. The external contacts 310 may be, e.g., conductive pillars such as a copper pillars or copper posts. In some embodiments, the external contacts 310 may be solder bumps, copper bumps, or other suitable external contacts that may be made to provide electrical connection from the integrated circuit die 100 to other external devices.

Figure 5D:
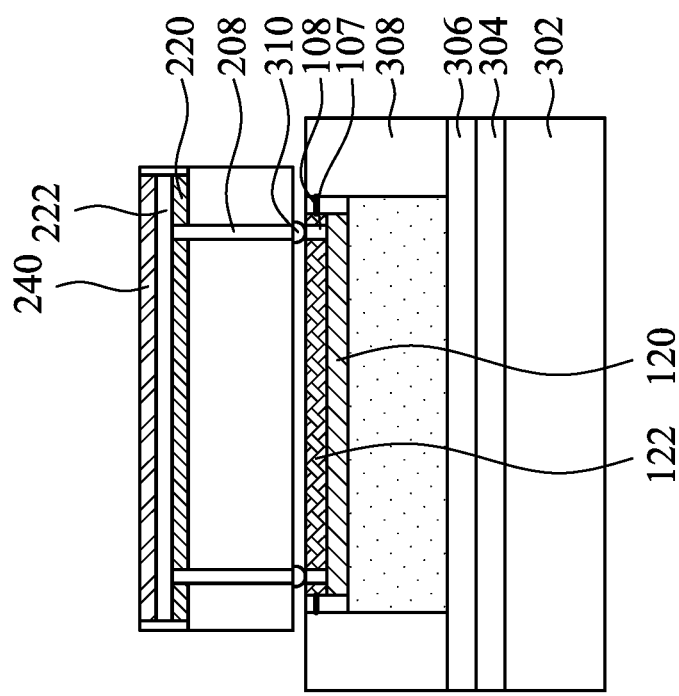

After formation of the external contacts 310, a second integrated circuit die is stacked over the integrated circuit die 100, as shown in FIG. 5D. In some embodiments, the second integrated circuit die is a memory die, such as the integrated circuit die 200 described above. The integrated circuit die 200 includes vertical conductive features 208 arranged in a pattern matching the vertical interconnect features 107 of the integrated circuit die 100.

As shown in FIG. 5D, the integrated circuit die 200 is attached to the external contacts 310. The vertically stacked integrated circuit dies 100, 200 are connected to each other through the vertical interconnect features 107 and the vertical conductive features 208 without going through an interposer.

Figure 5E:
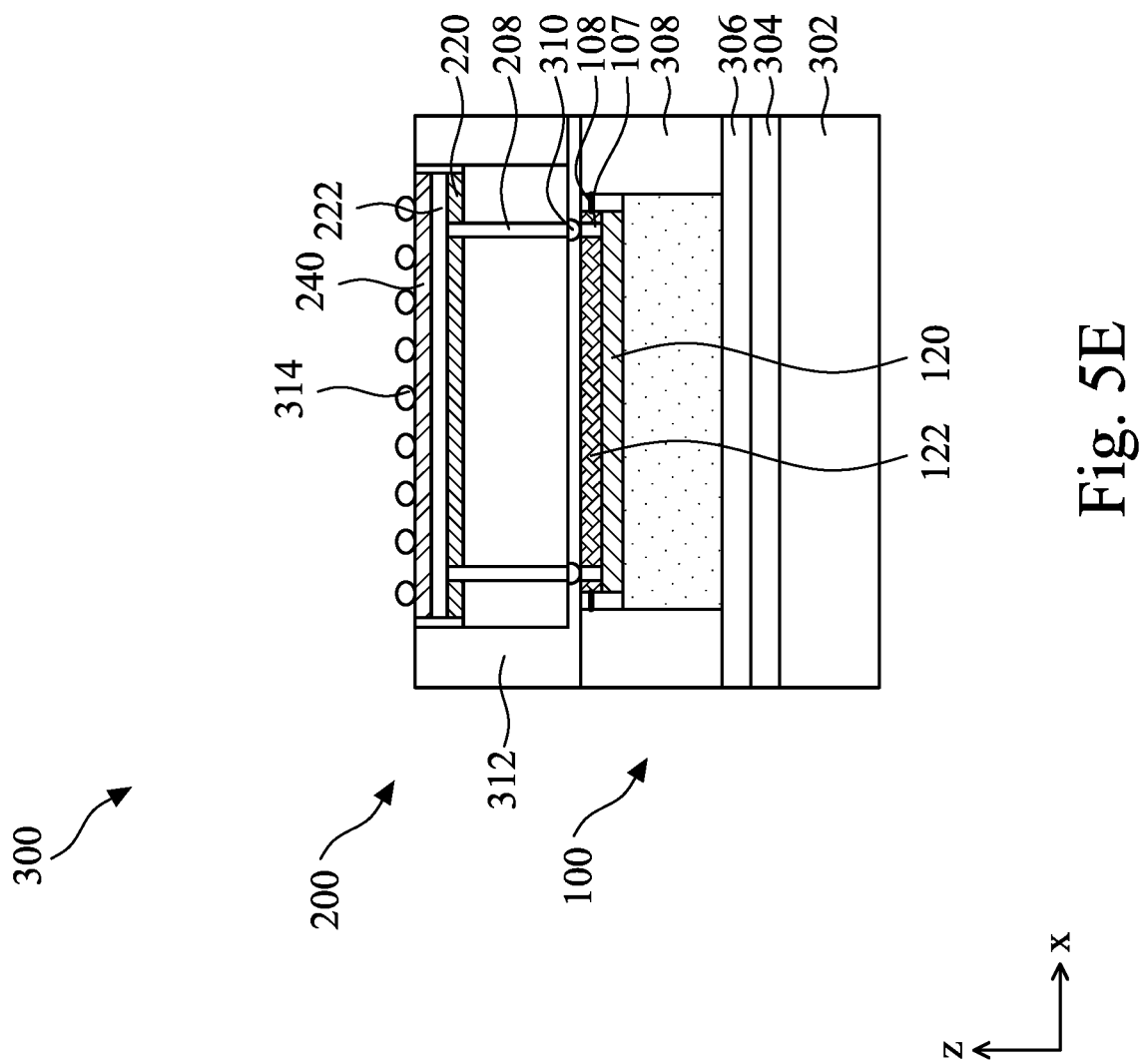

In FIG. 5E, an encapsulant layer 312 may be formed over the stacked integrated circuit dies 100, 200. The encapsulant layer 312 may be a molding compound, epoxy, or the like, and may be applied by compression molding, lamination, transfer molding, or the like. The encapsulant layer 312 may then be cured. In some embodiments, the encapsulant layer 312 and the encapsulant layer 308 may be formed from the same material.

In some embodiments, the encapsulant layer 312 may undergo a grinding process to expose the redistribution layer 240. External connectors 314 are then formed on the redistribution layer 240. The external connectors 314 may be used to connect the semiconductor package 300 to a printed wiring board or printed circuit board (PCB) to form an electronic assembly.

Figure 5F:
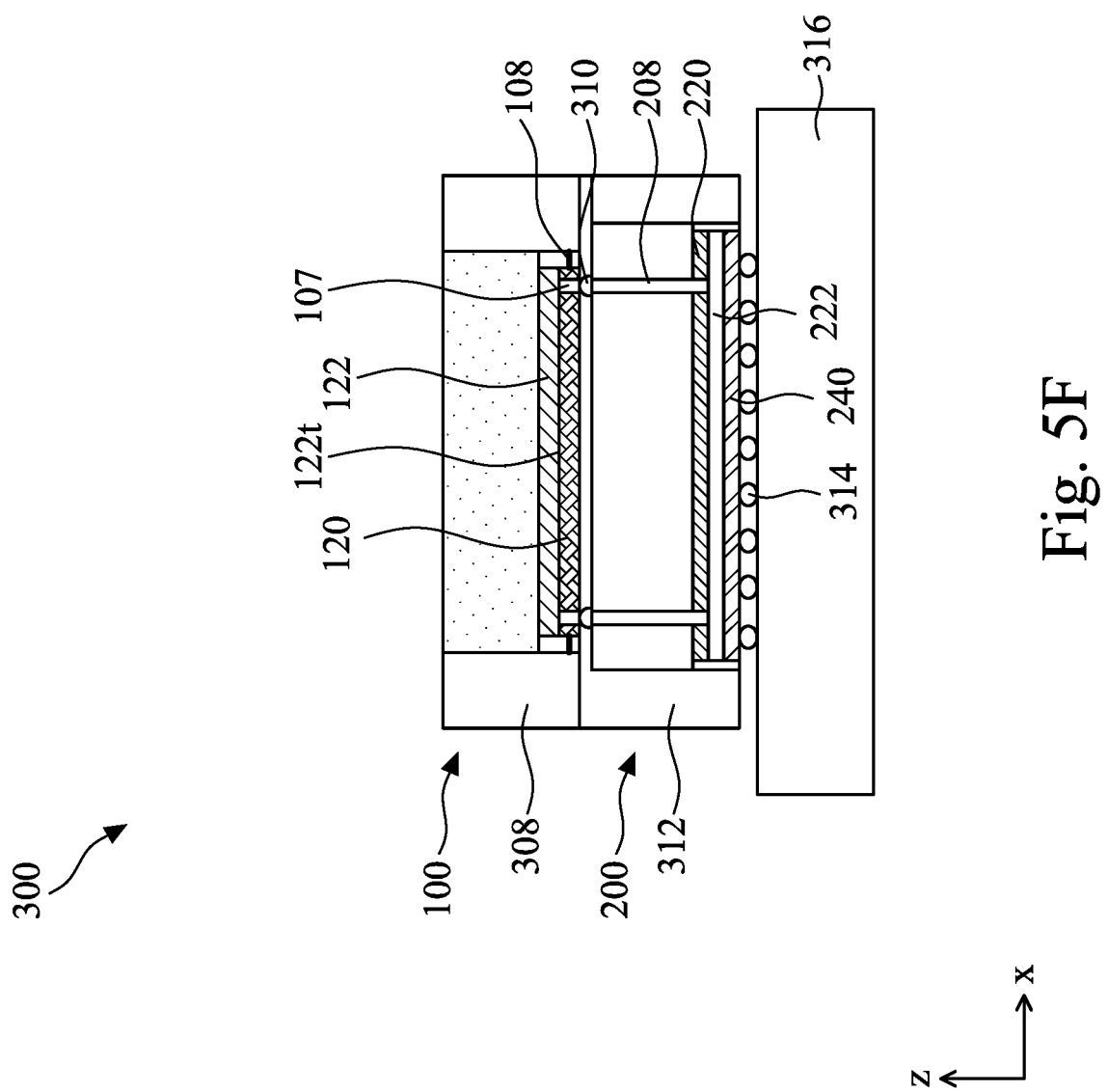

In FIG. 5F, the semiconductor package 300 attached to a PCB 316, with the carrier substrate 302 along with the adhesive layer 304 and the die attach film 306 removed. The PCB 316 may be part of an electronic assembly can be part of an electronic system such as computers, wireless communication devices, computer-related peripherals, entertainment devices, or the like.

In the semiconductor package 300, the integrated circuit die 100 is connected to the integrated circuit die 200 through the vertical interconnect features 107 and the vertical conductive features 208. The vertical interconnect features 107 may be configured to provide power and signal connection to the integrated circuit die 100. As discussed above, a RDL layer is omitted in the integrated circuit die 100. The vertical interconnect features 107 may be arranged at a higher density than the features in a RDL layer formed over the integrated circuit die 100. The integrated circuit die 100 is connected to the PCB 316 through the vertical interconnect features 107, the vertical conductive features 208, and the redistribution layer 240 in the integrated circuit die 200. In some embodiments, the integrated circuit die 100 is a SOC die and the integrated circuit die 200 is a memory die, which has a larger dimension than the integrated circuit die 100, and the arrangement in the semiconductor package 300 allows a smaller SOC die to use a redistribution layer of a larger memory die.

Figure 6A:
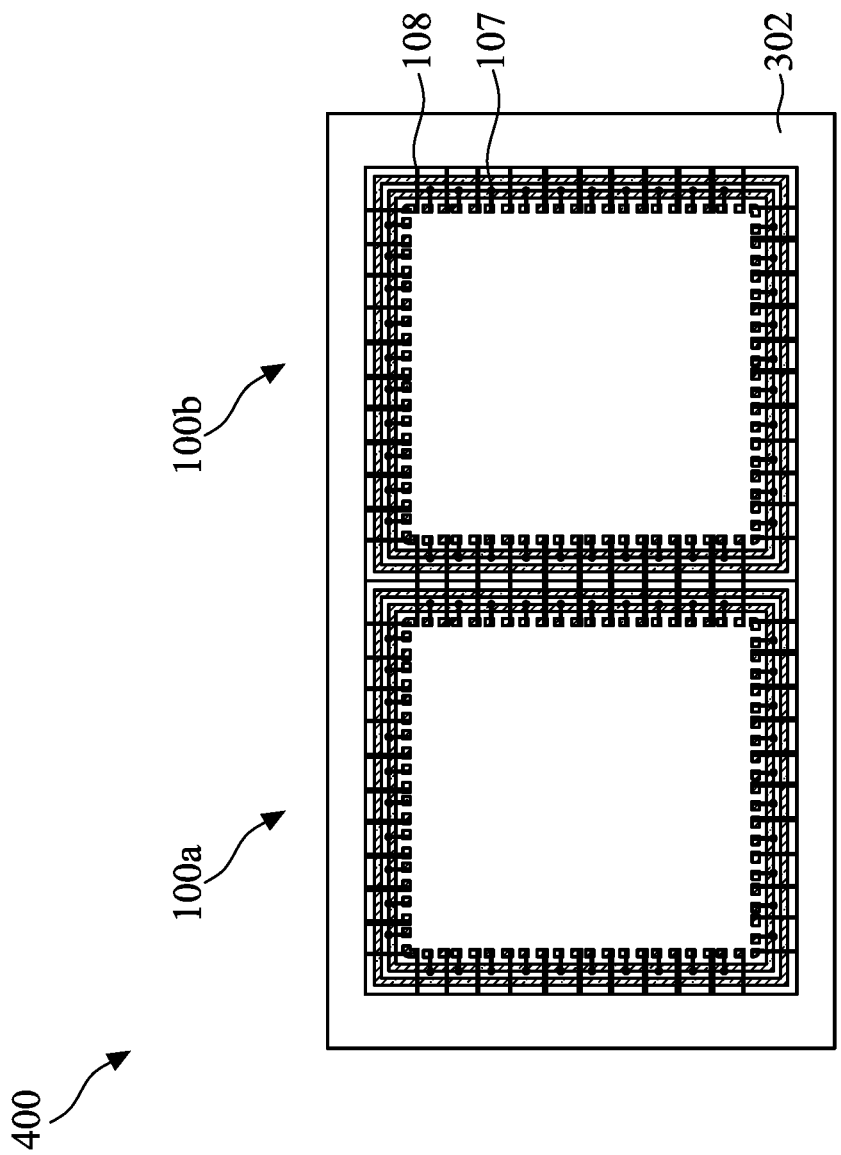
FIGS. 6A-6F schematically demonstrate various stages of forming a semiconductor package according to embodiments of the present disclosure.
Figure 6B:
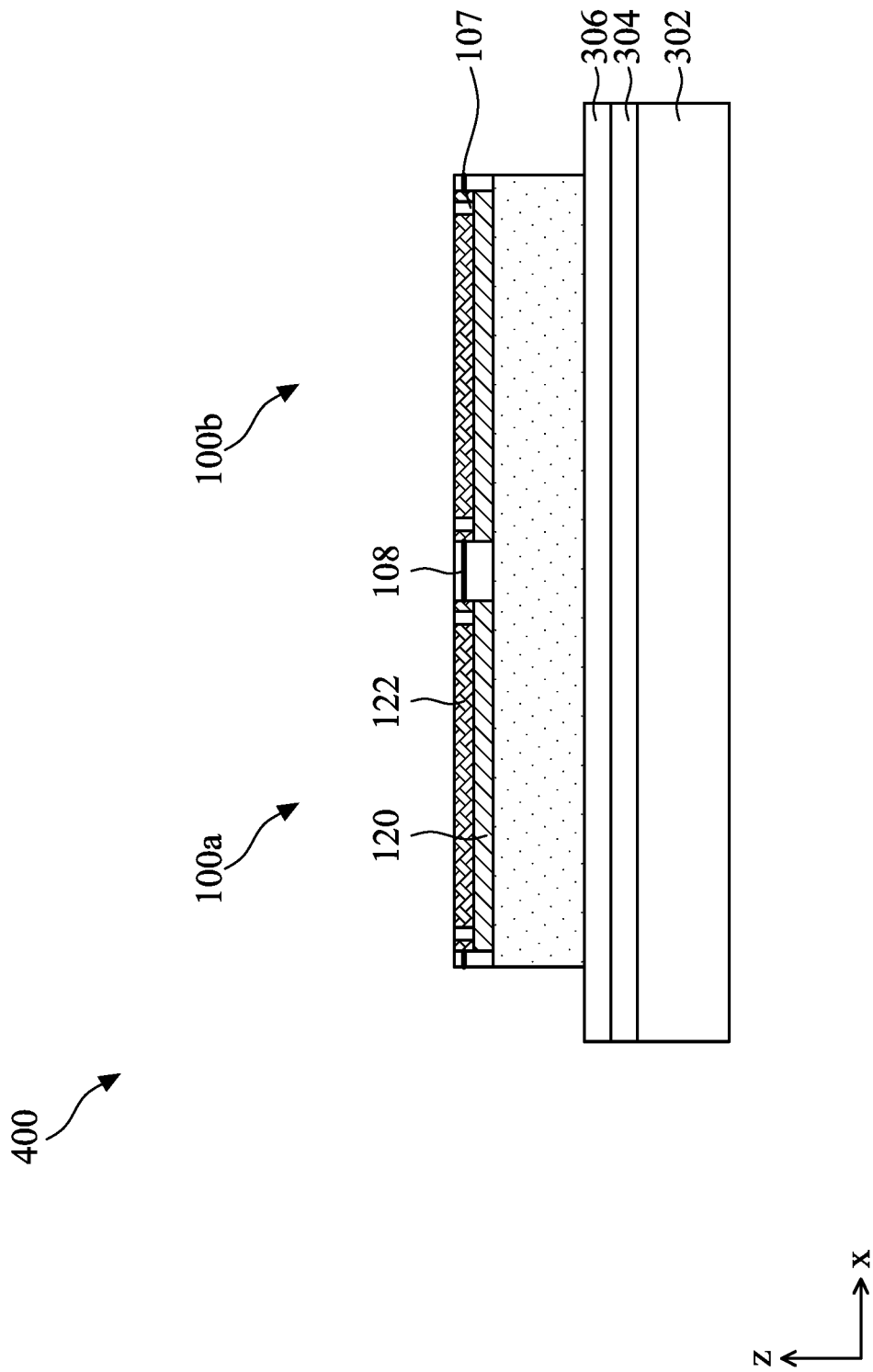

FIGS. 6A-6F schematically demonstrate various stages of forming a semiconductor package 400. The semiconductor package 400 is similar to the semiconductor package 300 except that the semiconductor package 400 includes a memory die stacked over two SOC dies. As shown in FIGS. 6A and 6B, the integrated circuit dies 100a and 100b are attached on the carrier substrate 302. In some embodiments, the integrated circuit dies 100a and 100b may be fabricated on the same substrate, as shown in FIG. 1A or FIG. 2. After fabrication, the integrated circuit dies 100a, 100b may be tested, and then cut off as a die combination, such as the die combination 16c, 16d in FIG. 1A, or the die combination 26e in FIG. 2. The integrated circuit dies 100a, 100b are attached to the carrier substrate 302 as a die combination.

Figure 6C:
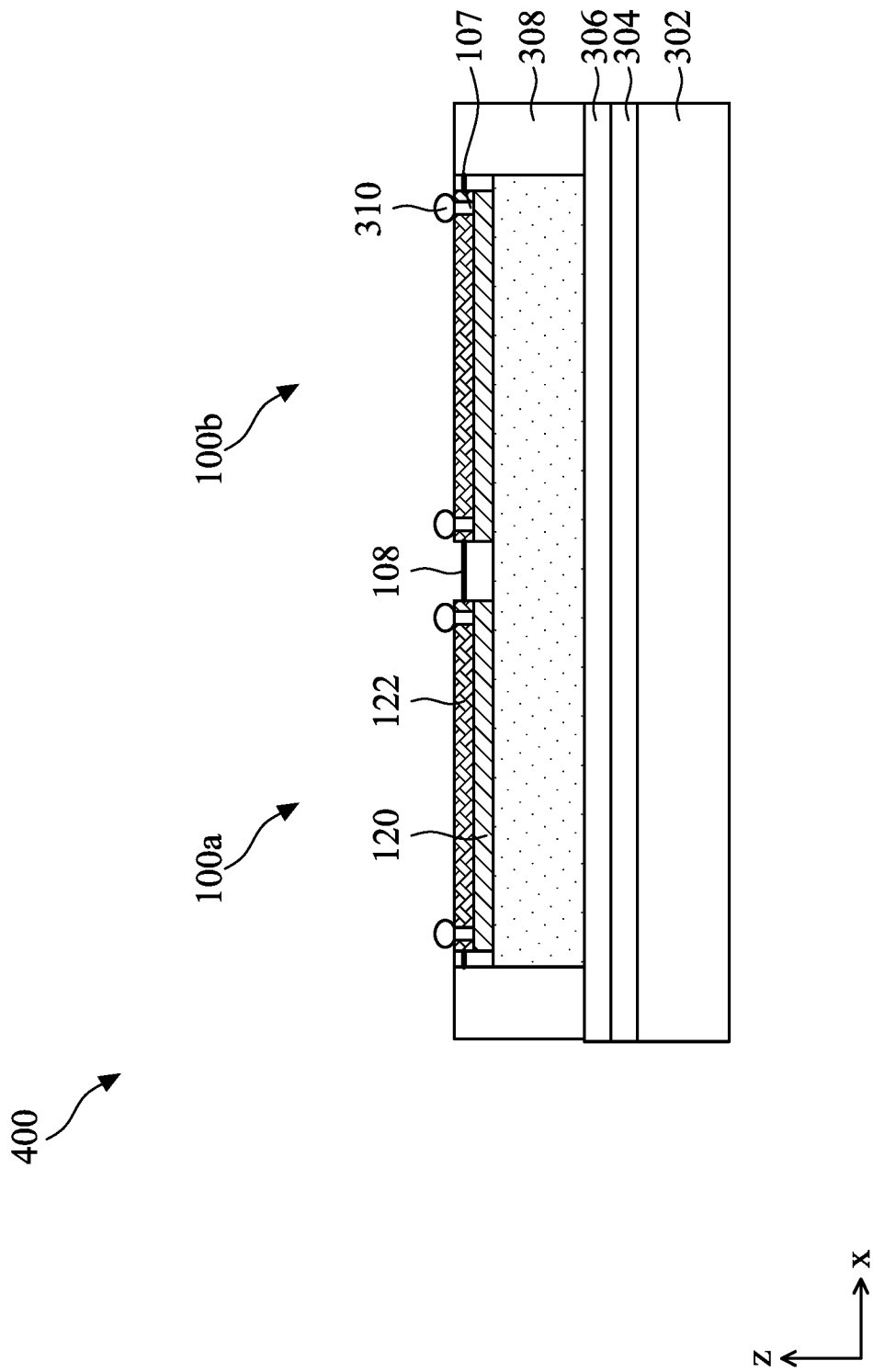

In FIG. 6C, the encapsulant layer 308 is formed, cured, and grinded to expose the top of the integrated circuit dies 100a, 100b, and the external contacts 310 are then formed thereon. A memory die, such as the integrated circuit die 200a, is stacked over the integrated circuit dies 100a, 100b.

Figure 6D:
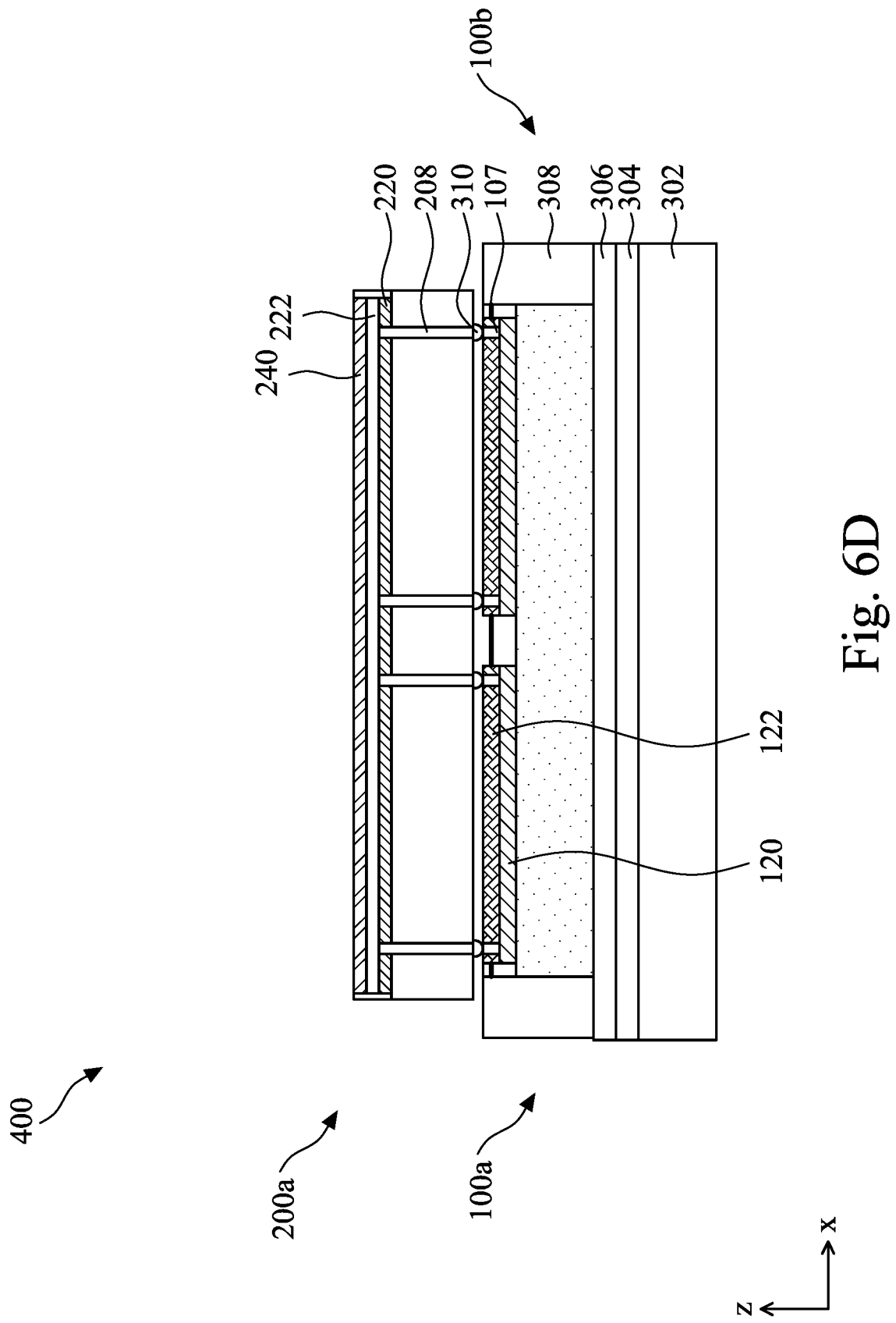

As shown FIG. 6D, the integrated circuit die 200a is attached to the external contacts 310. The integrated circuit dies 100a/100b are connected to vertically stacked integrated circuit die 200b through the vertical interconnect features 107 and the vertical conductive features 208 without going through an interposer. The edge interconnect features 108a, 108b between the integrated circuit dies 100a, 100b provide direct connections between the interconnected circuit dies 100a, 100b.

Figure 6E:
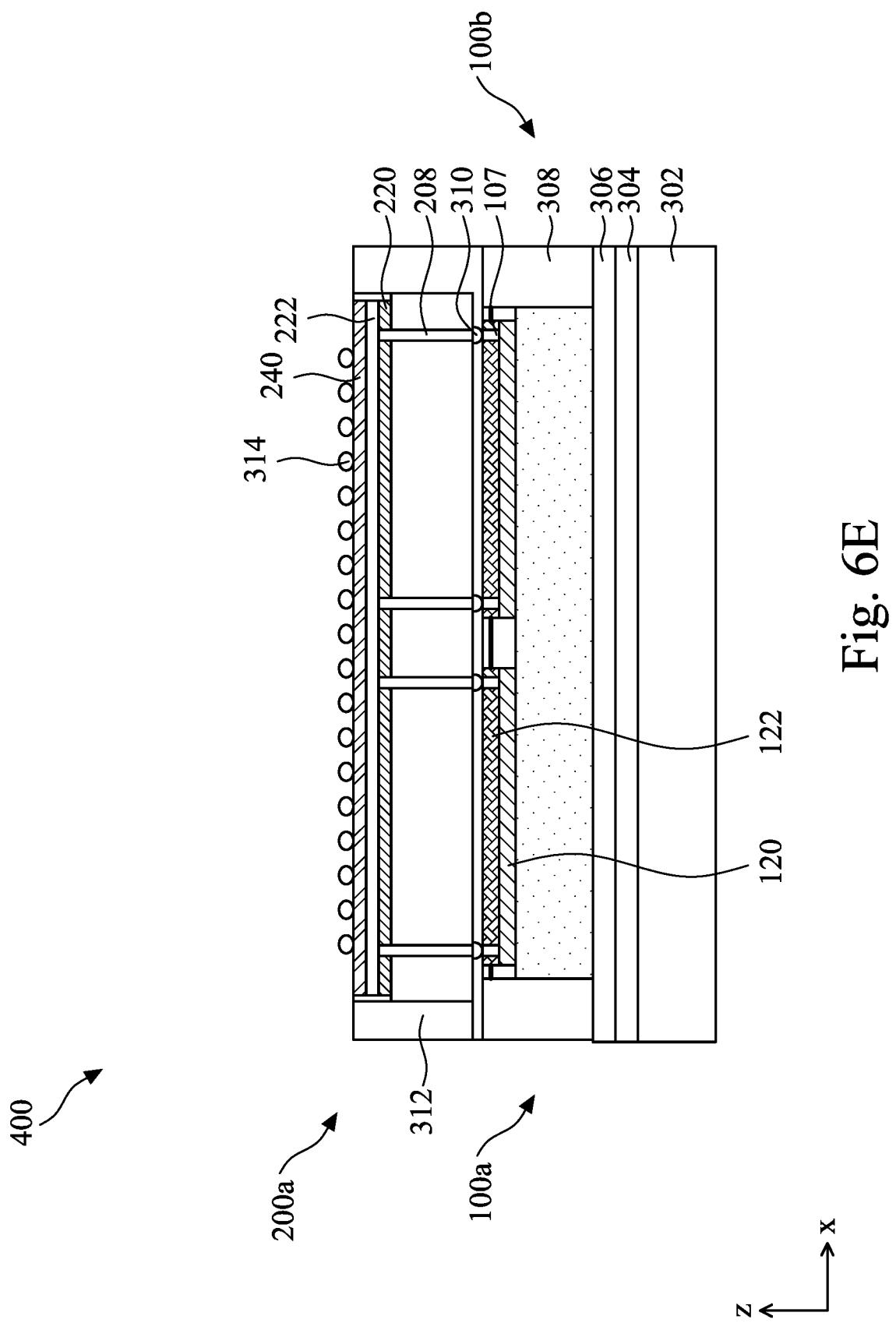

In FIG. 6E, the encapsulant layer 312 is formed, cured, and grinded to expose the top of the integrated circuit die 200a, and the external contacts 314 are then formed thereon.

Figure 6F:
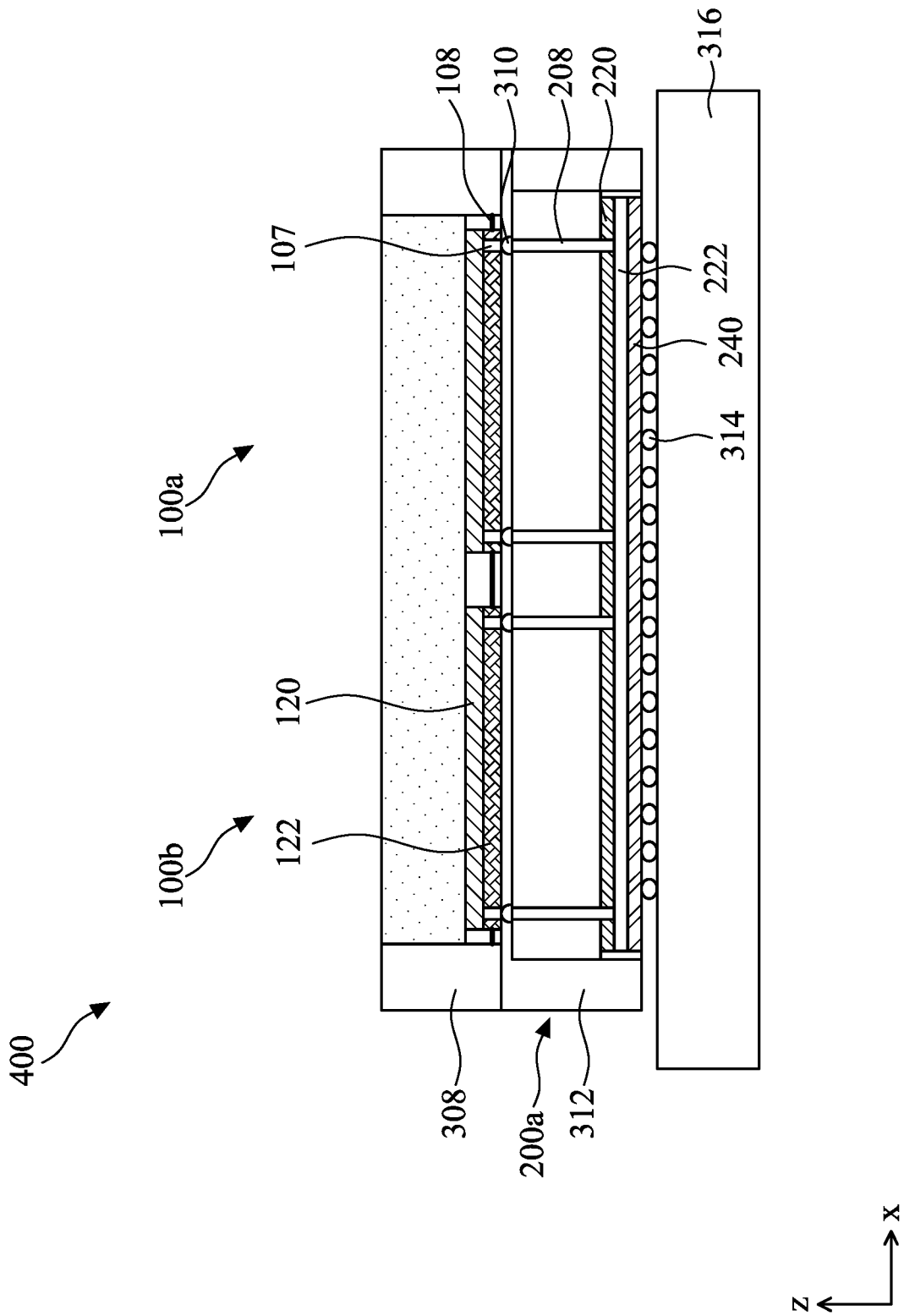

In FIG. 6F, the semiconductor package 400 is attached to the PCB 316, with the carrier substrate 302 along with the adhesive layer 304 and the die attach film 306 removed. In some embodiments, the vertical interconnect features 107a, 107b may be configured to provide power connection to the integrated circuit dies 100a, 100b. In other embodiments, the vertical interconnect features 107a, 107b may be configured to provide power and signal connection to the integrated circuit dies 100a, 100b. In some embodiments, the vertical interconnect features 107a, 107b connect the integrated circuit dies 100a, 100b with the integrated circuit die 200 through the redistribution layer 224 of the integrated circuit die 200a to the PCB 316. In some embodiments, the integrated circuit dies 100a, 100b are SOC dies and the integrated circuit die 200a is a memory die, which has a larger dimension than the integrated circuit dies 100a, 100b, and the arrangement in the semiconductor package 400 allows smaller SOC dies to use a redistribution layer of a larger memory die. Optionally, the vertical interconnect features 107a, 107b connect the integrated circuit dies 100a, 100b with the integrated circuit die 200a through the interconnect structure 222 of the integrated circuit die 200a.

Figure 7A:
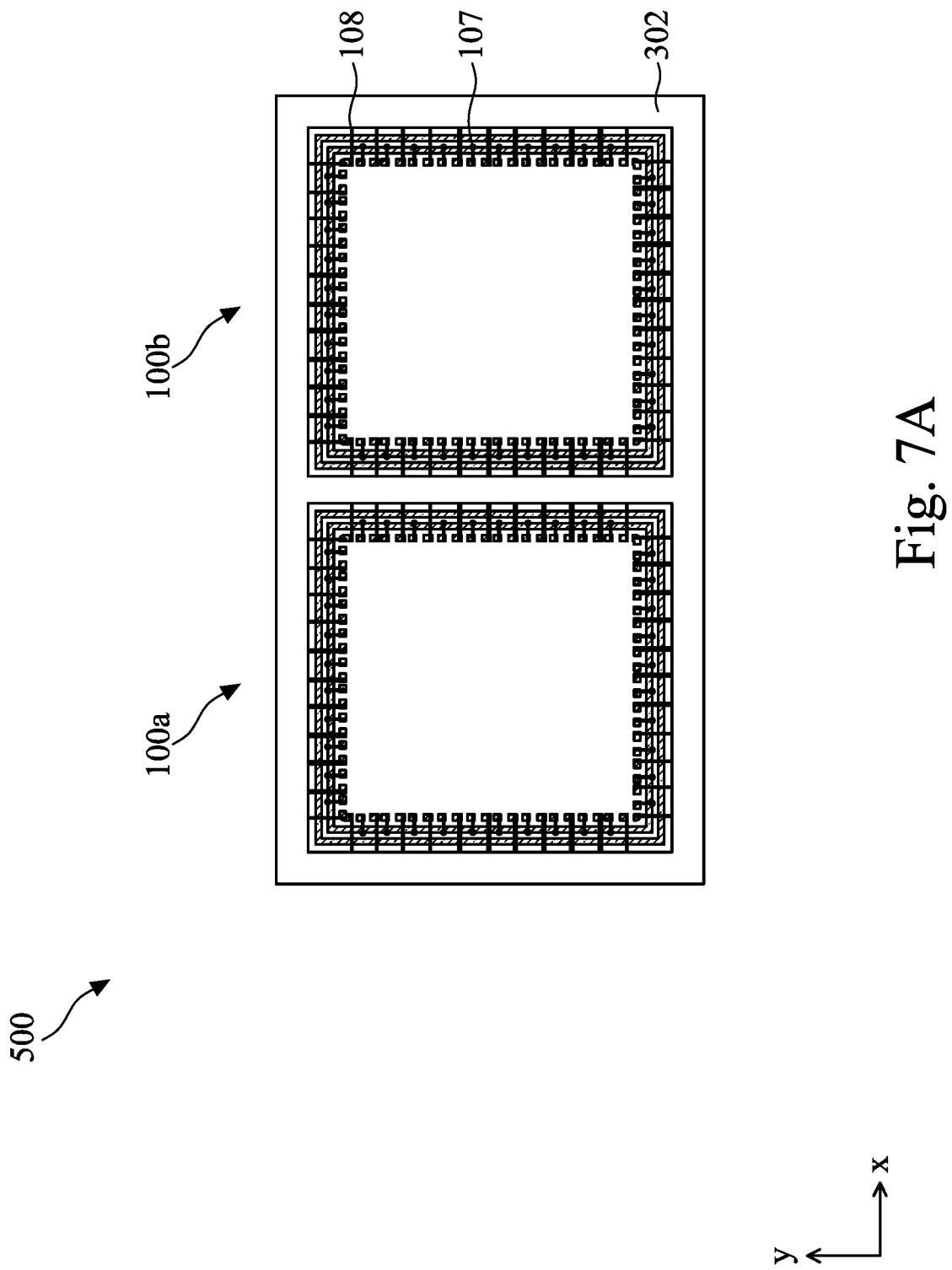
Figure 7B:
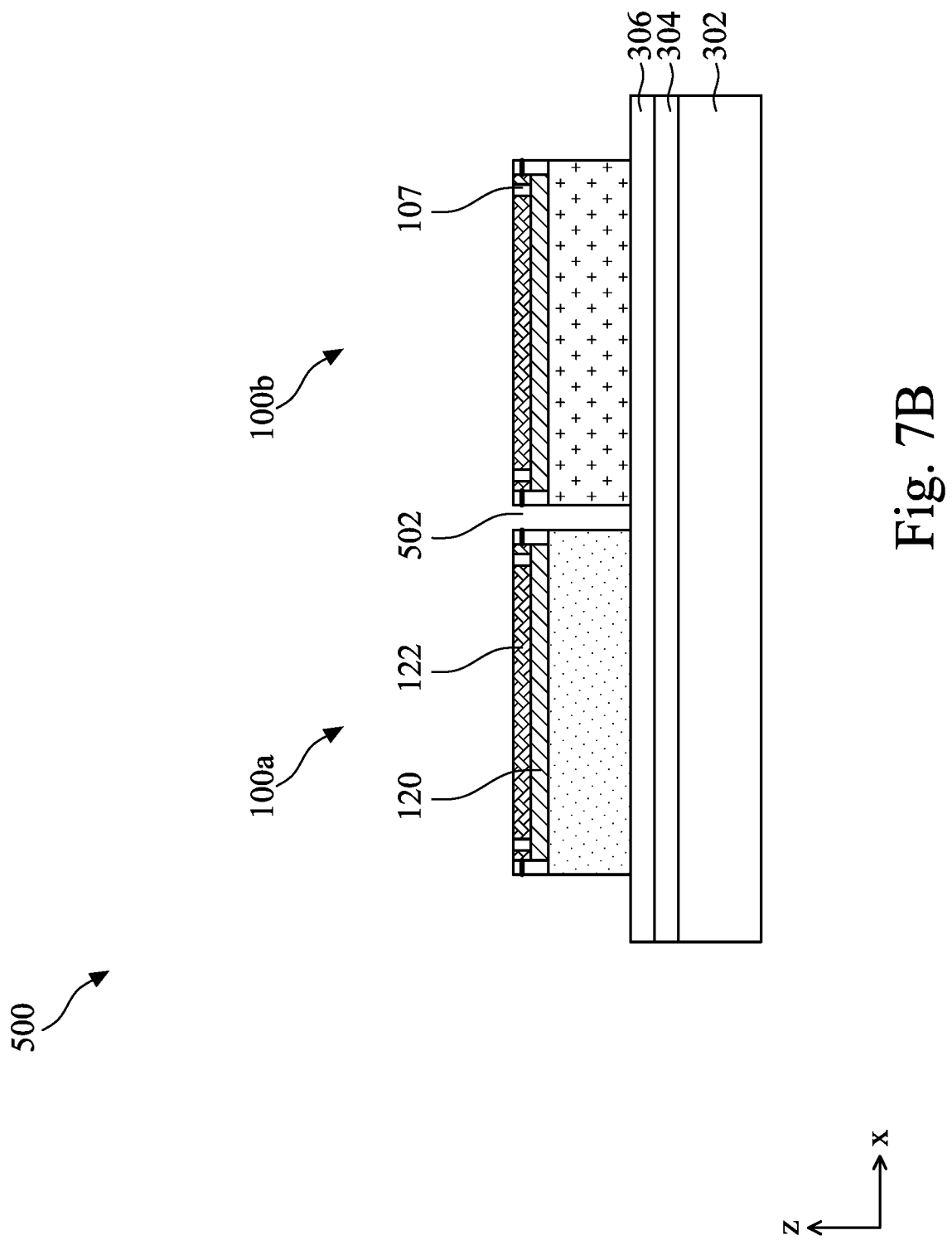

FIGS. 7A-7E schematically demonstrate various stages of forming a semiconductor package 500. The semiconductor package 500 is similar to the semiconductor package 400 except that the integrated circuit dies 100a, 100b are as individual dies. As shown in FIGS. 7A and 7B, the integrated circuit dies 100a and 100b are attached on the carrier substrate 302 with a gap 502 in between. In some embodiments, the integrated circuit dies 100a and 100b may be fabricated on the different substrates or cut off as individual dies prior to packaging.

In FIG. 7C, after the integrated circuit dies 100a, 100b are attached to the carrier substrate 302, inter-chip connectors 504 are formed between the edge interconnect features 108. The inter-chip connectors 504 may be formed by a selective deposition or other suitable deposition.

Figure 7D:
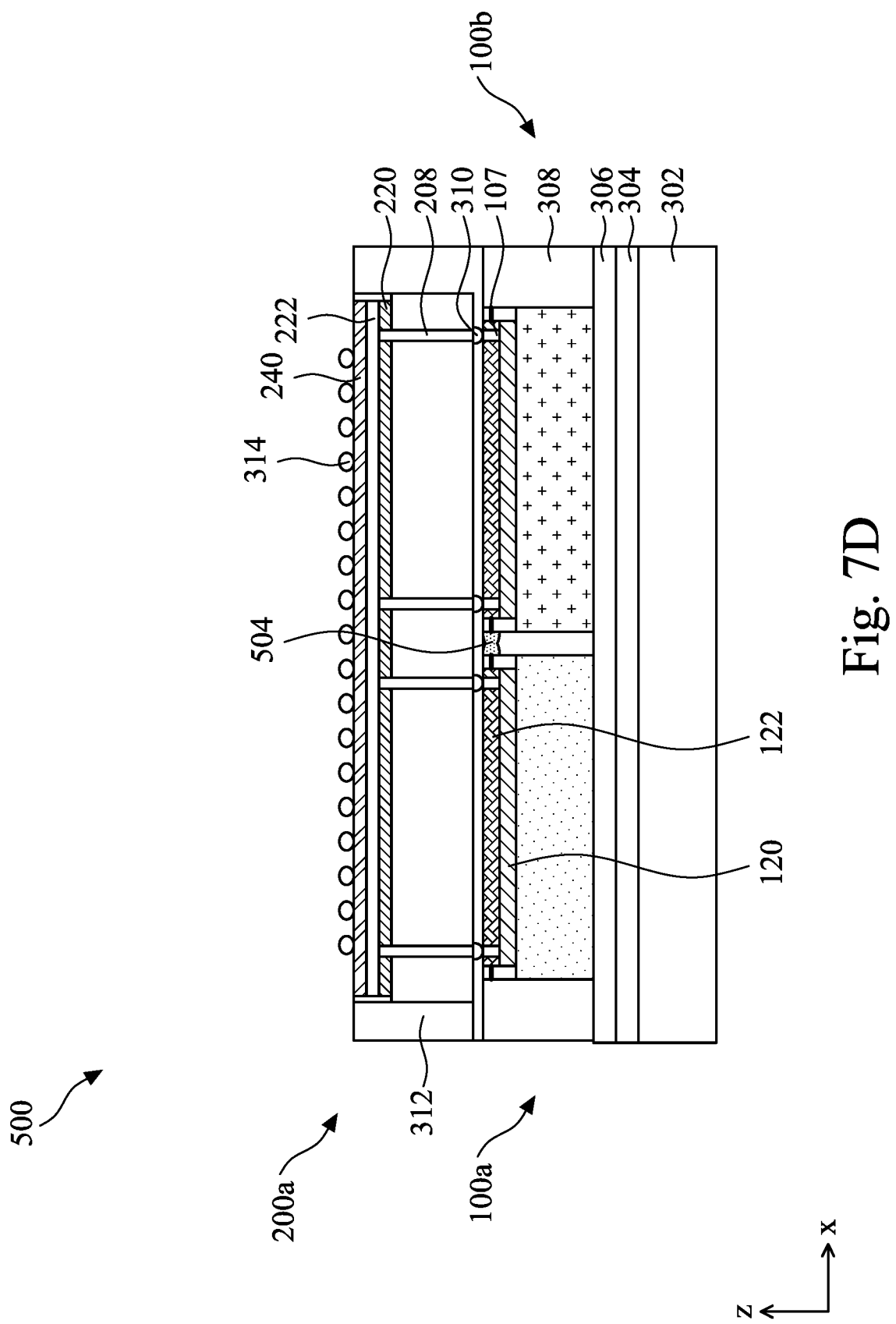

In FIG. 7D, the encapsulant layer 308 is formed, cured, and grinded to expose the top of the integrated circuit dies 100a, 100b, and the external contacts 310 are then formed thereon. A memory die, such as the integrated circuit die 200a, is stacked over the integrated circuit dies 100a, 100b. The integrated circuit die 200a is attached to the external contacts 310. The integrated circuit dies 100a/100b are connected to vertically stacked integrated circuit die 200b through the vertical interconnect features 107 and the vertical conductive features 208 without going through an interposer. In the semiconductor package 500, the edge interconnect features 108a, 108b and the inter-chip connectors 504 provide direct connection between the integrated circuit dies 100a, 100b. The encapsulant layer 312 is formed, cured, and grinded to expose the top of the integrated circuit die 200a, and the external contacts 314 are then formed thereon.

Figure 7E:
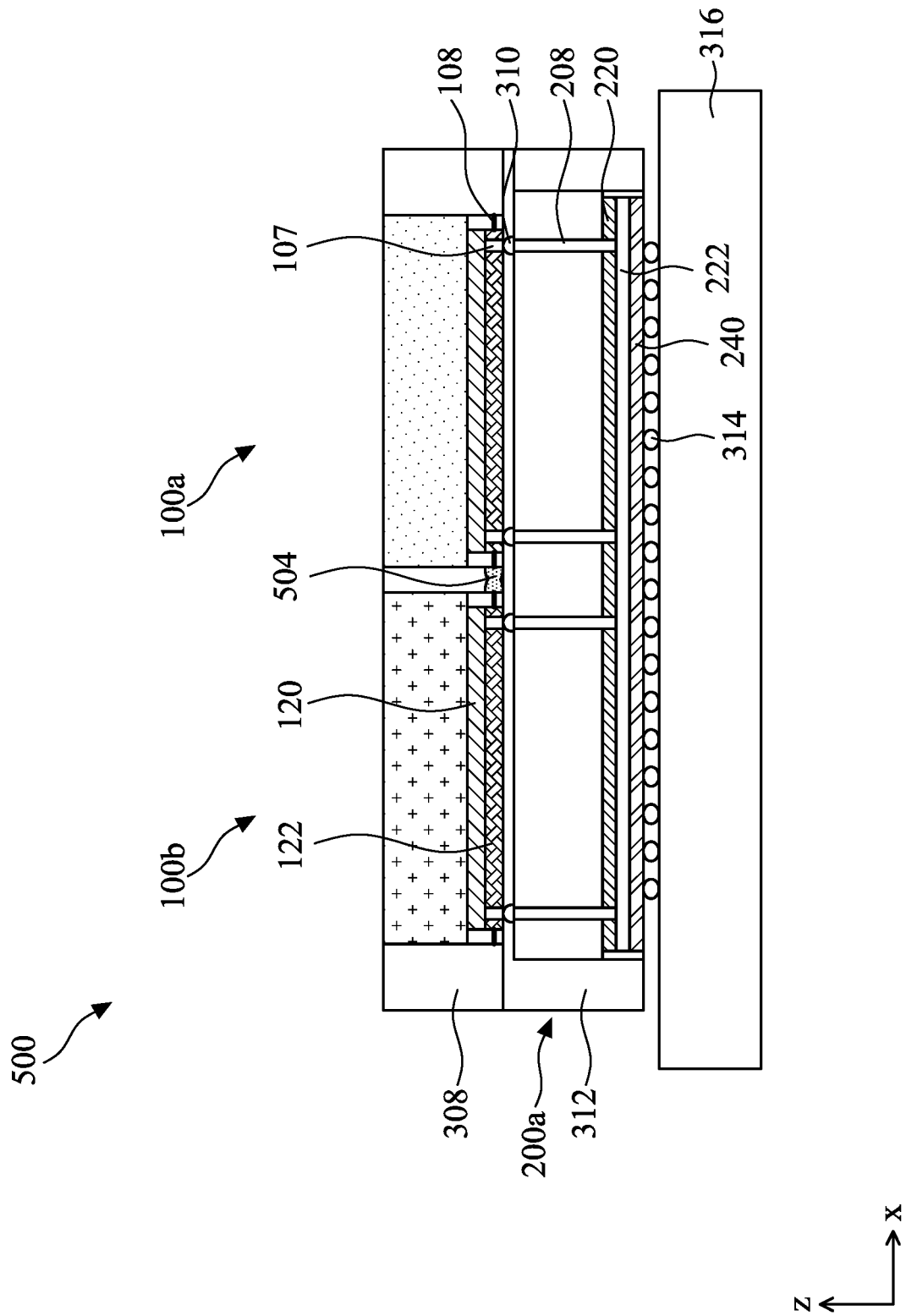

In FIG. 7E, the semiconductor package 500 is attached to the PCB 316, with the carrier substrate 302 along with the adhesive layer 304 and the die attach film 306 removed. The vertical interconnect features 107a, 107b connect the integrated circuit dies 100a, 100b with the integrated circuit die 200 and/or the PCB 316. In some embodiments, the vertical interconnect features 107a, 107b connect the integrated circuit dies 100*a*, 100*b* with the integrated circuit die 200*a* through the redistribution layer 224 of the integrated circuit die 200*a* to the PCB 316. In some embodiments, the vertical interconnect features 107*a*, 107*b* may be configured to provide power connection to the integrated circuit dies 100*a*, 100*b*. In other embodiments, the vertical interconnect features 107*a*, 107*b* may be configured to provide power and signal connection to the integrated circuit dies 100*a*, 100*b*. In some embodiments, the integrated circuit dies 100*a*, 100*b* are SOC dies and the integrated circuit die 200*a* is a memory die, which has a larger dimension than the integrated circuit dies 100*a*, 100*b*, and the arrangement in the semiconductor package 500 allows smaller SOC dies to use a redistribution layer of a larger memory die.

Figure 8A:
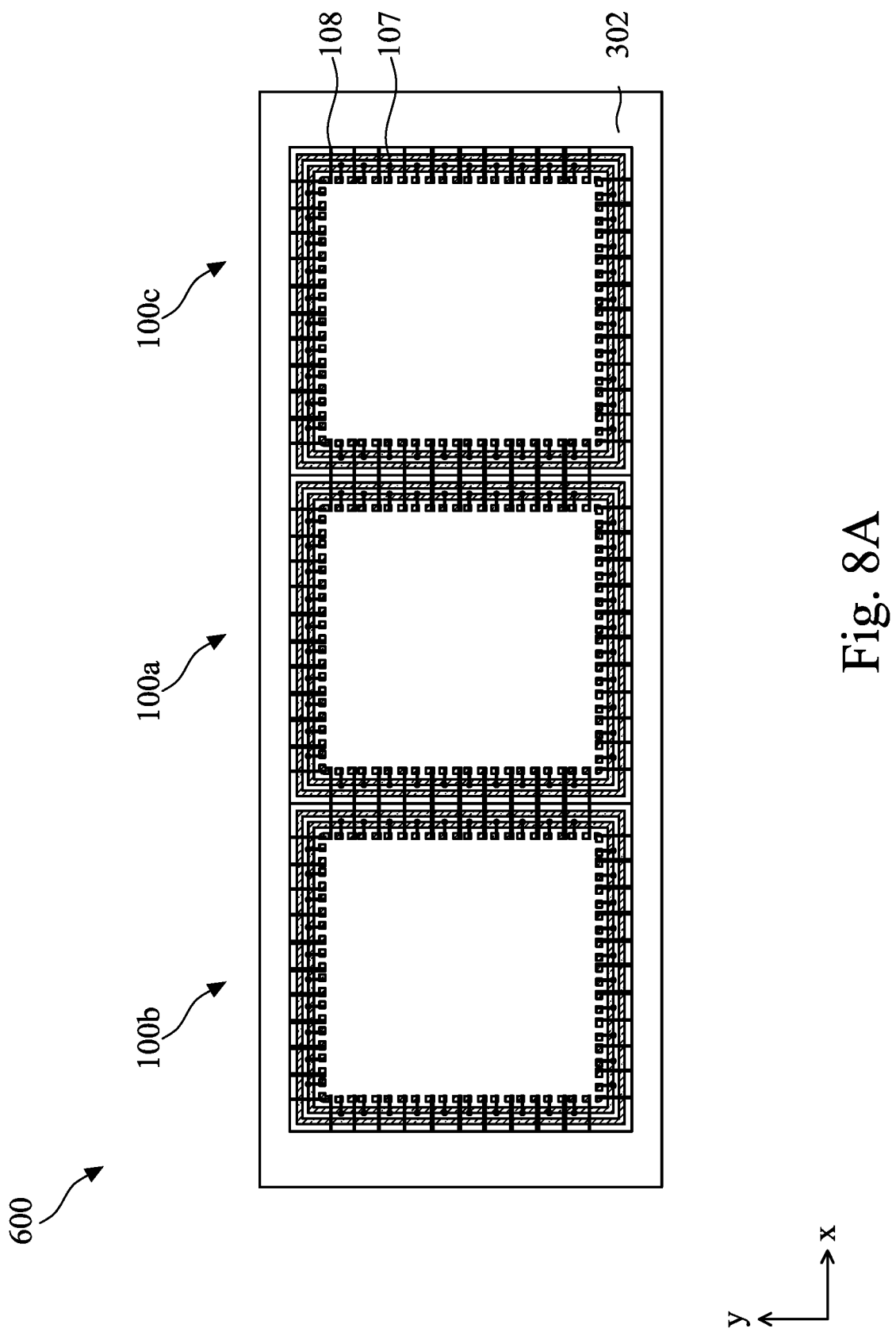
FIGS. 8A-8D schematically demonstrate various stages of forming a semiconductor package according to embodiments of the present disclosure.
Figure 8B:
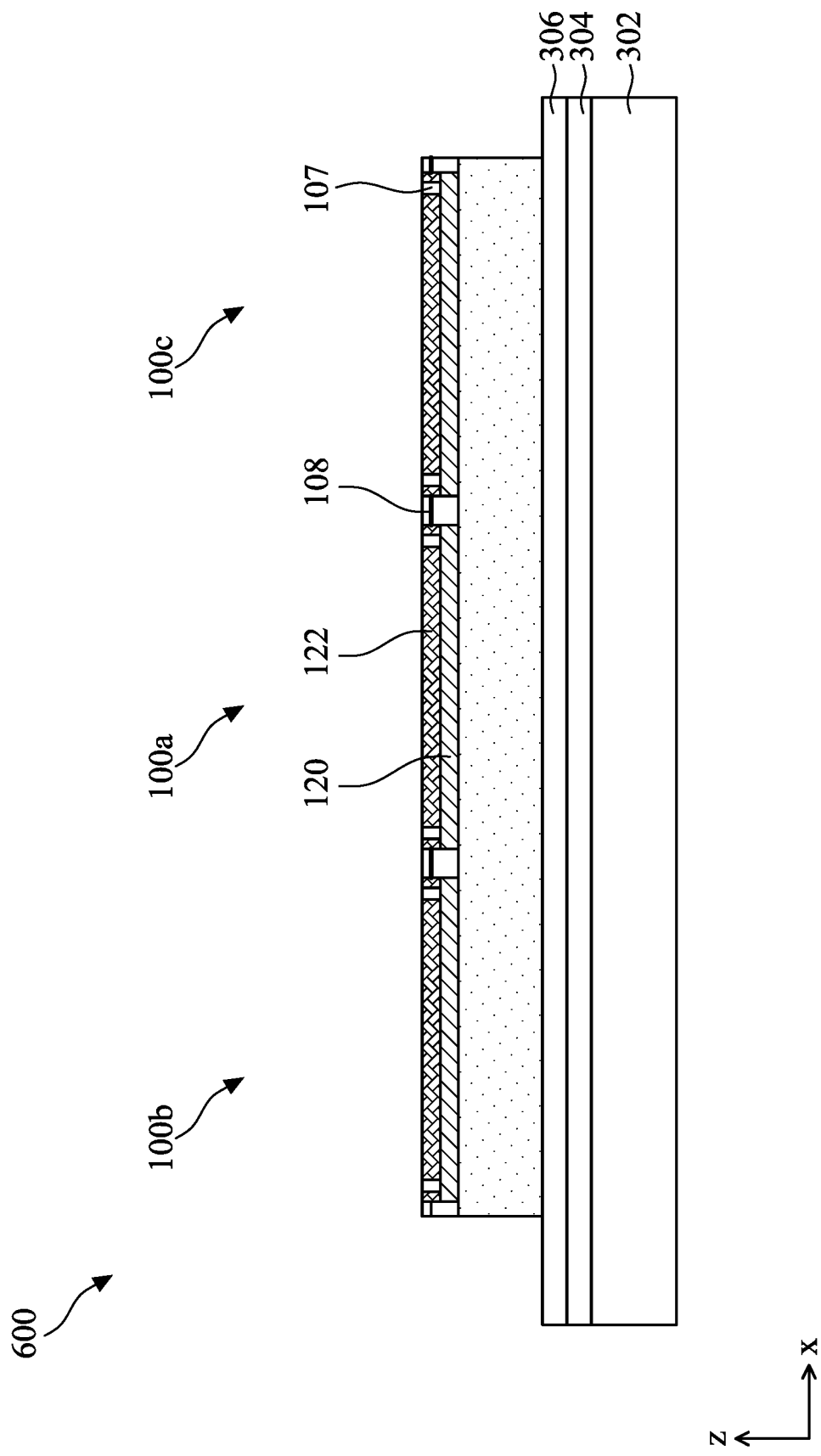

FIGS. 8A-8D schematically demonstrate various stages of forming a semiconductor package 600. The semiconductor package 600 is similar to the semiconductor package 400 except that the semiconductor package 600 includes three integrated circuit dies 100*a*, 100*b*, 100*c*. The integrated circuit dies 100*a*, 100*b*, 100*c* may be fabricated on the same substrate, as shown in FIG. 2. After fabrication, the integrated circuit dies 100*a*, 100*b*, 100*c* may be tested, and then cut off as a die combination, such as the die combination 26*f*, 26*g* in FIG. 2. In FIG. 8B, the integrated circuit dies 100*a*, 100*b*, 100*c* are attached to the carrier substrate 302 as a die combination.

Figure 8C:
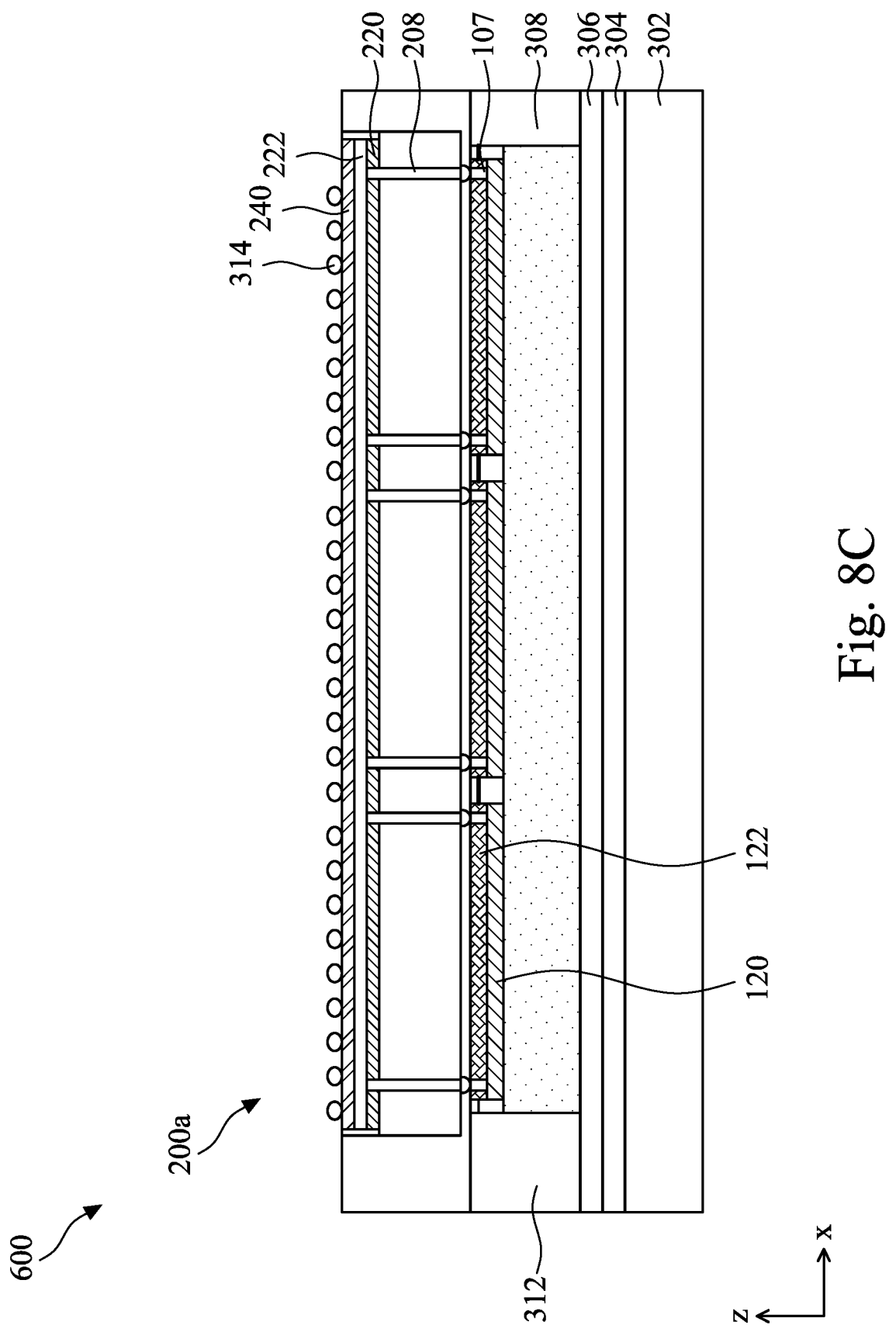

In FIG. 8C, the encapsulant layer 308 is formed, cured, and grinded to expose the top of the integrated circuit dies 100*a*, 100*b*, 100*c*, and the external contacts 310 are then formed thereon. A memory die, such as the integrated circuit die 200*a*, is stacked over the integrated circuit dies 100*a*, 100*b*, 100*c*. The integrated circuit die 200*a* is attached to the external contacts 310. The integrated circuit dies 100*a*/100*b*/100*c* are connected to vertically stacked integrated circuit die 200*b* through the vertical interconnect features 107 and the vertical conductive features 208 without going through an interposer. In the semiconductor package 600, the edge interconnect features 108*a*, 108*b*, 108*c* provide direct connection between the integrated circuit dies 100*a*, 100*b*, 100*c*. The encapsulant layer 312 is then formed, cured, and grinded to expose the top of the integrated circuit die 200*a*, and the external contacts 314 are then formed thereon.

Figure 8D:
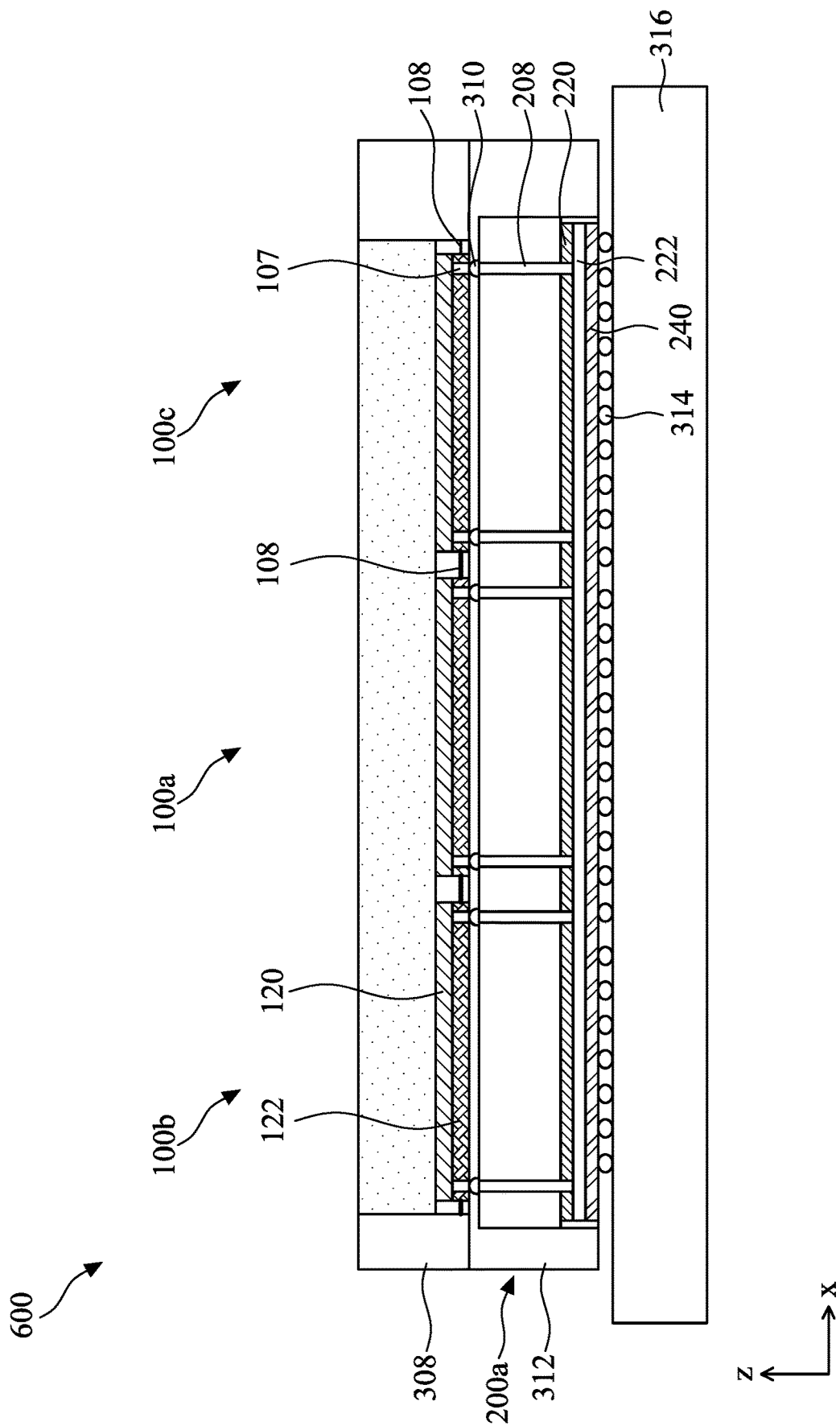

In FIG. 8D, the semiconductor package 600 is attached to the PCB 316, with the carrier substrate 302 along with the adhesive layer 304 and the die attach film 306 removed. In some embodiments, the vertical interconnect features 107*a*, 107*b*, 107*c* connect the integrated circuit dies 100*a*, 100*b*, 100*c* with the integrated circuit die 200*a* through the redistribution layer 224 of the integrated circuit die 200*a* to the PCB 316. In some embodiments, the vertical interconnect features 107*a*, 107*b*, 107*c* may be configured to provide power connection to the integrated circuit dies 100*a*, 100*b*, 100*c*. In other embodiments, the vertical interconnect features 107*a*, 107*b*, 107*c* may be configured to provide power and signal connection to the integrated circuit dies 100*a*, 100*b*, 100*c*. In some embodiments, the integrated circuit dies 100*a*, 100*b*, 100*c* are SOC dies and the integrated circuit die 200*a* is a memory die, which has a larger dimension than the integrated circuit dies 100*a*, 100*b*, 100*c* and the arrangement in the semiconductor package 600 allows smaller SOC dies to use a redistribution layer of a larger memory die.

Figure 9A:
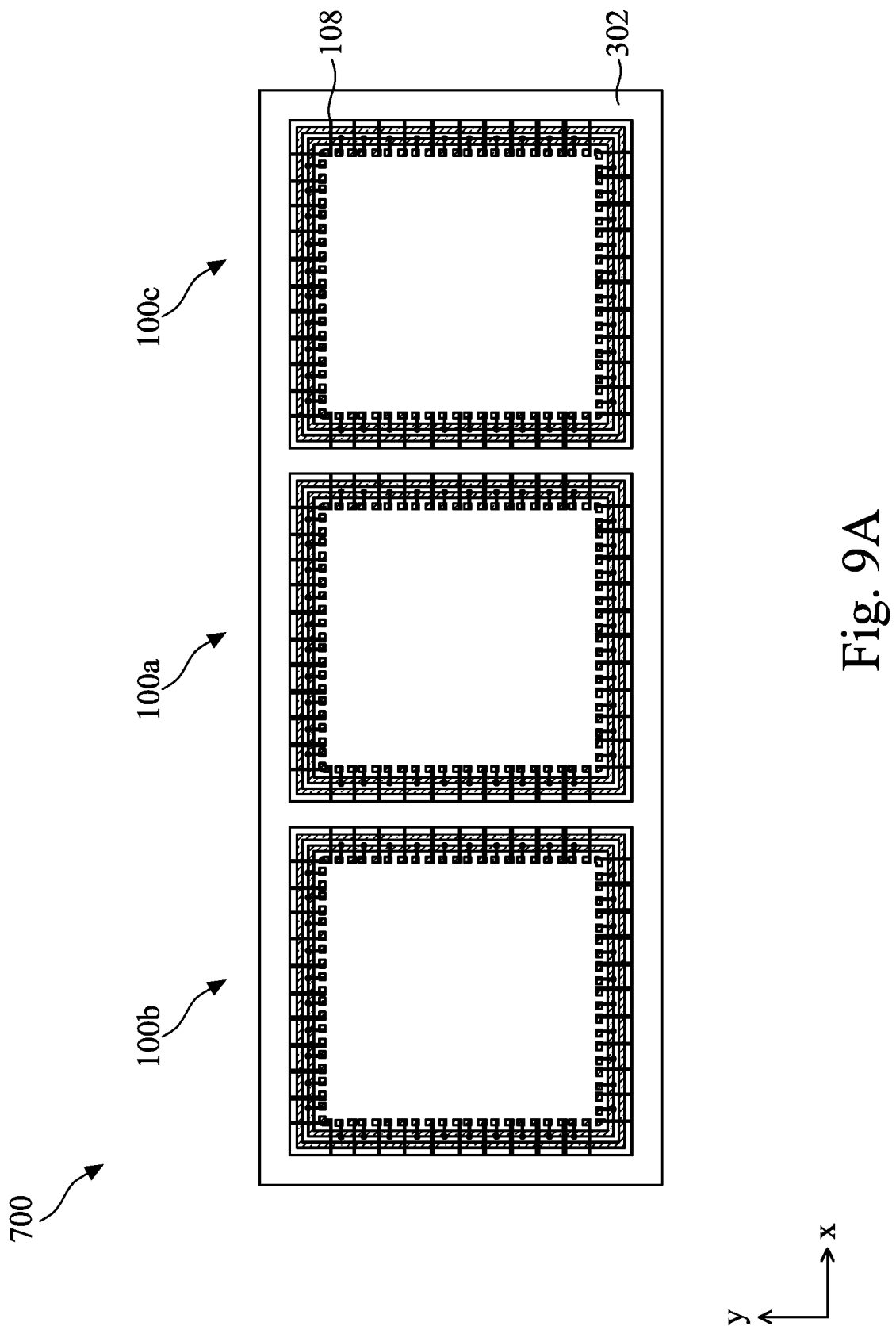
FIGS. 9A-9D schematically demonstrate various stages of forming a semiconductor package according to embodiments of the present disclosure.
Figure 9B:
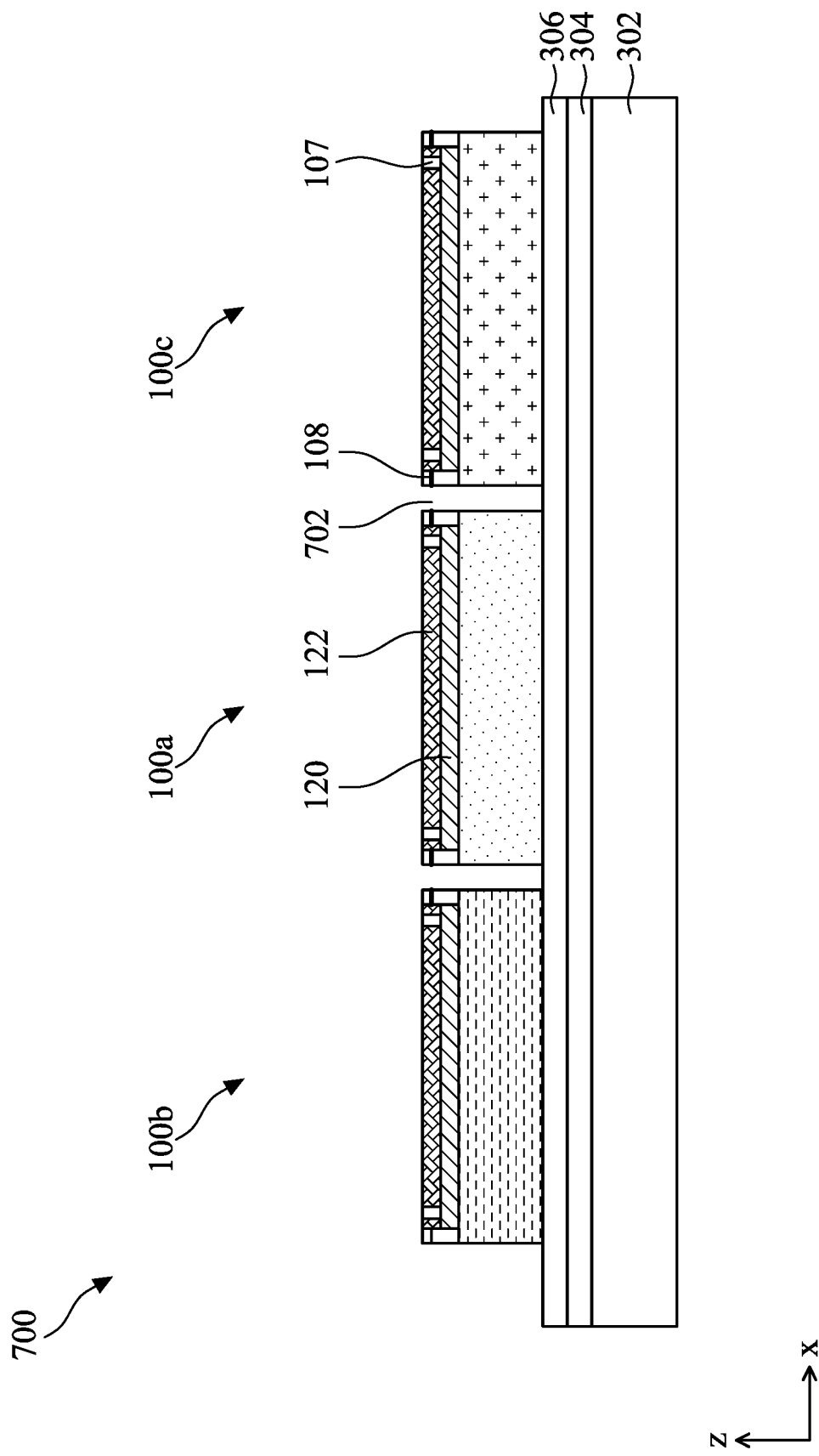

FIGS. 9A-9D schematically demonstrate various stages of forming a semiconductor package 700. The semiconductor package 600 is similar to the semiconductor package 600 except that three integrated circuit dies 100*a*, 100*b*, 100*c* are individual dies. In FIG. 9B, the integrated circuit dies 100*a*, 100*b*, 100*c* are attached to the carrier substrate 302 with a gap 702 in between.

Figure 9C:
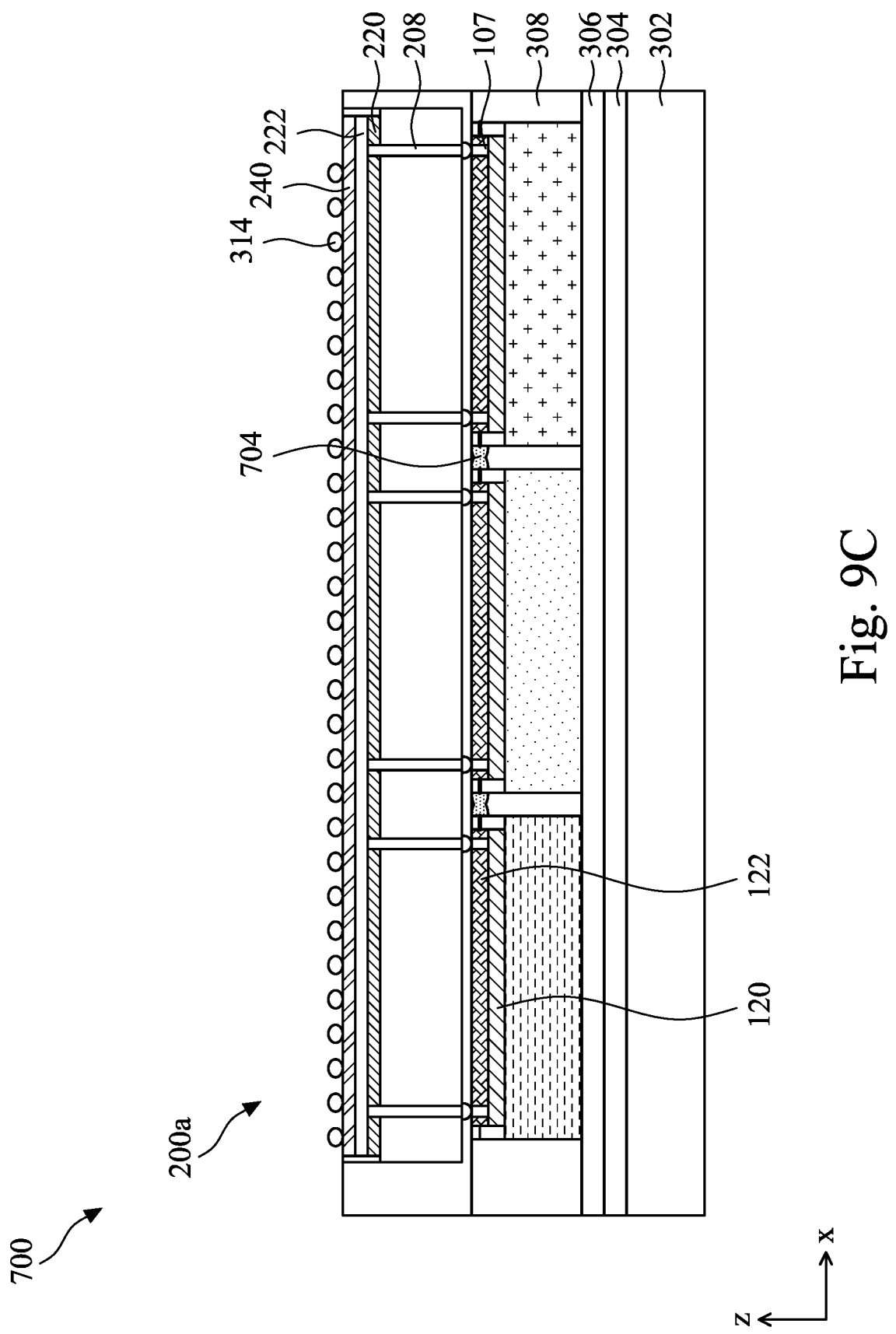

In FIG. 9C, after the integrated circuit dies 100*a*, 100*b*, 100*c* are attached to the carrier substrate 302, inter-chip connectors 704 are formed between the edge interconnect features 108. The inter-chip connectors 704 may be formed by a selective deposition or other suitable deposition. The encapsulant layer 308 is formed, cured, and grinded to expose the top of the integrated circuit dies 100*a*, 100*b*, and the external contacts 310 are then formed thereon. A memory die, such as the integrated circuit die 200*a*, is stacked over the integrated circuit dies 100*a*, 100*b*, 100*c*. The integrated circuit die 200*a* is attached to the external contacts 310. The integrated circuit dies 100*a*, 100*b*, 100*c* are connected to vertically stacked integrated circuit die 200*b* through the vertical interconnect features 107 and the vertical conductive features 208 without going through an interposer. In the semiconductor package 700, the edge interconnect features 108 and the inter-chip connectors 704 provide direct connection between the integrated circuit dies 100*a*, 100*b*, 100*c*. The encapsulant layer 312 is formed, cured, and grinded to expose the top of the integrated circuit die 200*a*, and the external contacts 314 are then formed thereon.

Figure 9D:
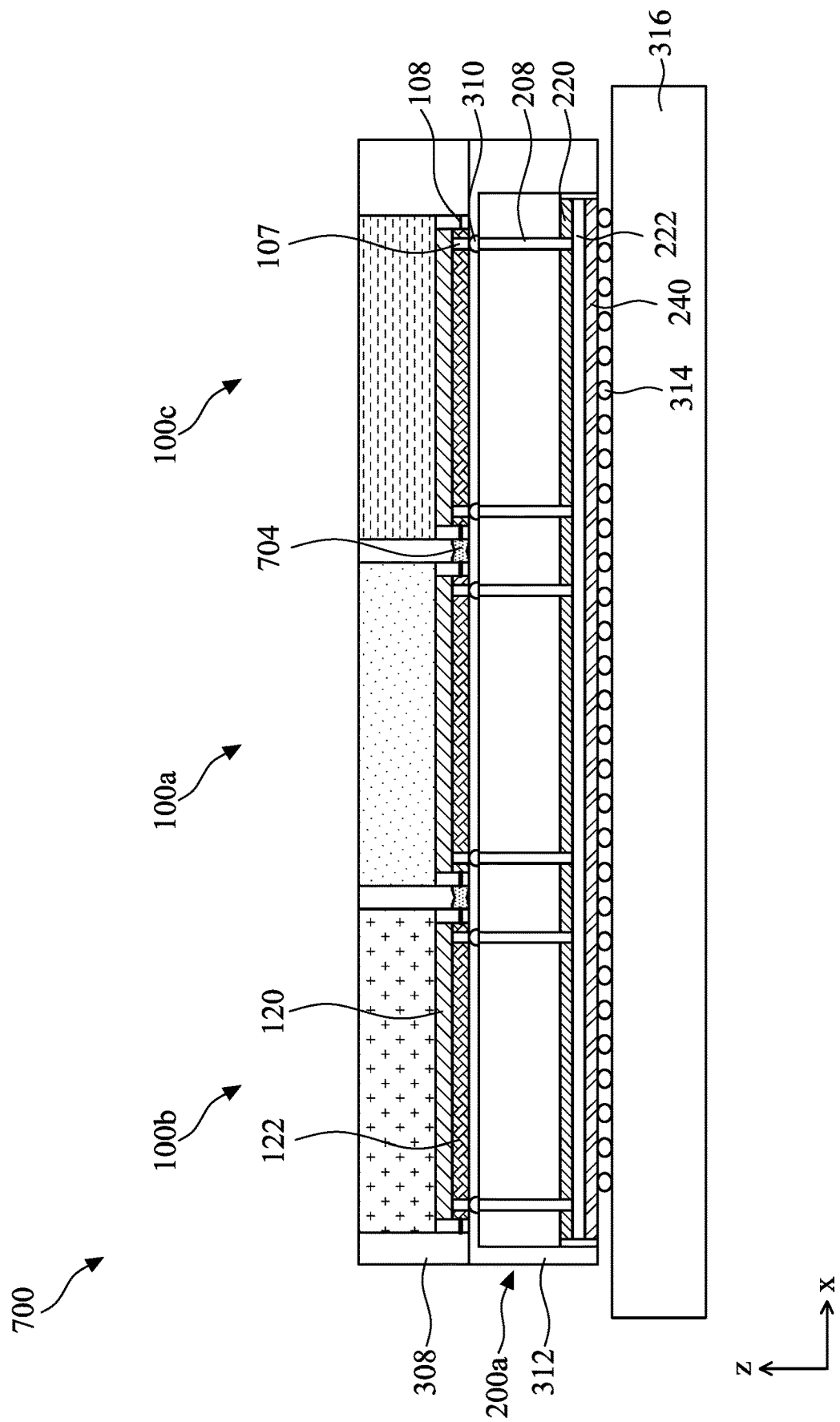

In FIG. 9D, the semiconductor package 700 is attached to the PCB 316, with the carrier substrate 302 along with the adhesive layer 304 and the die attach film 306 removed. Inter-chip connectors 704 are formed between the integrated circuit dies 100*a*, 100*b*, 100*c* to provide direct connections there between. In some embodiments, the vertical interconnect features 107*a*, 107*b*, 107*c* connect the integrated circuit dies 100*a*, 100*b*, 100*c* with the integrated circuit die 200*a* through the redistribution layer 224 of the integrated circuit die 200*a* to the PCB 316. In some embodiments, the vertical interconnect features 107*a*, 107*b*, 107*c* may be configured to provide power connection to the integrated circuit dies 100*a*, 100*b*, 100*c*. In other embodiments, the vertical interconnect features 107*a*, 107*b*, 107*c* may be configured to provide power and signal connection to the integrated circuit dies 100*a*, 100*b*, 100*c*. In some embodiments, the integrated circuit dies 100*a*, 100*b*, 100*c* are SOC dies and the integrated circuit die 200*a* is a memory die, which has a larger dimension than the integrated circuit dies 100*a*, 100*b*, 100*c* and the arrangement in the semiconductor package 700 allows smaller SOC dies to use a redistribution layer of a larger memory die.

Embodiments of the present disclosure provide an integrated circuit die with vertical interconnect features to enable direct connection between vertically stacked integrated circuit dies. The direct connection between vertically stacked integrated circuit dies reduces interposer layers, redistribution process, and bumping processes in multi-die integration, thus, reducing cost of manufacturing. The vertical interconnect features may be formed in a sealing ring, which allows higher routing density than interposers or redistribution layer. The vertical interconnect features also enable power to be directly transferred therethrough, instead of going through interposer substrates, or PCBs, thus achieve higher performance. The vertical interconnect features design may be easily adopted from one integrated circuit die to another, thus, provide high feasibility and flexibility for designers. The vertical interconnect features may be used in combination with edge interconnect features extending from one or more IMD layers across a scribe line to another integrated circuit die, thus providing additional feasibility and flexibility for designers.

Some embodiments of the present provide a semiconductor device, comprising a first integrated circuit die comprising one or more vertical interconnect features exposed to a top surface, and a second integrated circuit die comprising one or more vertical conductive features, wherein the second integrated circuit die is stacked over the first integrated circuit die, and the one or more vertical interconnect features in the first integrated circuit die are connected to the one or more vertical conductive features in the second integrated circuit die.

Some embodiments of the present disclosure provide an integrated circuit die. The integrated circuit die comprises a device layer comprising one or more semiconductor devices, an interconnect structure formed on the device layer, wherein the interconnect structure comprises one or more IMD layers, a seal region surrounding the interconnect structure, one or more vertical interconnect features, wherein each of the vertical interconnect features comprises, a horizontal portion formed in the one or more IMD layers, and a vertical portion formed in the seal region and connected to the horizontal portion.

Some embodiments of the present disclosure provide a method for forming a semiconductor device. The method comprises forming a first integrated circuit die having one or more vertical interconnect features exposed on a top surface, forming a second integrated circuit die having one or more vertical conductive features exposed on a back surface, aligning the one or more vertical interconnect features with the one or more vertical conductive features, and stacking the second integrated circuit die over the first integrated circuit die and connecting the one or more vertical interconnect features to the one or more vertical conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor package, comprising:
    forming a first integrated circuit die having one or more vertical interconnect features formed in a seal region and exposed on a top surface;
    forming a second integrated circuit die having one or more vertical conductive features exposed on a back surface;
    aligning the one or more vertical interconnect features with the one or more vertical conductive features; and
    stacking the second integrated circuit die over the first integrated circuit die and connecting the one or more vertical interconnect features to the one or more vertical conductive features,
    wherein forming the first integrated circuit die comprises:
        forming one or more semiconductor devices;
        forming an interconnect structure over one or more semiconductor devices; and
        forming one or more sealing rings in a seal region surrounding the interconnect structure, wherein the one or more vertical interconnect features are formed in the seal region.

2. The method of claim 1, further comprising:
    prior to stacking the second integrated circuit die over the first integrated circuit die, forming one or more external contacts on the one or more vertical interconnect features.

3. The method of claim 1, wherein forming the first integrated circuit die further comprises:
    forming one or more edge interconnect features extending from the interconnect structure through the seal region.

4. The method of claim 1, further comprising:
    forming a third integrated circuit die having one or more vertical interconnect features; and
    stacking the second integrated circuit die over the third integrated circuit die.

5. The method of claim 4, wherein the first integrated circuit die and the third integrated circuit die on a substrate sharing a scribe line.

6. The method of claim 4, further comprising:
    forming one or more inter-chip connectors between the first and third integrated circuit dies prior to stacking the second integrated circuit die over the first integrated circuit die.

7. A method, comprising:
    providing a first integrated circuit die comprising:
        a device layer;
        an interconnect structure formed over the device layer comprising one or more intermetal dielectric (IMD) layer;
        a seal region surrounding the interconnect structure; and
        one or more vertical interconnect features exposed to a top surface of the seal region; and
    providing a second integrated circuit die comprising one or more vertical conductive features; and
    stacking the second integrated circuit die over the first integrated circuit die, wherein the one or more vertical interconnect features in the first integrated circuit die are connected to the one or more vertical conductive features in the second integrated circuit die,
    wherein the first integrated circuit die comprises a sealing ring formed in the seal region surrounding the interconnect structure, wherein the sealing ring includes one or more electrically isolated sections.

8. The method of claim 7, wherein each of the one or more vertical interconnect features comprises:
    a horizontal portion having a first end in contact with one section of the sealing ring, and a second end in connection with the interconnect structure, and wherein the horizontal portion is formed in a bottom IMD layer immediately adjacent the device layer.

9. The method of claim 8, wherein the each of the one or more vertical interconnect features further comprises:
    a vertical portion formed over one section of the sealing ring.

10. The method of claim 7, wherein the first integrated circuit die further comprises one or more edge interconnect features extending from the interconnect structure through the sealing ring to a scribe line.

11. The method of claim 10, further comprising providing a third integrated circuit die, wherein the third integrated circuit die is connected to the first integrated circuit die through the one or more edge interconnect features, and the second integrated circuit die is stacked over the third integrated circuit die.

12. The method of claim 7, wherein the second integrated circuit die comprises:
    a circuit region; and
    a seal region surrounding the circuit region, wherein the one or more vertical conductive features are formed in the circuit region.

13. A method, comprising:
    providing a system-on-chip die comprising:
        a device layer comprising one or more semiconductor devices;
        an interconnect structure formed on the device layer, wherein the interconnect structure comprises one or more bottom intermetal dielectric (IMD) layers formed immediately over the device layer, one or more middle IMD layers formed over the one or more bottom IMD layers, and one or more top IMD layers formed over the one or more middle IMD layers;
        a seal region surrounding the interconnect structure;
        one or more vertical interconnect features, wherein each of the vertical interconnect features comprises:
            a horizontal portion formed in the one of the bottom IMD layers, middle IMD layers, or top IMD layers; and
            a vertical portion formed in the seal region and connected to the horizontal portion; and
    stacking the system-on-chip die over a memory die, wherein the one or more vertical interconnect features of the system-on-chip die are connected to the memory die,
    wherein the seal region includes a first sealing ring and a second sealing ring, and the vertical portion is a section of the first sealing ring.

14. The method of claim 13, wherein the vertical portion comprises one or more conductive vias and one or more conductive plates.

15. The method of claim 14, wherein the horizontal portions of the one or more vertical interconnect features are formed in the same IMD layer.

16. The method of claim 13, wherein the second sealing ring surrounds the first sealing ring.

17. The method of claim 13, further comprising one or more edge interconnect features formed in the one or more top IMD layers, wherein the one or more edge interconnect features extend outwards from the interconnect structure through the seal region to a scribe line.

18. The method of claim 13, further comprising one or more edge interconnect features formed in the one or more middle IMD layers, wherein the one or more edge interconnect features extend outwards from the interconnect structure through the seal region to a scribe line.

19. The method of claim 13, further comprising one or more edge interconnect features formed in the one or more bottom IMD layers, wherein the one or more edge interconnect features extend outwards from the interconnect structure through the seal region to a scribe line.

20. The method of claim 13, wherein the one or more vertical interconnect features of the system-on-chip die are connected to one or more through substrate vias formed in the memory die.

\* \* \* \* \*